United States Patent
Udaka et al.

(10) Patent No.: US 9,362,514 B2
(45) Date of Patent: Jun. 7, 2016

(54) POLARIZATION ORGANIC PHOTOELECTRIC CONVERSION DEVICE, METHOD FOR PRODUCING POLARIZATION ORGANIC PHOTOELECTRIC CONVERSION DEVICE, POLARIZATION OPTICAL DEVICE, IMAGING DEVICE, AND ELECTRONIC APPARATUS

(75) Inventors: Toru Udaka, Kanagawa (JP); Osamu Goto, Kanagawa (JP)

(73) Assignee: SONY CORPORATION, Tokyo (JP)

(*) Notice: Subject to any disclaimer, the term of this patent is extended or adjusted under 35 U.S.C. 154(b) by 771 days.

(21) Appl. No.: 13/424,690

(22) Filed: Mar. 20, 2012

(65) Prior Publication Data

US 2012/0248563 A1    Oct. 4, 2012

(30) Foreign Application Priority Data

Mar. 30, 2011  (JP) ................................. 2011-075179

(51) Int. Cl.
*H01L 51/42*  (2006.01)
*H01L 51/00*  (2006.01)

(52) U.S. Cl.
CPC .......... *H01L 51/424* (2013.01); *H01L 51/0012* (2013.01); *H01L 51/0055* (2013.01); *H01L 51/0064* (2013.01); *H01L 51/0072* (2013.01); *Y02E 10/549* (2013.01)

(58) Field of Classification Search
CPC .............. H01L 51/424; H01L 51/0012; H01L 51/0055; H01L 51/0064; H01L 51/0072; H01L 31/00224; H01L 31/18
See application file for complete search history.

(56) References Cited

U.S. PATENT DOCUMENTS

| | | | |
|---|---|---|---|
| 8,294,135 B2* | 10/2012 | Lebedev et al. | 257/9 |
| 2004/0067324 A1* | 4/2004 | Lazarev et al. | 428/1.31 |
| 2005/0145839 A1* | 7/2005 | Yamamoto et al. | 257/40 |
| 2006/0043358 A1* | 3/2006 | Ueda et al. | 257/40 |
| 2006/0105492 A1* | 5/2006 | Veres et al. | 438/99 |
| 2006/0192495 A1* | 8/2006 | Sano | 315/169.3 |
| 2008/0180803 A1* | 7/2008 | Seybert et al. | 359/642 |
| 2010/0084000 A1* | 4/2010 | Ueda | 136/244 |

FOREIGN PATENT DOCUMENTS

JP    2001-102660 A    4/2001

* cited by examiner

*Primary Examiner* — Tucker J Wright
(74) *Attorney, Agent, or Firm* — Chip Law Group

(57) ABSTRACT

A polarization organic photoelectric conversion device having a structure in which an organic photoelectric conversion layer is interposed between a first electrode and a second electrode, at least one of which is transparent, wherein the organic photoelectric conversion layer is one obtained by uniaxially orienting at least a portion thereof in the plane in advance.

17 Claims, 18 Drawing Sheets

ORIENTATION AXIS

US 9,362,514 B2

POLARIZATION ORGANIC PHOTOELECTRIC CONVERSION DEVICE, METHOD FOR PRODUCING POLARIZATION ORGANIC PHOTOELECTRIC CONVERSION DEVICE, POLARIZATION OPTICAL DEVICE, IMAGING DEVICE, AND ELECTRONIC APPARATUS

FIELD

The present disclosure relates to a polarization organic photoelectric conversion device, a method for producing a polarization organic photoelectric conversion device, a polarization optical device, an imaging device, and an electronic apparatus. The present disclosure relates to, for example, a polarization organic photoelectric conversion device suitable for being applied to a polarization organic imaging device using an organic photoelectric conversion layer, a method for producing such a polarization organic photoelectric conversion device, a polarization optical device using such a polarization organic photoelectric conversion device, and an imaging device or a variety of electronic apparatuses each using such a polarization organic photoelectric conversion device or polarization optical device.

BACKGROUND

In the past, as a polarization organic photoelectric conversion device using an organic photoelectric conversion layer, a semiconductor device having a thin film composed of a phthalocyanine molecule formed on an oriented film subjected to a rubbing treatment is known (see JP-A-2001-102660).

SUMMARY

However, the above polarization organic photoelectric conversion device in the related art was configured such that a thin film composed of a phthalocyanine molecule and serving as an organic photoelectric conversion layer is formed on an oriented film subjected to a rubbing treatment, and therefore had a low orientation anchoring force and a low polarization property. Therefore, this polarization organic photoelectric conversion device had low sensitivity to polarized light.

Accordingly, it is desirable to provide a polarization organic photoelectric conversion device which has high sensitivity to polarized light and a method for producing the same.

Further, it is desirable to provide a polarization optical device which has high sensitivity to polarized light and can receive polarized light in two directions and photoelectrically convert the light.

Still further, it is desirable to provide an imaging device and an electronic apparatus each having high performance using the above-described excellent polarization photoelectric conversion device or polarization optical device.

An embodiment of the present disclosure is directed to a polarization organic photoelectric conversion device having a structure in which an organic photoelectric conversion layer is interposed between a first electrode and a second electrode, at least one of which is transparent, wherein the organic photoelectric conversion layer is one obtained by uniaxially orienting at least a portion thereof in the plane in advance.

Another embodiment of the present disclosure is directed to a method for producing a polarization organic photoelectric conversion device including forming a structure in which an organic photoelectric conversion layer obtained by uniaxially orienting at least a portion thereof in the plane in advance, is interposed between a first electrode and a second electrode, at least one of which is transparent.

Still another embodiment of the present disclosure is directed to a polarization optical device including at least two polarization organic photoelectric conversion devices which are disposed such that the orientation axes thereof intersect with each other, wherein each of the polarization organic photoelectric conversion devices has a structure in which an organic photoelectric conversion layer is interposed between a first electrode and a second electrode, both of which are transparent, and the organic photoelectric conversion layer is one obtained by uniaxially orienting at least a portion thereof in the plane in advance.

Yet another embodiment of the present disclosure is directed to an imaging device including a polarization organic photoelectric conversion device, wherein the polarization organic photoelectric conversion device has a structure in which an organic photoelectric conversion layer is interposed between a first electrode and a second electrode, at least one of which is transparent, and the organic photoelectric conversion layer is one obtained by uniaxially orienting at least a portion thereof in the plane in advance.

Still yet another embodiment of the present disclosure is directed to an imaging device including a polarization optical device having at least two polarization organic photoelectric conversion devices which are disposed such that the orientation axes thereof intersect with each other, wherein each of the polarization organic photoelectric conversion devices has a structure in which an organic photoelectric conversion layer is interposed between a first electrode and a second electrode, both of which are transparent, and the organic photoelectric conversion layer is one obtained by uniaxially orienting at least a portion thereof in the plane in advance.

Further another embodiment of the present disclosure is directed to an electronic apparatus including a polarization organic photoelectric conversion device, wherein the polarization organic photoelectric conversion device has a structure in which an organic photoelectric conversion layer is interposed between a first electrode and a second electrode, at least one of which is transparent, and the organic photoelectric conversion layer is one obtained by uniaxially orienting at least a portion thereof in the plane in advance.

A further embodiment of the present disclosure is directed to an electronic apparatus including a polarization optical device having at least two polarization organic photoelectric conversion devices which are disposed such that the orientation axes thereof intersect with each other, wherein each of the polarization organic photoelectric conversion devices has a structure in which an organic photoelectric conversion layer is interposed between a first electrode and a second electrode, both of which are transparent, and the organic uniaxially orienting at least a portion thereof in the plane in advance.

The organic photoelectric conversion layer is one obtained by uniaxially orienting, preferably at least the majority of, most preferably the entire of the layer in advance. The organic photoelectric conversion layer is, for example, one obtained by being subjected to uniaxial orientation by at least one method selected from the group consisting of rubbing, friction transfer, photo orientation, inorganic vapor deposition orientation, uniaxial tensile stretching, uniaxial frictional stretching, and shearing. The organic photoelectric conversion layer can be composed of any of various photoelectric conversion materials, and the material is selected as needed. The organic photoelectric conversion layer contains, for example, a liquid-crystalline dye and/or a dichroic dye. As the liquid-crystalline dye or the dichroic dye, a known dye can be used and is selected as needed.

The materials of the first electrode and the second electrode are selected as needed, however, at least one of the first electrode and the second electrode, for example, the electrode disposed on a light-receiving surface side is made of a transparent conductive metal oxide which is transparent to visible light. At least one of the first electrode and the second electrode, for example, the electrode disposed on a light-receiving surface side may be made of graphene. The transmittance of graphene in a visible light region is as high as, for example, 80% to 90%, although varying depending on the number of graphene layers to be used. Therefore, the amount of light incident on the organic photoelectric conversion layer transmitted through the electrode made of graphene can be increased. Further, graphene can be easily grown by a chemical vapor deposition (CVD) method, and therefore, there is no possibility to damage the organic photoelectric conversion layer when forming a graphene film.

The organic photoelectric conversion layer may be formed by supplying an organic solution obtained by dissolving an organic photoelectric conversion material in a solvent to a solution reserving region and a solution narrowing down region of the first electrode or the second electrode, each of which has, on one principal surface thereof, the solution reserving region and the solution narrowing down region which has a width smaller than the solution reserving region and is connected to the solution reserving region, under the condition that the temperature of the organic solution is set to a first temperature located on a higher temperature side than a solubility curve for the organic solution and the vapor pressure of a surrounding environment of the organic solution is set to a saturated vapor pressure at the first temperature, and then, decreasing the temperature of the organic solution from the first temperature to a second temperature located between the solubility curve and a supersaturation curve for the organic solution. Alternatively, the organic photoelectric conversion layer may be formed by supplying an organic solution obtained by dissolving an organic photoelectric conversion material in a solvent to a solution reserving region and a solution narrowing down region of the first electrode or the second electrode, each of which has, on one principal surface thereof, the solution reserving region and the solution narrowing down region which has a width smaller than the solution reserving region and is connected to the solution reserving region, under the condition that the temperature of the organic solution is set to a third temperature located between a solubility curve for the organic solution and a supersaturation curve for the organic solution and the vapor pressure of a surrounding environment of the organic solution is set to a saturated vapor pressure at the third temperature, and then, decreasing the vapor pressure. Further, the organic photoelectric conversion layer may be one obtained by forming an organic photoelectric conversion layer forming film composed of a mixture of a photoelectric conversion material and a binder, and then uniaxially orienting the organic photoelectric conversion layer forming film by at least one method selected from the group consisting of uniaxial tensile stretching, uniaxial frictional stretching, and shearing.

The polarization optical device is typically provided with two organic photoelectric conversion devices which are disposed such that the orientation axes thereof are orthogonal to each other.

The polarization organic photoelectric conversion device can be used as, for example, a polarization organic imaging device, a ranging device, and the like. The polarization organic photoelectric conversion device or the polarization optical device can be used in a variety of electronic apparatuses utilizing polarized light. Specific examples of such electronic apparatuses include a three-dimensional camera using a polarization organic imaging device composed of a polarization organic photoelectric conversion device.

According to the embodiments of the present disclosure, a polarization organic photoelectric conversion device and a polarization optical device each have a high polarization property because an organic photoelectric conversion layer itself has been uniaxially oriented in advance. Therefore, the polarization organic photoelectric conversion device and the polarization optical device each have high sensitivity to polarized light.

According to the embodiments of the present disclosure, a polarization organic photoelectric conversion device and a polarization optical device each having high sensitivity to polarized light can be obtained. In particular, according to this polarization optical device, polarized light in two directions is received and the light can be photoelectrically converted. Further, by using the polarization organic photoelectric conversion device or the polarization optical device, a high-performance imaging device or electronic apparatus can be realized.

DETAILED DESCRIPTION

Hereinafter, embodiments of the present disclosure (hereinafter referred to as "embodiments") will be described. The description will be made in the following order.

1. First Embodiment (a polarization organic photoelectric conversion device and a method for producing the same)
2. Second Embodiment (a polarization organic photoelectric conversion device and a method for producing the same)
3. Third Embodiment (a polarization organic photoelectric conversion device and a method for producing the same)
4. Fourth Embodiment (a polarization organic photoelectric conversion device and a method for producing the same)
5. Fifth Embodiment (a polarization optical device and a method for producing the same)<
<1. First Embodiment>
[Polarization Organic Photoelectric Conversion Device]

Figure 1A:
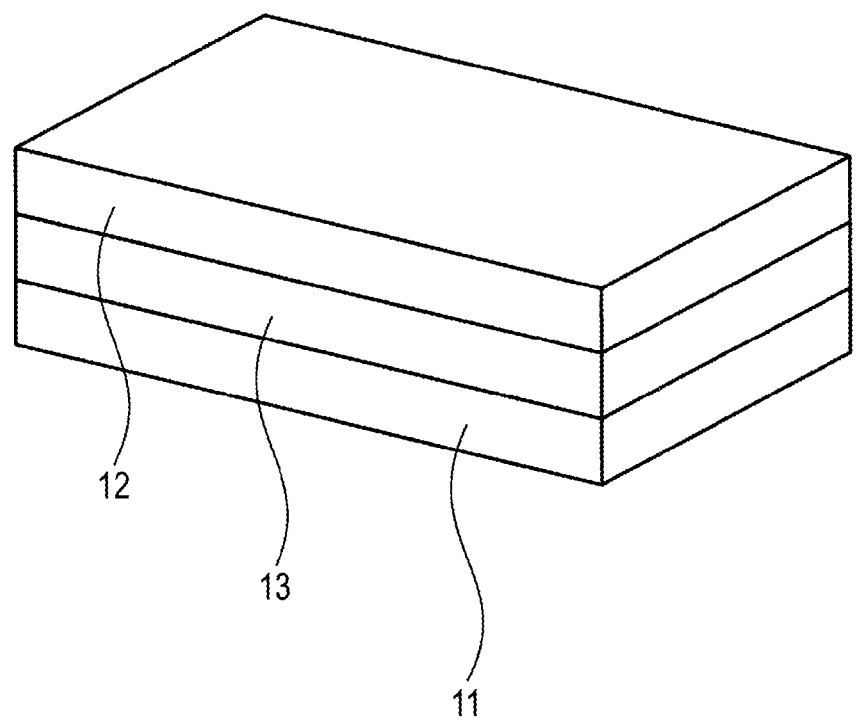
FIG. 1A is a perspective view showing a polarization organic photoelectric conversion device according to a first embodiment.

A polarization organic photoelectric conversion device according to a first embodiment is shown in FIG. 1A.

Figure 1B:
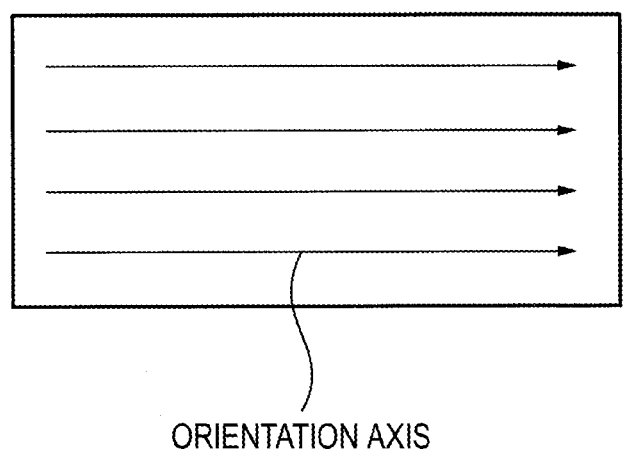
FIG. 1B is a plan view showing a uniaxially oriented organic photoelectric conversion layer of the polarization organic photoelectric conversion device.

As shown in FIG. 1A, the polarization organic photoelectric conversion device according to this embodiment has a structure in which an organic photoelectric conversion layer 13 composed of an organic photoelectric conversion material is interposed between a first electrode 11 and a second electrode 12. The organic photoelectric conversion layer 13 is one obtained by uniaxially orienting at least a portion thereof in a given direction in the plane in advance. For example, as shown in FIG. 1B, the organic photoelectric conversion layer 13 is one obtained by uniaxially orienting the entire body thereof in the same direction. Among the first electrode 11 and the second electrode 12, at least one disposed on a light-receiving surface side is transparent to light to be photoelectrically converted, for example, visible light, and the other may be or not be transparent to light to be photoelectrically converted. For example, one of the first electrode 11 and the second electrode 12 is used as a ground electrode, and the other is used as a biasing electrode. The first electrode 11 and the second electrode 12 may be formed on a substrate as needed. When at least one disposed on a light-receiving surface side among the first electrode 11 and the second electrode 12 is formed on a substrate, as the substrate, a substrate transparent to light to be photoelectrically converted is used. In the polarization organic photoelectric conversion device, for example, when the surface on the second electrode 12 side becomes a light-receiving surface, incident light transmits through the second electrode 12, or when the second electrode 12 is formed on a substrate, light transmits through the substrate and the second electrode 12 and is incident on the organic photoelectric conversion layer 13.

When the first electrode 11 or the second electrode 12 is configured to be transparent to, for example, visible light, as the material thereof, for example, a transparent conductive metal oxide such as tin-doped indium oxide (ITO), indium-doped zinc oxide (IZO), indium gallium-doped zinc oxide (IGZO), aluminum-doped zinc oxide (AZO), or titanium dioxide ($TiO_2$) or the like can be used alone or two or more types thereof can be used in admixture, or a carbon material such as graphene or the like can be used. When graphene is used as the material of the first electrode 11 or the second electrode 12, the electrode may be formed of a single layer or two or more layers of graphene. However, the transmittance to visible light is decreased by 2.3% per layer of graphene increased, and therefore, the number of layers of graphene is appropriately determined depending on the transmittance necessary for forming the electrode to be transparent among the first electrode 11 and the second electrode 12. By using graphene as the material of the first electrode or the second electrode 12, the transmittance to visible light of the first electrode 11 or the second electrode 12 can be considerably increased as compared with the case of using a transparent conductive metal oxide such as ITO as the material of the first electrode or the second electrode 12. In addition, since graphene can be easily formed by a CVD method, it is not necessary to use a sputtering method, a vacuum vapor deposition method, or the like when forming the first electrode 11 or the second electrode 12, and therefore, the occurrence of damage to the organic photoelectric conversion layer 13 when forming the first electrode 11 or the second electrode 12 can be prevented. Further, graphene has an excellent gas barrier property, and therefore can prevent oxygen or the like from diffusing into the organic photoelectric conversion layer 13 through the first electrode 11 or the second electrode 12. As a result, the property of the organic photoelectric conversion layer 13 can be prevented from deteriorating. In this manner, a high-performance and long-life polarization organic photoelectric conversion device which has excellent polarization property, photoelectric conversion property, electric property, and reliability can be realized. Further, in the case where graphene, which is an environment-friendly carbon material, is used as the material of the first electrode 11 or the second electrode 12, since a material containing a rare metal such as ITO is not used, the depletion of earth resources can be prevented, and therefore the use of graphene is preferred from an environmental point of view. In the case where it is not necessary to form the first electrode 11 or the second electrode 12 to be transparent, as the material thereof, specifically, for example, any of a variety of metals such as copper (Cu), titanium (Ti), and aluminum (Al), an alloy thereof, or the like can be used. The thickness of each of the first electrode 11 and the second electrode 12 is selected as needed, and is not particularly limited.

When forming the first electrode 11 or the second electrode 12 on a substrate, the material of the substrate is selected from known materials as needed. Specifically, as the material of the substrate, for example, a glass substrate, a quartz substrate, a silicon substrate, a plastic substrate, or the like is used. As the plastic substrate, for example, a substrate made of polyimide, polycarbonate, polyethylene terephthalate, polyethylene naphthalate, polyether sulfone, or the like is used. The thickness of the substrate is selected as needed, and is not particularly limited.

As the organic photoelectric conversion material constituting the organic photoelectric conversion layer 13, any of various types of known materials can be used, and is appropriately selected depending on the wavelength of light to be photoelectrically converted. As the organic photoelectric conversion material, specifically, for example, any of various types of organic dyes listed below can be used, however, is not limited thereto. For example, in consideration of the band structures of the highest occupied molecular orbital (HOMO) and the lowest occupied molecular orbital (LUMO) of the organic dye, the material is selected such that the work functions of the first electrode 11 and the second electrode 12 are similar to each other. However, in the case where an intermediate layer (buffer layer) is formed between the first electrode 11 and the organic photoelectric conversion layer 13, and between the second electrode 12 and the organic photoelectric conversion layer 13, it may be not necessary to do as such. The organic photoelectric conversion layer 13 may be composed of one type of organic photoelectric conversion material, or may be composed of two or more types of organic photoelectric conversion materials in combination, for example, by mixing two or more types of organic photoelectric conversion materials. The thickness of the organic photoelectric conversion layer 13 is selected as needed. However, in consideration of the intensity of an electric field to be applied when the polarization organic photoelectric conversion device is operated, stability of the film formation, or the like, the thickness thereof is preferably 30 nm or more and 500 nm or less.

Vat Violet 1
Isoviolanthrone

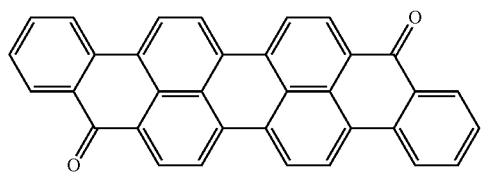 [SMILES: O=C1c2ccccc2-c2ccc3c4ccc5c6c(ccc(c7ccc1c2c73)c64)-c1ccccc1C5=O]

Vat Violet 2
Pigment Violent 36
Vat Violet 3
4,4',7,7'-Tetramethyl-5,5'-dichloro-Δ2,2'(3H,3'H)-bi[benzo[b]thiophene]-3,3'-dione

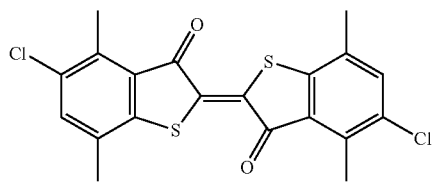 [SMILES: Cc1cc(Cl)c(C)c2c1S/C(=C1/Sc3c(C)cc(Cl)c(C)c3C1=O)C2=O]

Vat Violet 4
Vat Violet 5
5,7-Dichloro-2-[5,6,7-trichloro-3-oxobenzo[b]thiophen-2(3H)-ylidene]-1H-indol-3(2H)-one

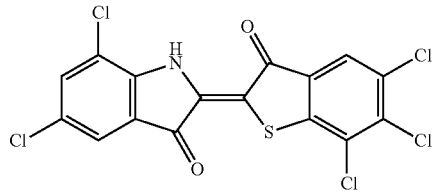 [SMILES: O=C1/C(=C2\Sc3c(cc(Cl)c(Cl)c3Cl)C2=O)Nc2c(Cl)cc(Cl)cc21]

Vat Violet 6
Vat Violet 7
Pigment Violet 1
Xanthene, Rhodamine B
9-(2-Carboxyphenyl)-3,6-bis(diethylamino)-xanthylium molybdatetungstatephosphate

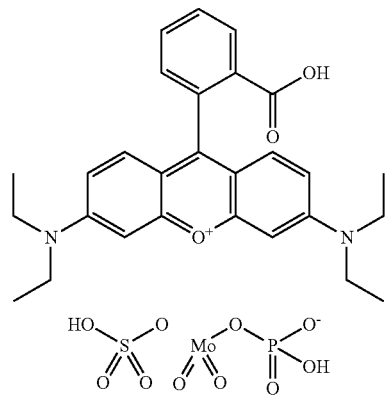

Pigment Violet 3
4-[(4-Aminophenyl)-(4-imino-2,5-cyclohexadien-1-ylidene)methyl]-benzenamine N-Me derivs

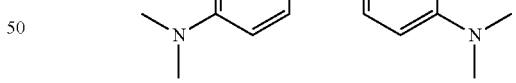

Pigment Violet 4
Carbonium, Magenta
Pigment Violet 5
Anthraquinone, Sulfonated quinizarin, Alizarin Violet
Pigment Violet 5:1
Anthraquinone aluminum lake, Sulfonated quinizarin aluminum lake, Alizarin Violet
Pigment Violet 19
Unsubstituted quinacridone
Pigment Violet 23
Dioxazine, Dioxazine carbazole violet
8,18-Dichloro-5,15-diethyl-5,15-dihydrodiindolo[3,2-b:3',2'-m]triphenodioxazine

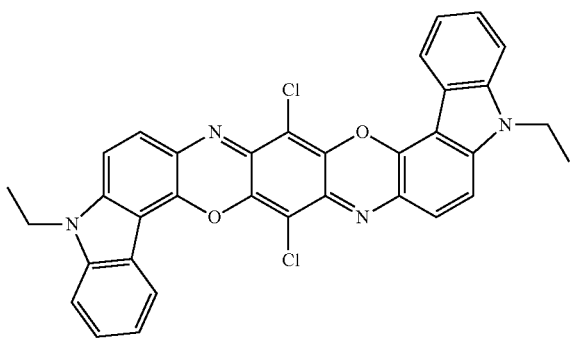 [SMILES: CCn1c2ccccc2c2c3c(ccc21)N=c1c(Cl)c2c(c(Cl)c1O3)=Nc1ccc3c(c1O2)c1ccccc1n3CC]

Pigment Violet 27

Ferrate(4-), Hexakis(cyano-c)-, Methylated 4-[(4-aminophenyl)(4-imino-2,5-cyclohexadien-1-ylidene)methyl]benzenamine copper(2+)salts

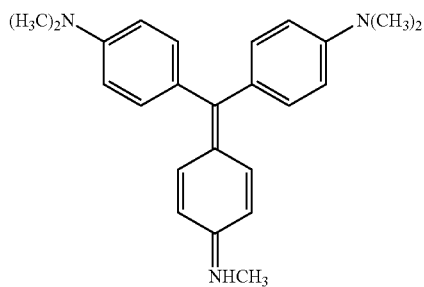

Pigment Violet 29

3,4,9,10-Perylenetetracarboxylic acid diimide

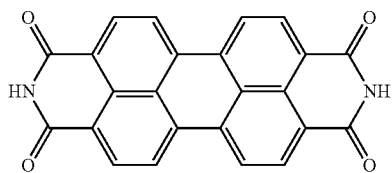

Pigment Violet 31

Violanthrone, Brilliant Violet RR

Dichloro-benzo[rst]phenanthro[10,1,2-cde]pentaphene-9,10-dione; Pigment Violet 31; C.I. Pigment Violet 31

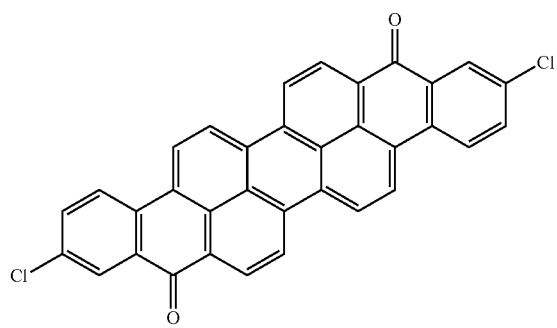 [SMILES: O=C1c2cc(Cl)ccc2-c2ccc3c4ccc5c6c(ccc(c7ccc1c2c73)c64)-c1ccc(Cl)cc1C5=O]

Pigment Violet 32

N-(2,3-dihydro-2-oxo-1H-benzimidazol-5-yl)-3-hydroxy-4-[[2,5-dimethoxy-4-[(methylamino)sulphonyl]phenyl]azo]naphtalene-2-carboxamide Dichlorobenzo[rst]phenanthro[10,1,2-cde]pentaphene-9,10-dione); Pigment Violet 31; C.I. Pigment Violet 31

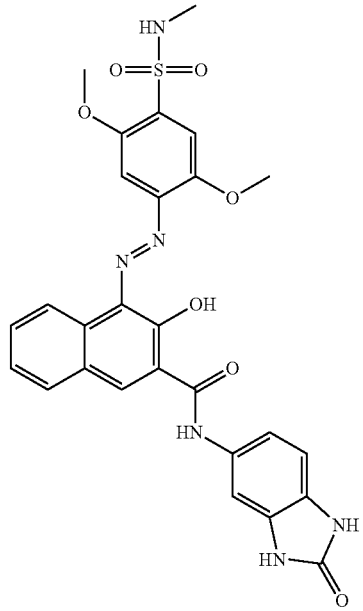 [SMILES: CNS(=O)(=O)c1cc(OC)c(/N=N/c2c(O)c(C(=O)Nc3ccc4[nH]c(=O)[nH]c4c3)cc3ccccc23)cc1OC]

Pigment Violet 33

Bromobenzo[rst]phenanthro[10,1,2-cde]pentaphene-9,18-dione

Threne Brilliant Violet 3B

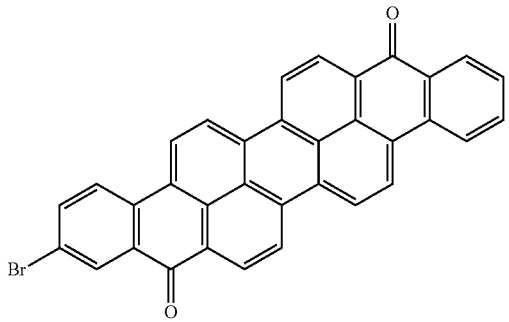 [SMILES: O=C1c2ccccc2-c2ccc3c4ccc5c6c(ccc(c7ccc1c2c37)c64)-c1ccc(Br)cc1C5=O]

Pigment Violet 34

4-[(4-Aminophenyl)azo]-4'-[(2,4-dihydroxyphenyl)azo][1,1'-azobisnaphthalene]-6',7-disulfonic acid disodium

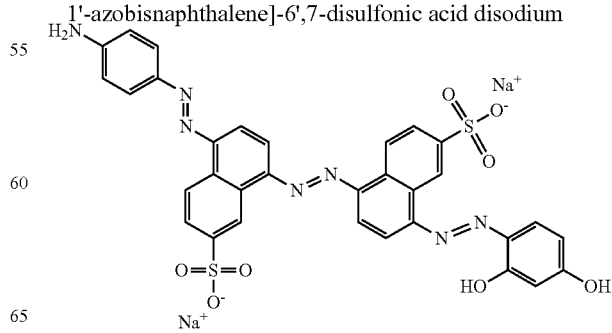

Pigment Violet 35

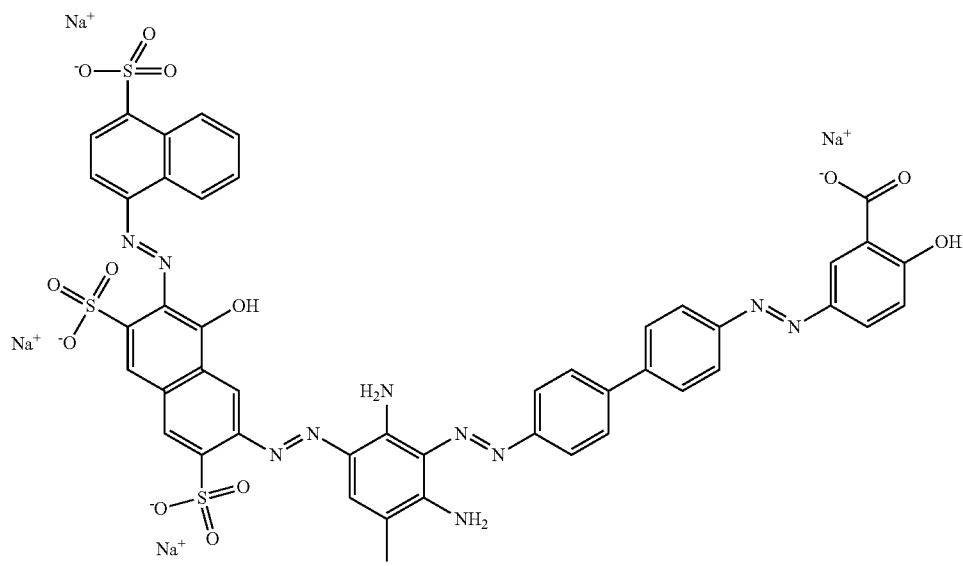

Pigment Violet 36
Thioindigo
5-Chloro-2-(5-chloro-7-methyl-3-oxobenzo[b]thien-2(3H)-ylidene)-7-methyl-benzo[b]thiophen-3(2H)-one
5-Chloro-2-(5-chloro-7-methyl-3-oxobenzo[b]thiophen-2(3H)-ylidene)-7-methylbenzo[b]thiophene-3(2H)-one

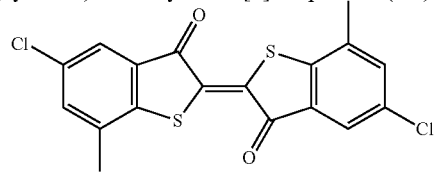 [SMILES: Cc1cc(Cl)cc2c1S/C(=C1/Sc3c(C)cc(Cl)cc3C1=O)C2=O]

Pigment Violet 37
Dioxazine
(2E)-3,7-dimethyl-2,6-octadienyl 3-methylbutanoate

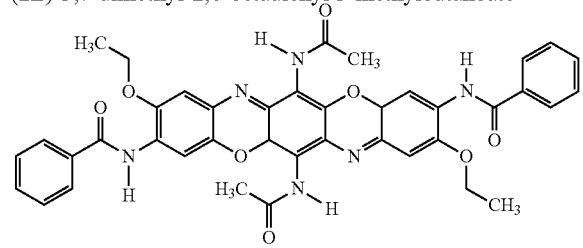

Pigment Violet 38
Allyl 2-chloro-1,1,2-trifluoroethyl ether

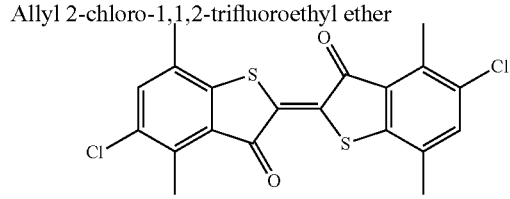

Pigment Violet 40
Oleylamine

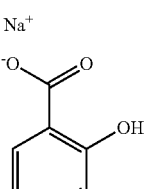

Pigment Violet 42
2-Butoxyethyl 4-(2,4-dichlorophenoxy)butyrate

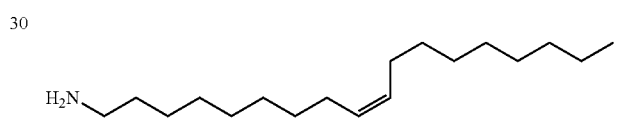

Pigment Violet 42
Quinacridone, Quinacridone solid solution, Qinacridone Maroon B

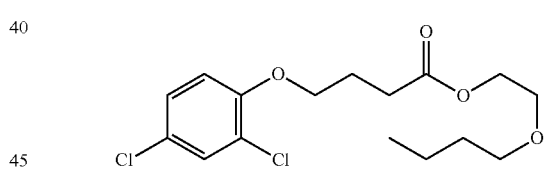

Pigment Violet 43
4-[[4-(Benzoylamino)-2-methoxy-5-methylphenyl]azo]-N-(4-chlorophenyl)-3-hydroxy-2-naphthalenecarboxamide

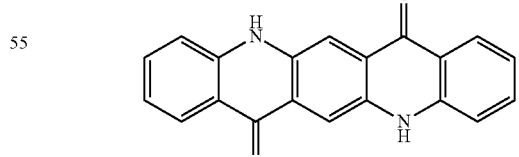

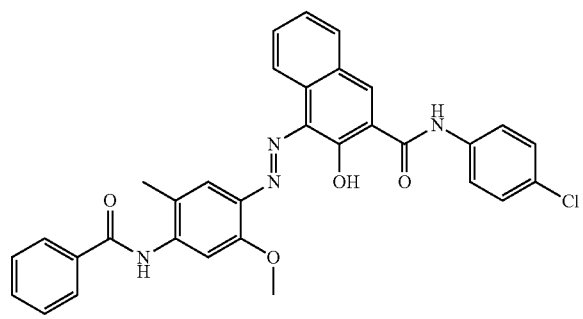 [SMILES: COc1cc(NC(=O)c2ccccc2)c(C)cc1/N=N/c1c(O)c(C(=O)Nc2ccc(Cl)cc2)cc2ccccc12]

Pigment Violet 44
4-(4-Methoxyphenyl)-2-butanone

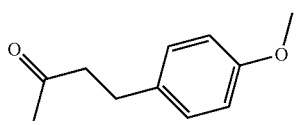

Pigment Violet 50
4-[(4-(Benzoylamino-2-methoxy-5-methylphenyl)azo]-3-hydroxy-N-phenyl-2-naphthalenecarboxamide

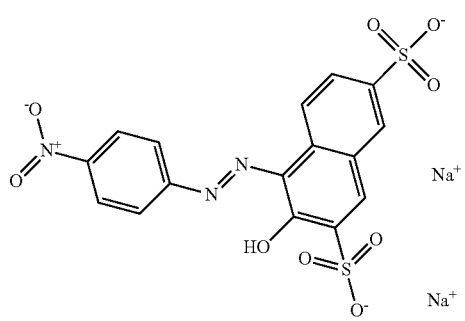

Pigment Blue 1
Carbonium, Victoria Pure Blue

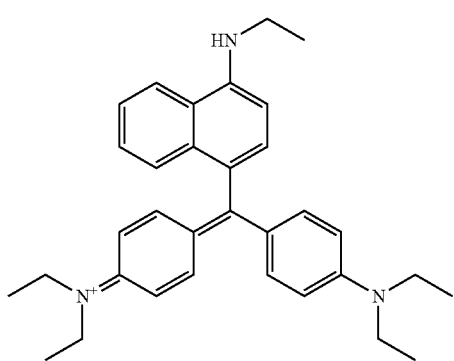 [SMILES: CCNc1ccc(C(=C2C=CC(=[N+](CC)CC)C=C2)c2ccc(N(CC)CC)cc2)c2ccccc12]

Pigment Blue 5
2-Methyl-4-[[4-[[4-[(3-methylphenyl)amino]phenyl][4-[(3-methylphenyl)imino]-2,5-cyclohexadien-1-ylidene]methyl]phenyl]amino]benzenesulfonate

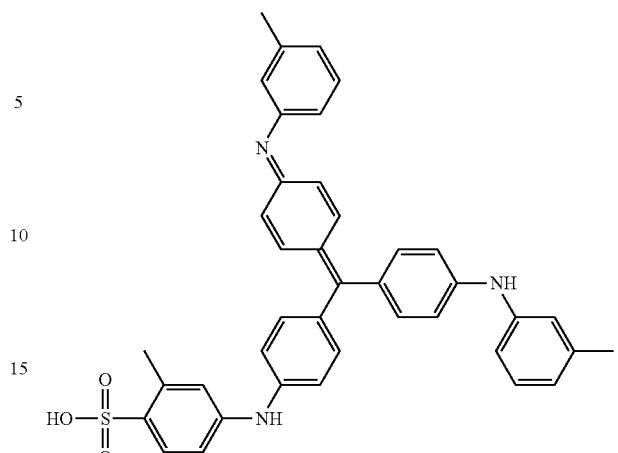

Pigment Blue 7
Phthalocyanine cobalt (II)

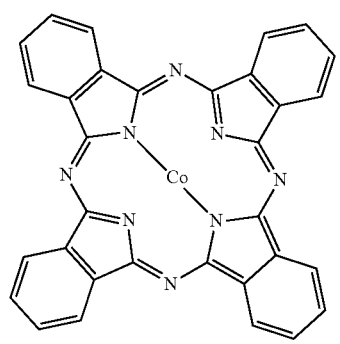

Pigment Blue 15
Unsubstituted copper phthalocyanine (α crystal form)

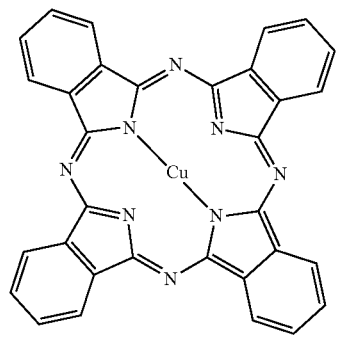

Pigment Blue 15:1
Lowly chlorinated copper phthalocyanine (α crystal form)
Pigment Blue 15:2
NF-treated copper phthalocyanine (α crystal form)
(NF-treated unsubstituted copper phthalocyanine (α crystal form), NF-treated lowly chlorinated copper phthalocyanine (α crystal form))

Pigment Blue 15:3
Unsubstituted copper phthalocyanine (β crystal form)
Pigment Blue 15:4
NF-treated unsubstituted copper phthalocyanine (β crystal form)
Pigment Blue 15:5
Unsubstituted copper phthalocyanine (γ crystal form)
Pigment Blue 15:6
Unsubstituted copper phthalocyanine (ε crystal form)
Pigment Blue 16
Metal-free phthalocyanine, Pc

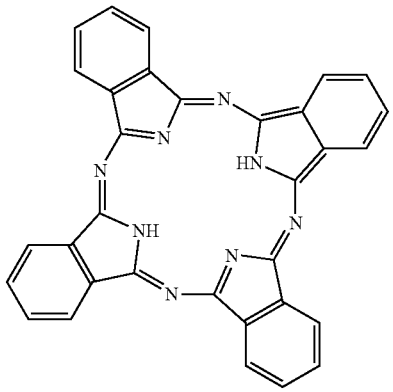 [SMILES: c1ccc2c(c1)-c1nc-2nc2[nH]c(nc3nc(nc4[nH]c(n1)c1ccccc41)-c1ccccc1-3)c1ccccc21]

Pigment Blue 17
Sulfonated copper phthalocyanine lake
Pigment Blue 24
N-ethyl-N-[4-[[4-[ethyl[(3-sulfophenyl)methyl]amino]phenyl](2-sulfonatophenyl)methylene]-2,5-cyclohexadien-1-ylidene]-3-sulfobenzenemethanaminium/barium (1:1)
Pigment Blue 25
4,4'-[3,3'-Dimethoxybiphenyl-4,4'-diylbis(azo)]bis(3-hydroxy-N-phenyl-2-naphthamide)

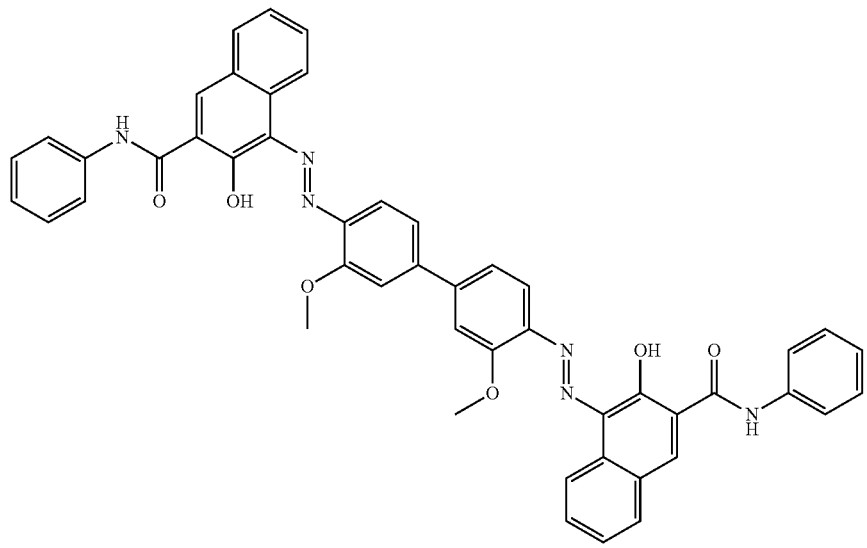 [SMILES: COc1cc(-c2ccc(/N=N/c3c(O)c(C(=O)Nc4ccccc4)cc4ccccc34)c(OC)c2)ccc1/N=N/c1c(O)c(C(=O)Nc2ccccc2)cc2ccccc12]

Pigment Blue 56
2-Methyl-4-[[4-[[4-[(3-methylphenyl)amino]phenyl][4-[(3-methylphenyl)imino]-2,5-cyclohexadien-1-ylidene]methyl]phenyl]amino]benzenesulfonate

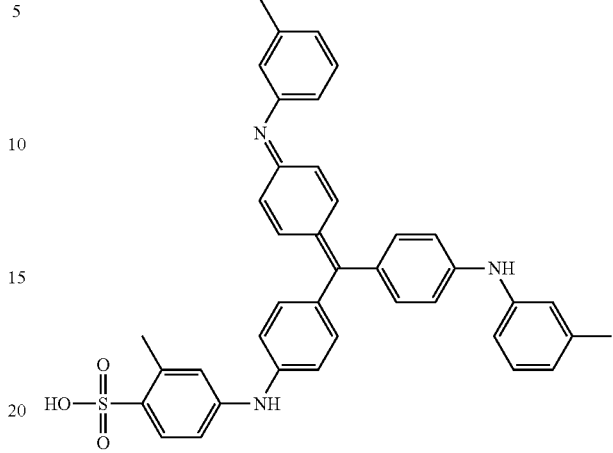

Pigment Blue 57
3-Methyl-4-[[4-[[4-[(2-methylphenyl)amino]phenyl][4-[(2-methylphenyl)imino]-2,5-cyclohexadien-1-ylidene]methyl]phenyl]amino]benzenesulfonate
Pigment Blue 60
Indanthrene, Anthraquinone, Indanthrene Blue

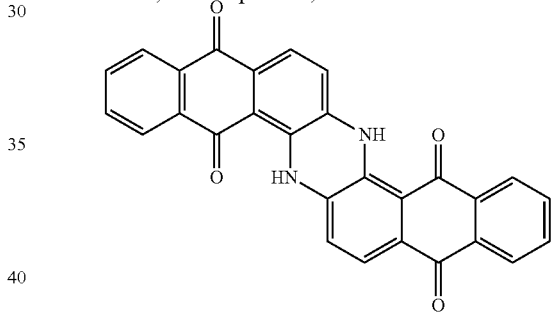

Pigment Blue 61
[[4-[[4-(phenylamino)phenyl][4-(phenylimino)-2,5-cyclohexadien-1-ylidene]methyl]phenyl]amino]benzenesulfonate

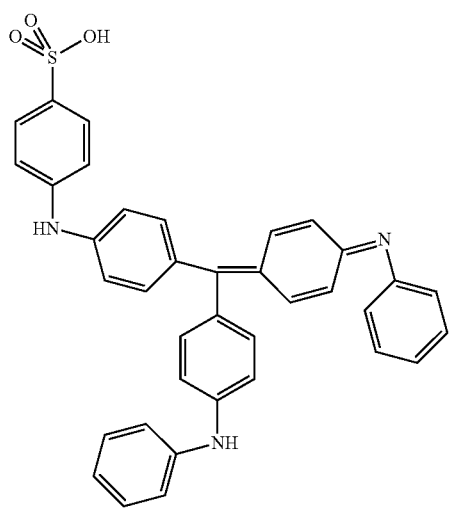 [SMILES: O=S(=O)(O)c1ccc(Nc2ccc(C(=C3C=CC(=Nc4ccccc4)C=C3)c3ccc(Nc4ccccc4)cc3)cc2)cc1]

Pigment Blue 63
C.I. aluminum lake

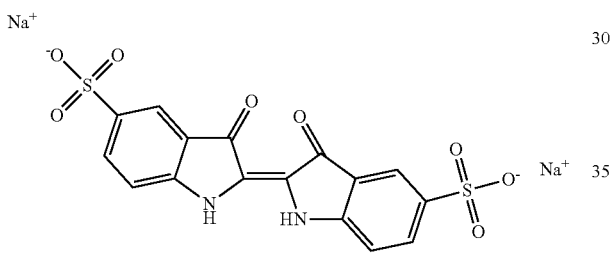

Pigment Blue 64
$C_{28}H_{12}Cl_2N_2O_4$

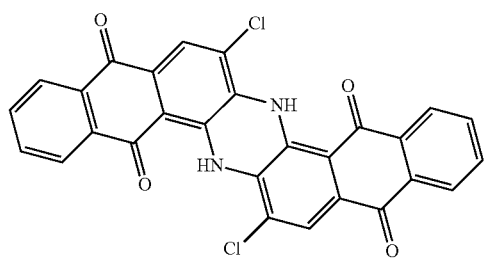 [SMILES: O=c1c2ccccc2c(=O)c2c1cc(Cl)c1[nH]c3c([nH]c12)c(Cl)cc1c(=O)c2ccccc2c(=O)c13]

Pigment Blue 65
Violanthrene-5,10-dione

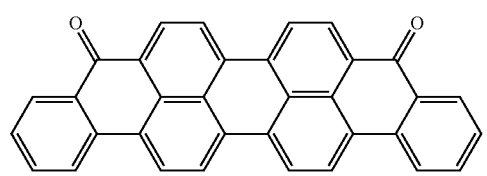 [SMILES: O=C1c2ccccc2-c2ccc3c4ccc5c6c(ccc(c7ccc1c2c73)c64)C(=O)c1ccccc1-5]

Pigment Blue 66
Indigo, Deep blue

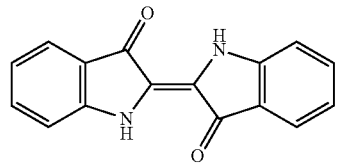 [SMILES: O=C1/C(=C2\Nc3ccccc3C2=O)Nc2ccccc21]

Pigment Blue 75
Cobalt phthalocyanine blue, CoPc
Pigment Blue 76
Phthalocyanine blue green 10GN (highly chlorinated phtalocyanine blue)
Pigment Blue 79
Aluminum phthalocyanine blue, AlPc
Pigment Blue 80
Benzimidazolone dioxazine blue
Pigment Blue 82
Composite of indigo and clay (Maya Blue)
Pigment Red 1
β-naphthol, Monoazo, Para Red

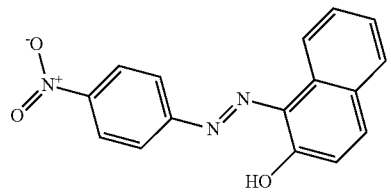

Pigment Red 2
Naphthol AS, Monoazo

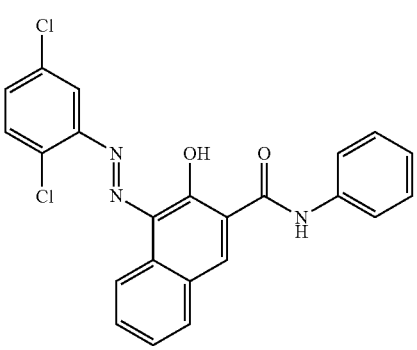 [SMILES: O=C(Nc1ccccc1)c1cc2ccccc2c(/N=N/c2cc(Cl)ccc2Cl)c1O]

Pigment Red 3

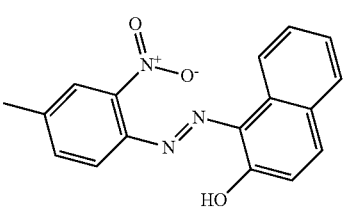 [SMILES: Cc1ccc(/N=N/c2c(O)ccc3ccccc23)c([N+](=O)[O-])c1]

Pigment Red 4
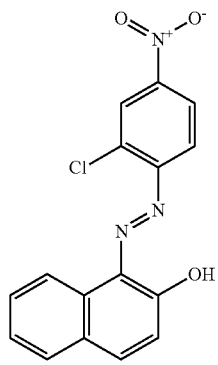 [SMILES: O=[N+]([O-])c1ccc(/N=N/c2c(O)ccc3ccccc23)c(Cl)c1]
Pigment Red 5
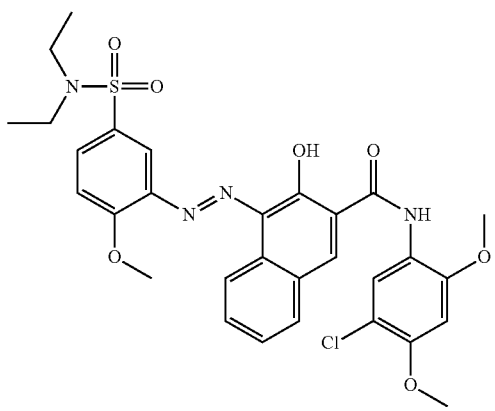 [SMILES: CCN(CC)S(=O)(=O)c1ccc(OC)c(/N=N/c2c(O)c(C(=O)Nc3cc(Cl)c(OC)cc3OC)cc3ccccc23)c1]
Pigment Red 6
Naphthol AS, Monoazo, Karmin FB
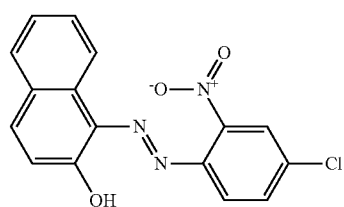
Pigment Red 7
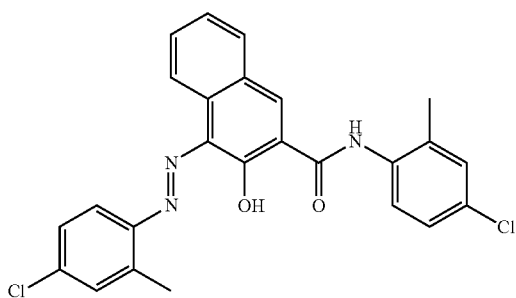 [SMILES: Cc1cc(Cl)ccc1/N=N/c1c(O)c(C(=O)Nc2ccc(Cl)cc2C)cc2ccccc12]
Pigment Red 8
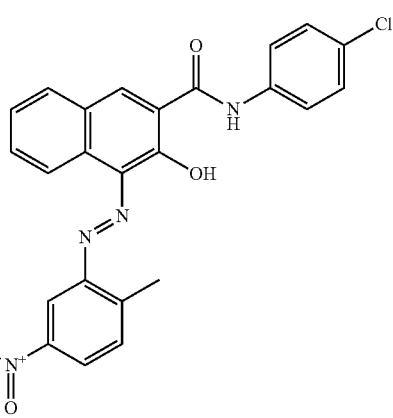
Pigment Red 9
Naphthol AS, Monoazo, Permanent Red FRLL
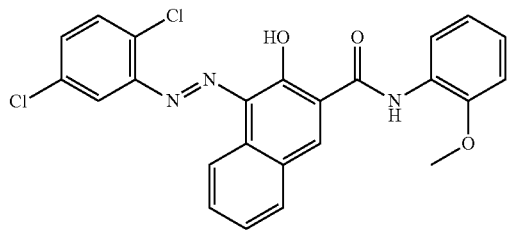 [SMILES: COc1ccccc1NC(=O)c1cc2ccccc2c(/N=N/c2cc(Cl)ccc2Cl)c1O]
Pigment Red 12
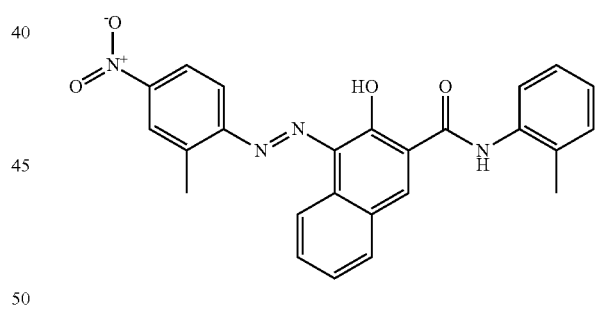
Pigment Red 13
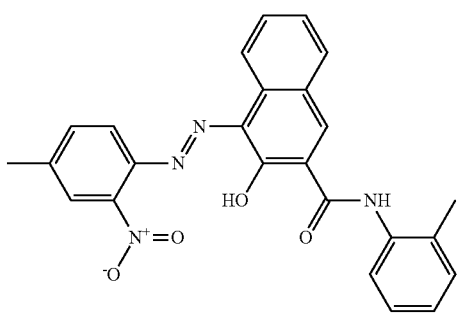

Pigment Red 17
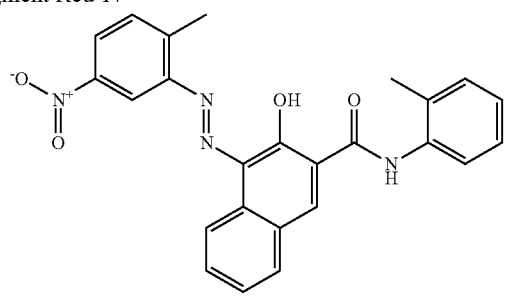
Pigment Red 24
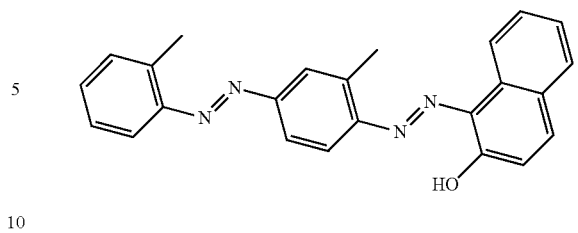
Pigment Red 21
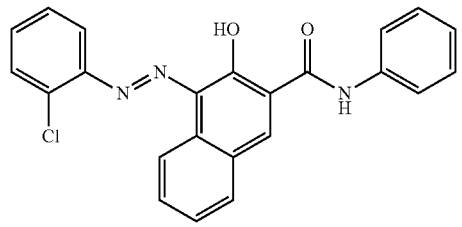 [SMILES: O=C(Nc1ccccc1)c1cc2ccccc2c(/N=N/c2ccccc2Cl)c1O]
Pigment Red 31
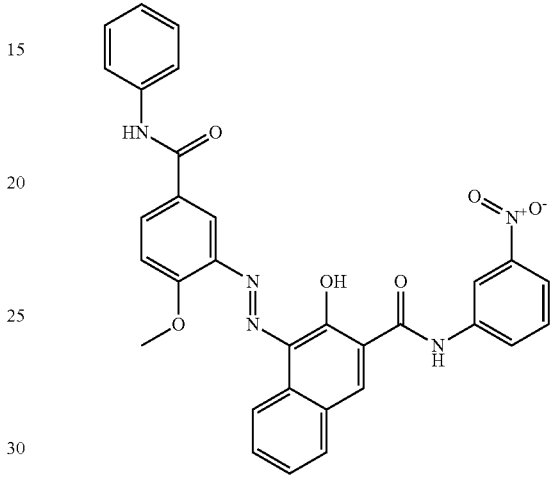
Pigment Red 22
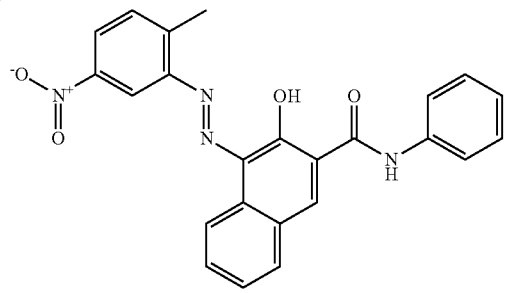
Pigment Red 23
Naphthol AS, Monoazo, Karmin BS
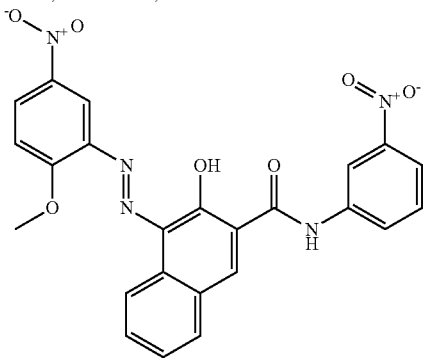
Pigment Red 32
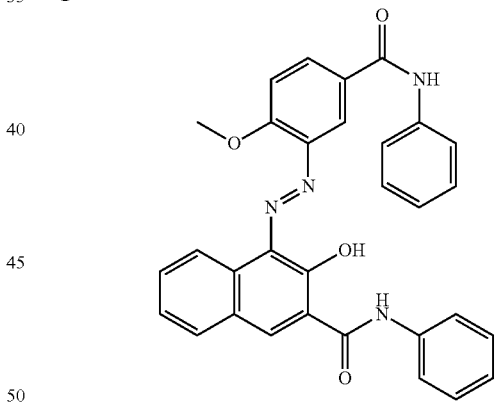
Pigment Red 38
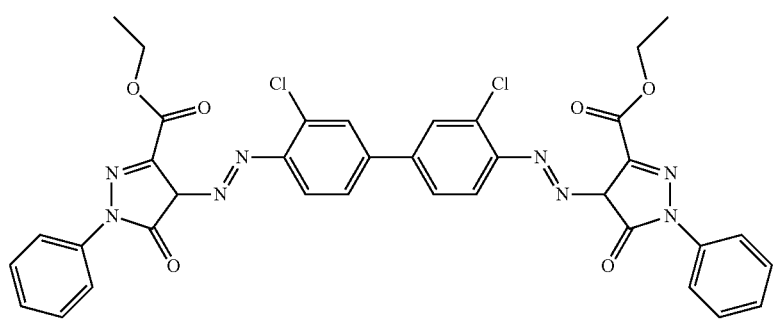 [SMILES: CCOC(=O)C1=NN(c2ccccc2)C(=O)C1/N=N/c1ccc(-c2ccc(/N=N/C3C(=O)N(c4ccccc4)N=C3C(=O)OCC)c(Cl)c2)cc1Cl]

Pigment Red 48
BONA, Monoazo
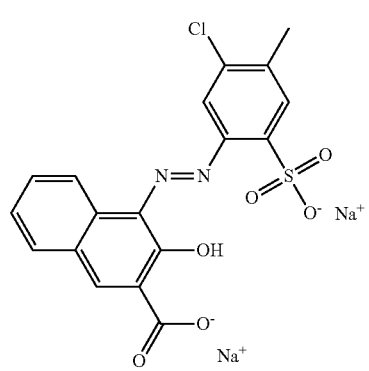
Pigment Red 49
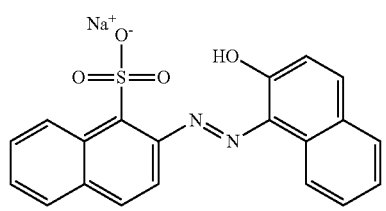 [SMILES: [Na+] ; O=S(=O)([O-])c1c(/N=N/c2c(O)ccc3ccccc23)ccc2ccccc12]
Pigment Red 50
Pigment Red 51
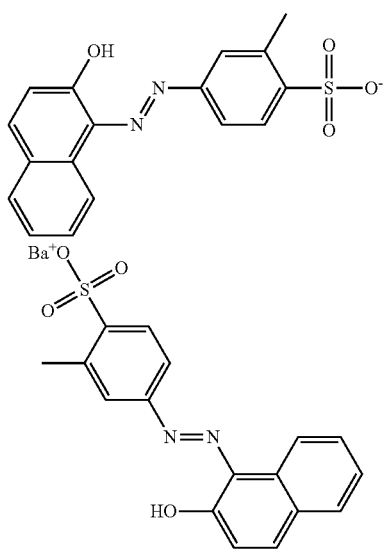
Pigment Red 52
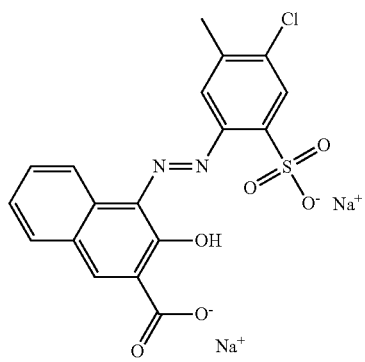 [SMILES: Cc1cc(/N=N/c2c(O)c(C(=O)[O-])cc3ccccc23)c(S(=O)(=O)[O-])cc1Cl ; [Na+] ; [Na+]]
Pigment Red 53
β-naphthol, Monoazo, Laked C
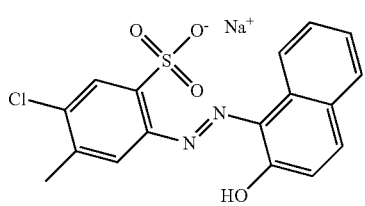 [SMILES: Cc1cc(/N=N/c2c(O)ccc3ccccc23)c(S(=O)(=O)[O-])cc1Cl ; [Na+]]
Pigment Red 54
β-naphthol, Calcium lake, Monoazo
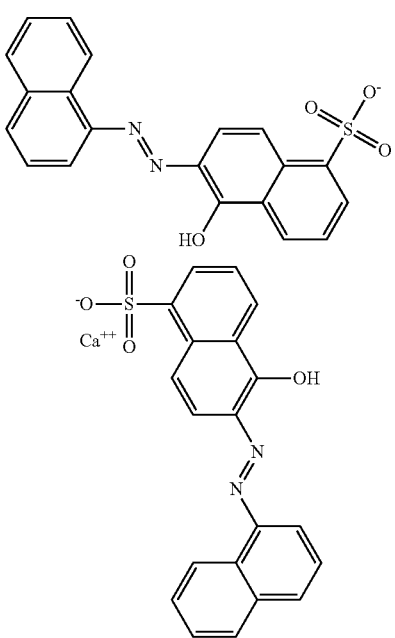

Pigment Red 64
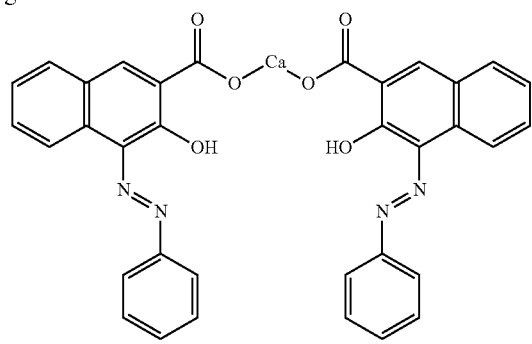
Pigment Red 68
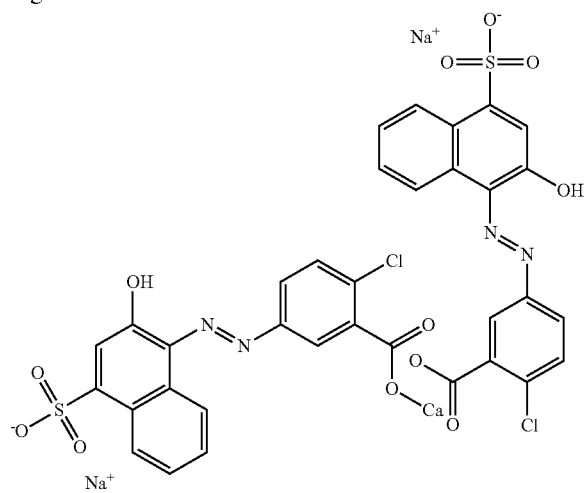
Pigment Red 88
Thioindigo
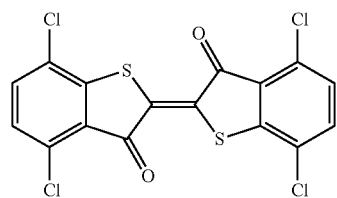 [SMILES: O=C1/C(=C2\Sc3c(Cl)ccc(Cl)c3C2=O)Sc2c(Cl)ccc(Cl)c21]
Pigment Red 112
Naphthol AS, Monoazo, Permanent Red FGR
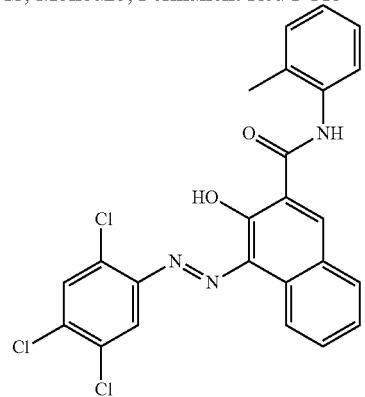
Pigment Red 113
Cadmium mercury red
Pigment Red 114
Naphthol AS, Monoazo, Brilliant Karmin BS
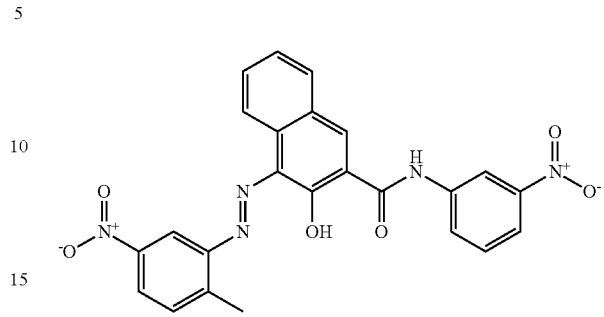
Pigment Red 122
Quinacridone, Dimethyl quinacridone, Quinacridone Magenta
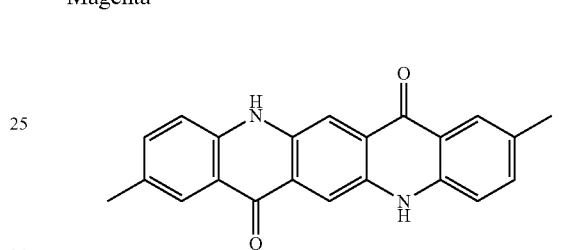
Pigment Red 123
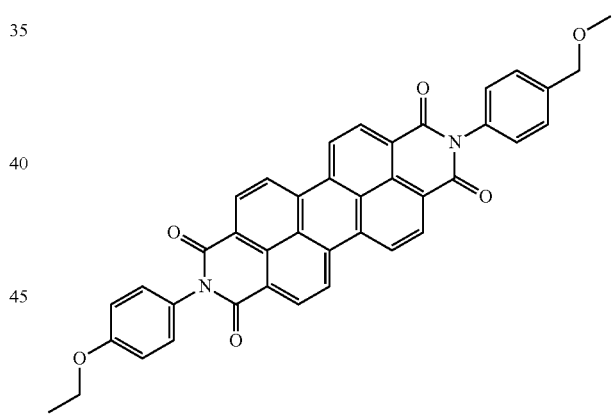
Pigment Red 144
Condensed diazo
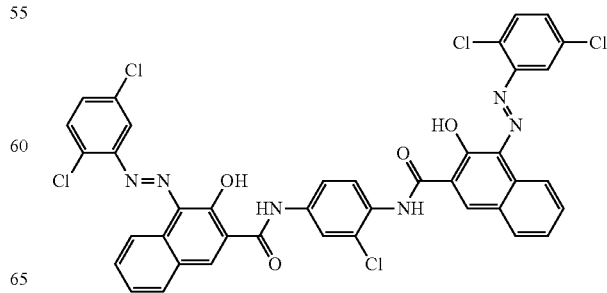

Pigment Red 146
Naphthol AS, Monoazo, Karmin FBB
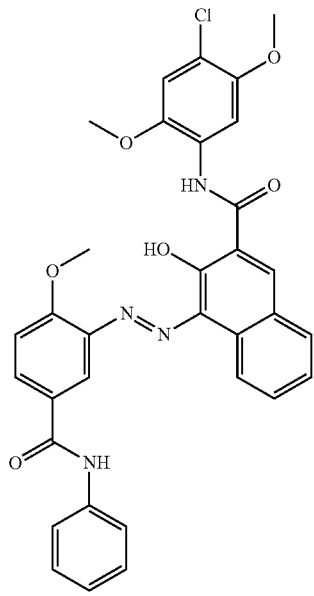 [SMILES: COc1cc(NC(=O)c2cc3ccccc3c(/N=N/c3cc(C(=O)Nc4ccccc4)ccc3OC)c2O)c(OC)cc1Cl]
Pigment Red 147
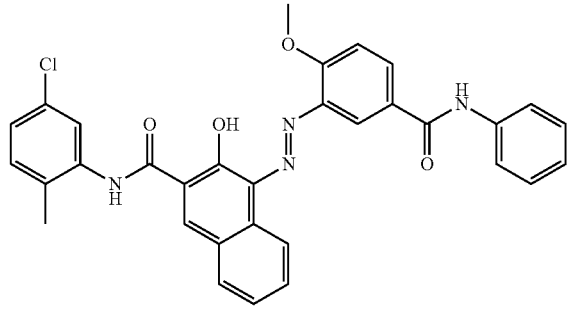 [SMILES: COc1ccc(C(=O)Nc2ccccc2)cc1/N=N/c1c(O)c(C(=O)Nc2cc(Cl)ccc2C)cc2ccccc12]
Pigment Red 148
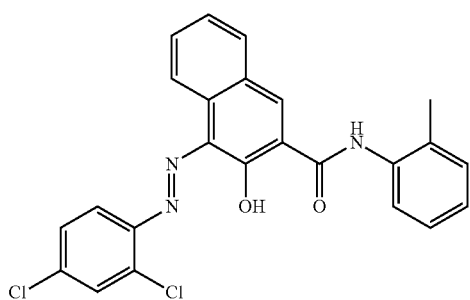 [SMILES: Cc1ccccc1NC(=O)c1cc2ccccc2c(/N=N/c2ccc(Cl)cc2Cl)c1O]
Pigment Red 149
Perylene, Perylene Red BL
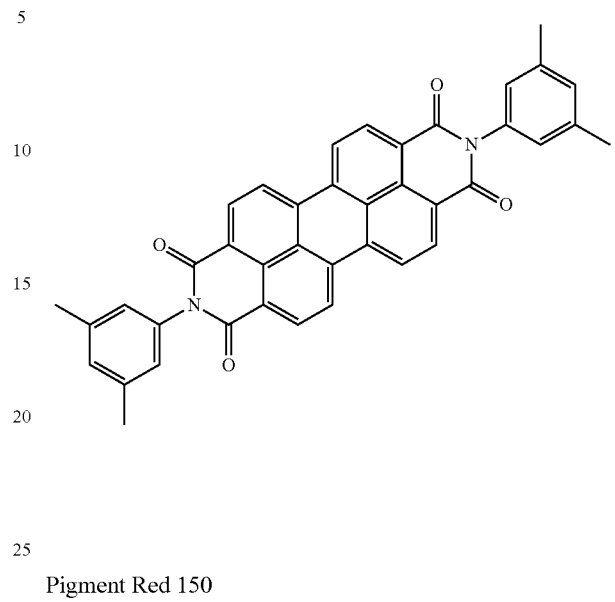
Pigment Red 150
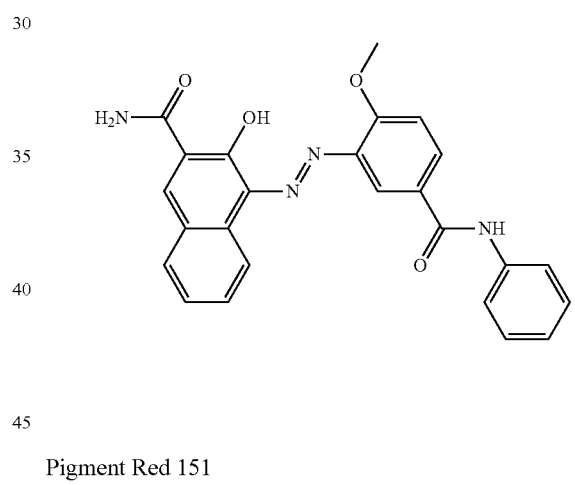
Pigment Red 151
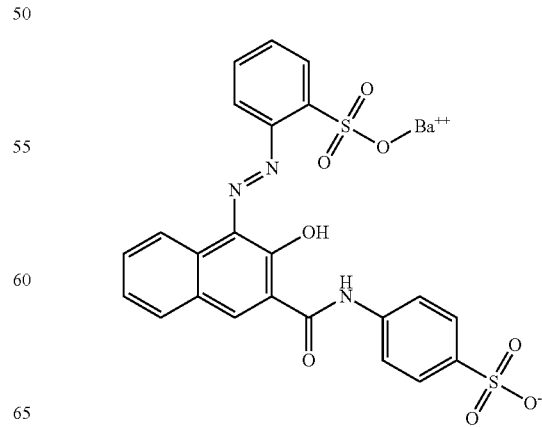

Pigment Red 168
Anthraquinone, Dibromoanthanthrone Red
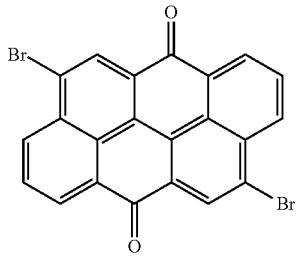 [SMILES: O=c1c2cc(Br)c3cccc4c(=O)c5cc(Br)c6cccc1c6c5-c2c34]
Pigment Red 170
Naphthol AS, Monoazo, Naphthol Carbamide Yellow
Pigment Red 171
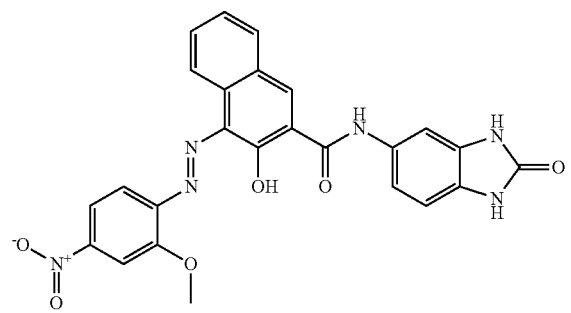
Pigment Red 173
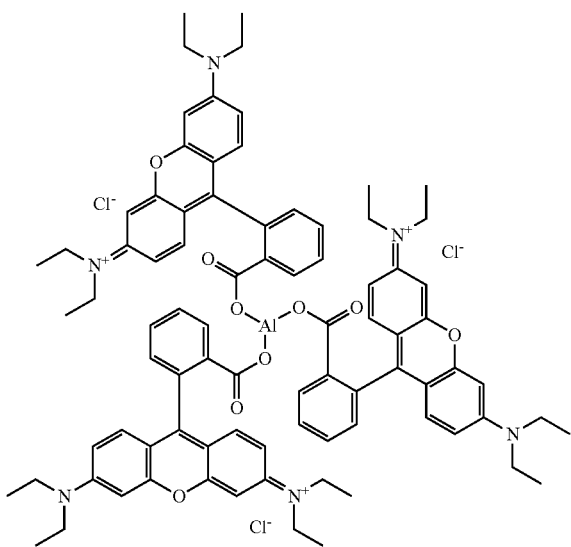
Pigment Red 174
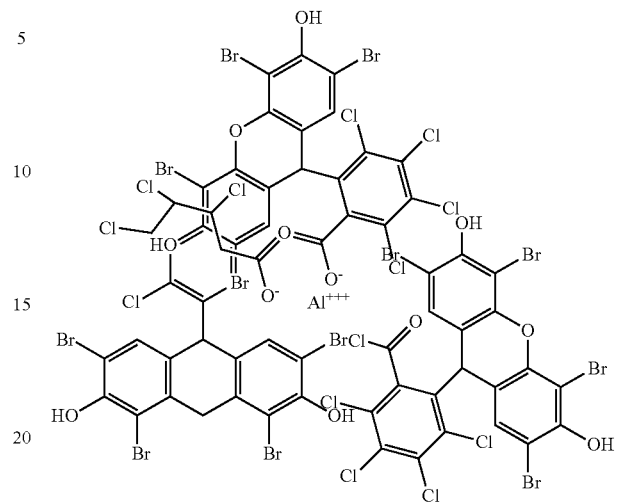
Pigment Red 175
Benzimidazolone-based monoazo
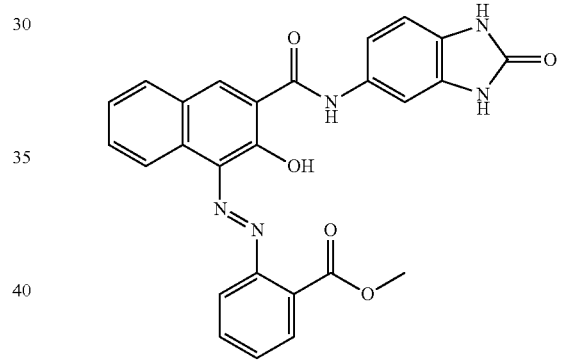
Pigment Red 176
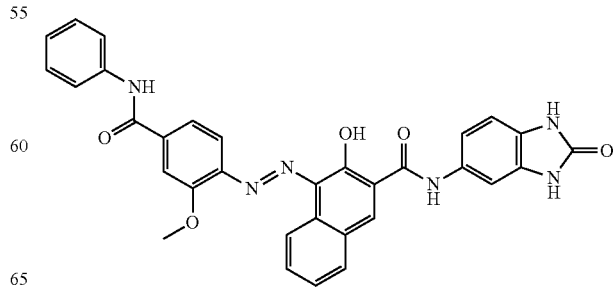

Pigment Red 177
Anthraquinone
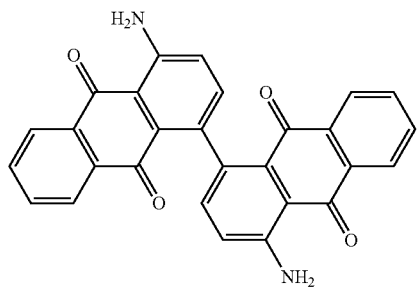 [SMILES: Nc1ccc(-c2ccc(N)c3c2C(=O)c2ccccc2C3=O)c2c1C(=O)c1ccccc1C2=O]
Pigment Red 178
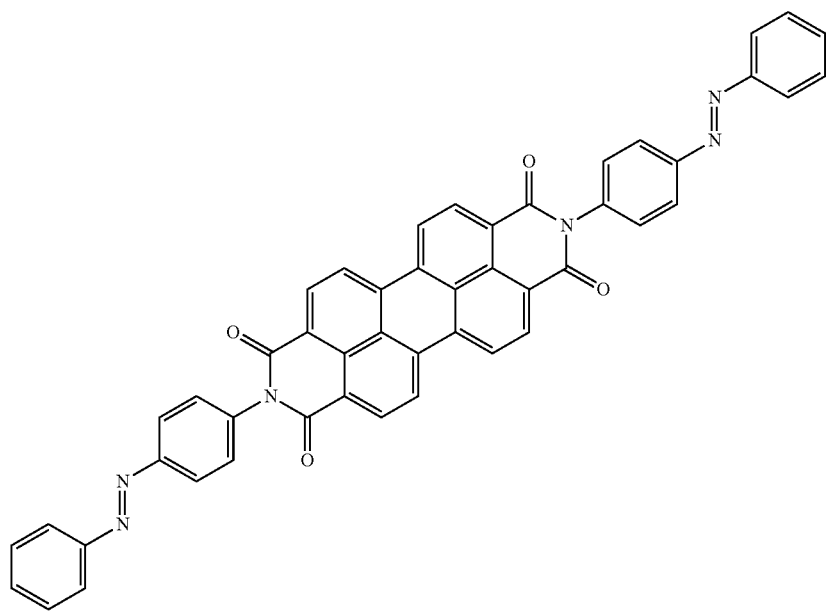 [SMILES: O=C1c2ccc3c4ccc5c6c(ccc(c7ccc(c2c37)C(=O)N1c1ccc(/N=N/c2ccccc2)cc1)c64)C(=O)N(c1ccc(/N=N/c2ccccc2)cc1)C5=O]
Pigment Red 179
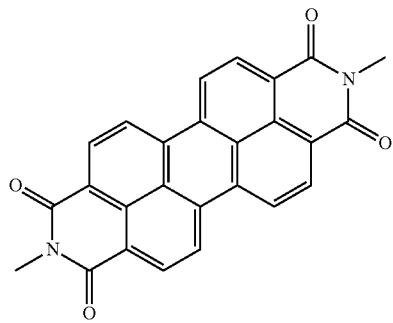 [SMILES: CN1C(=O)c2ccc3c4ccc5c6c(ccc(c7ccc(c2c37)C1=O)c64)C(=O)N(C)C5=O]
Pigment Red 181
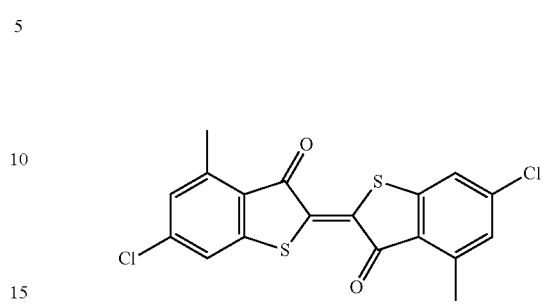
Pigment Red 184
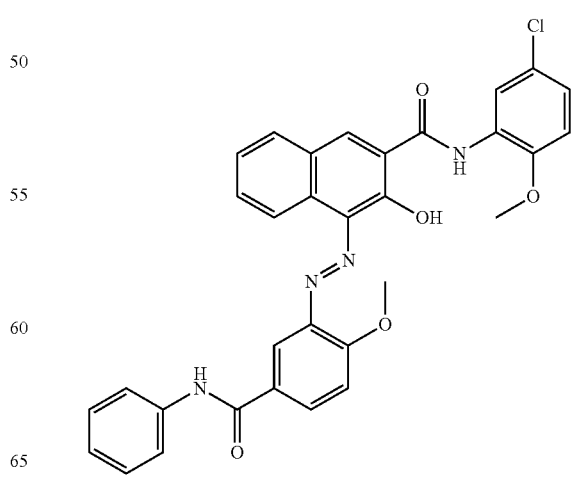

Pigment Red 185
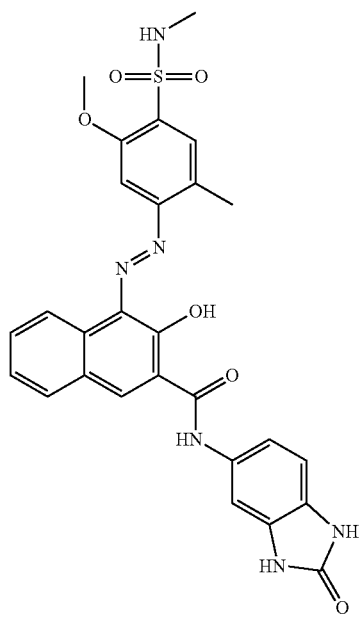 [SMILES: CNS(=O)(=O)c1cc(C)c(/N=N/c2c(O)c(C(=O)Nc3ccc4[nH]c(=O)[nH]c4c3)cc3ccccc23)cc1OC]
Pigment Red 190
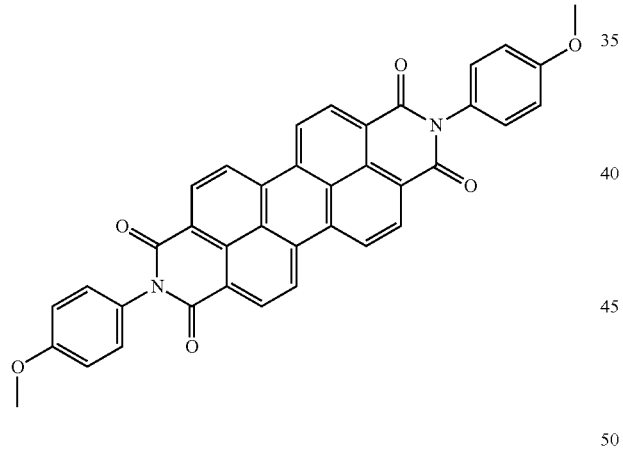
Pigment Red 195
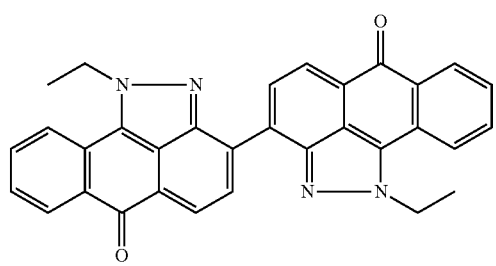 [SMILES: CCn1nc2c(-c3ccc4c5c(n(CC)nc35)-c3ccccc3C4=O)ccc3c2c1-c1ccccc1C3=O]
Pigment Red 200
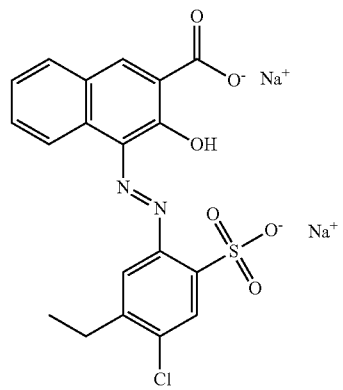 [SMILES: CCc1cc(/N=N/c2c(O)c(C(=O)[O-])cc3ccccc23)c(S(=O)(=O)[O-])cc1Cl ; [Na+] ; [Na+]]
Pigment Red 202
Quinacridone, Dichloroquinacridone, Quinacridone Magenta
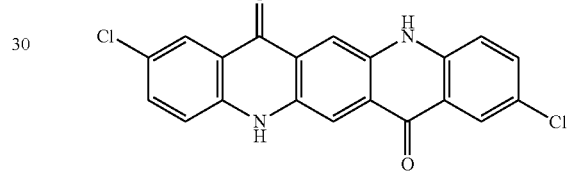
Pigment Red 206
Quinacridone, Quinacridone solid solution, Quinacridone Maroon
Pigment Red 207
Quinacridone, Quinacridone solid solution, Quinacridone Scarlet
Pigment Red 208
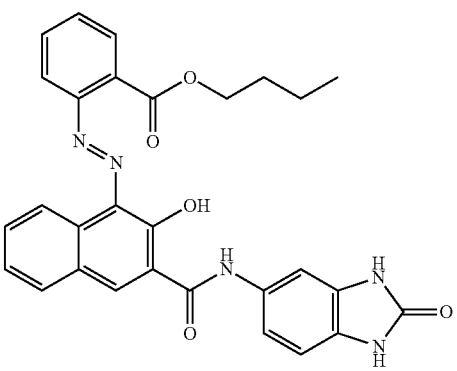 [SMILES: CCCCOC(=O)c1ccccc1/N=N/c1c(O)c(C(=O)Nc2ccc3[nH]c(=O)[nH]c3c2)cc2ccccc12]

Pigment Red 209
Quinacridone, Quinacridone Scarlet
Pigment Red 214
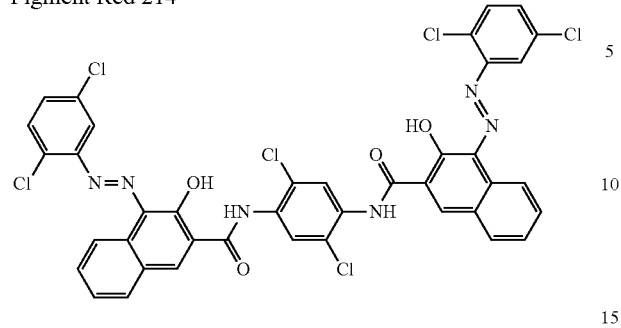
Pigment Red 216
Pyranthrone red
Pigment Red 221
Condensed diazo
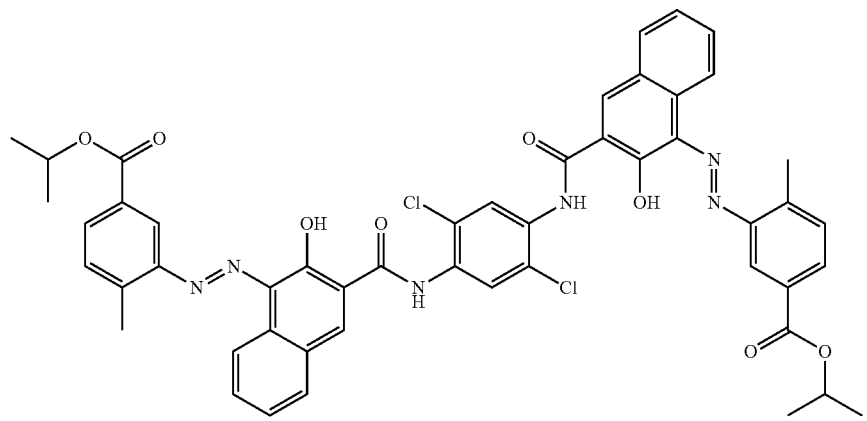 [SMILES: Cc1ccc(C(=O)OC(C)C)cc1/N=N/c1c(O)c(C(=O)Nc2cc(Cl)c(NC(=O)c3cc4ccccc4c(/N=N/c4cc(C(=O)OC(C)C)ccc4C)c3O)cc2Cl)cc2ccccc12]
Pigment Red 224
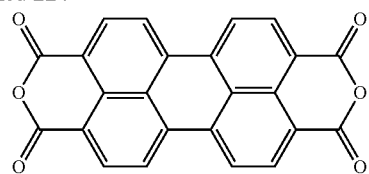 [SMILES: O=C1OC(=O)c2ccc3c4ccc5c6c(ccc(c7ccc1c2c73)c64)C(=O)OC5=O]
Pigment Red 225
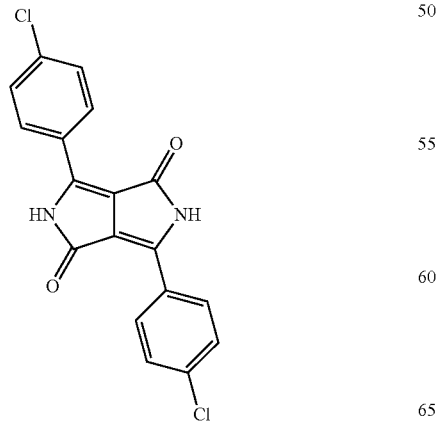

Pigment Red 242
Condensed diazo
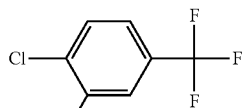
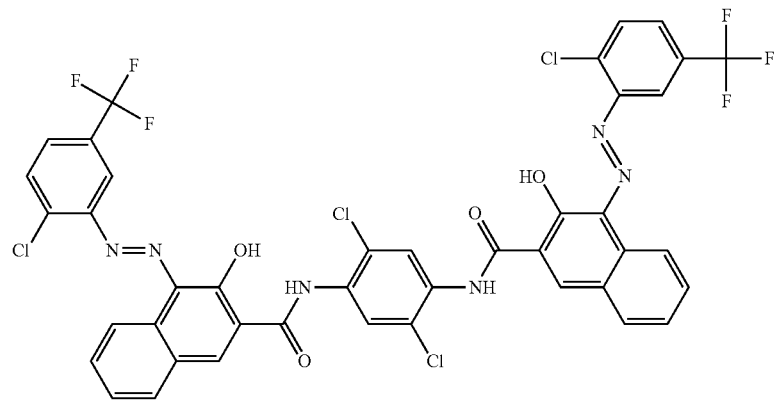 [SMILES: O=C(Nc1cc(Cl)c(NC(=O)c2cc3ccccc3c(/N=N/c3cc(C(F)(F)F)ccc3Cl)c2O)cc1Cl)c1cc2ccccc2c(/N=N/c2cc(C(F)(F)F)ccc2Cl)c1O]
Pigment Red 251
Pyrazoloquinazolone
Pigment Red 254
Chlorine-substituted diketopyrrolopyrrole, Diketopyrrolopyrrole, DPP
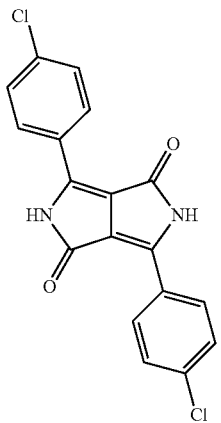 [SMILES: O=C1NC(c2ccc(Cl)cc2)=C2C(=O)NC(c3ccc(Cl)cc3)=C12]
Pigment Red 255
Unsubstituted diketopyrrolopyrrole, Diketopyrrolopyrrole, DPP
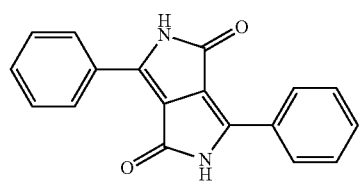 [SMILES: O=C1NC(c2ccccc2)=C2C(=O)NC(c3ccccc3)=C12]
Pigment Red 259
Ultramarine Pink
Pigment Red 264
Diketopyrrolopyrrole, DPP
Pigment Red 266
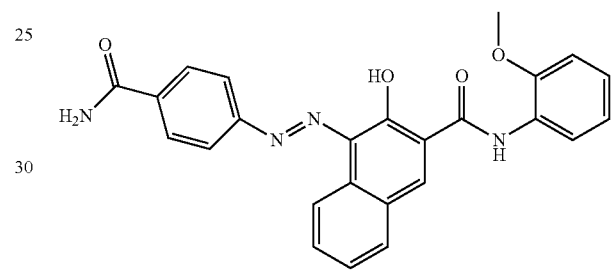
Pigment Red 268
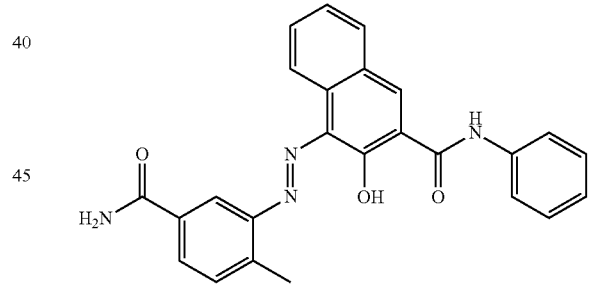
Pigment Red 269
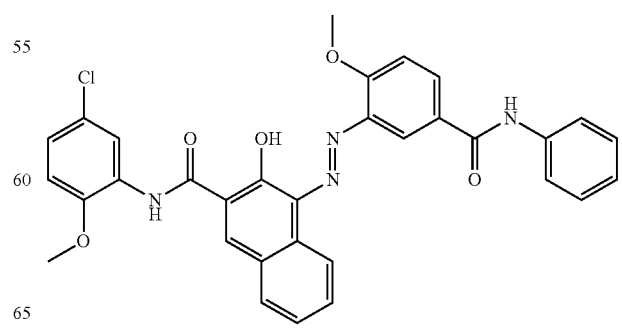

Pigment Yellow 1
Monoazo, Hansa yellow G

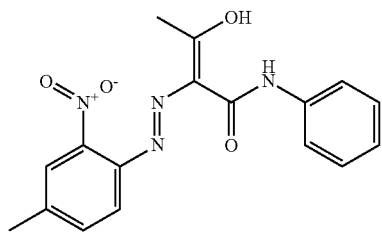

Pigment Yellow 3
Monoazo, Hansa yellow 10G
2-[(4-Chloro-2-nitrophenyl)azo]-N-(2-chlorophenyl)-3-oxobutanamide

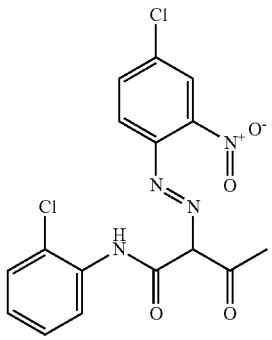

Pigment Yellow 4
2-[(4-Nitrophenyl)azo]-3-oxo-N-phenylbutanamide

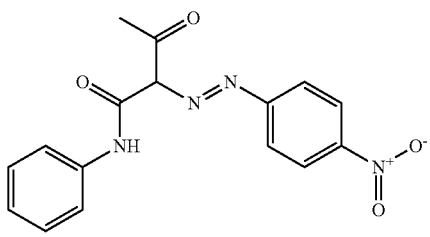 [SMILES: CC(=O)C(/N=N/c1ccc([N+](=O)[O-])cc1)C(=O)Nc1ccccc1]

Pigment Yellow 5
2-[(2-Nitrophenyl)azo]-3-oxo-N-phenylbutanamide

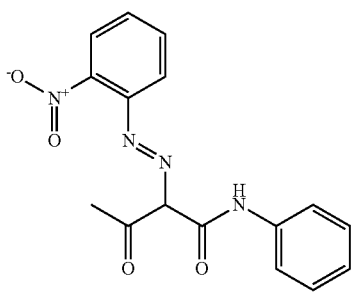

Pigment Yellow 6
Monoazo, Hansa yellow 10G
$C_{16}H_{13}ClN_4O_4$

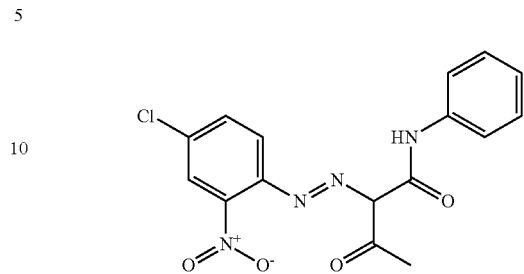

Pigment Yellow 14
Diazo, Diazo Yellow AAOT, Benzidine Yellow 5G, Benzidine Yellow

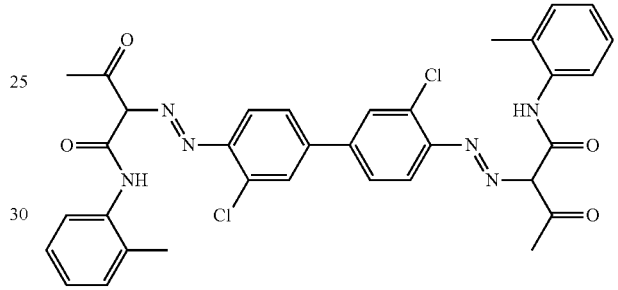

Pigment Yellow 17
Diazo, Diazo Yellow AAOA
4,4'-Bis[[1-(2-methoxyphenylamino)-1,3-dioxobutan-2-yl]azo]-3,3'-dichloro-1,1'-biphenyl

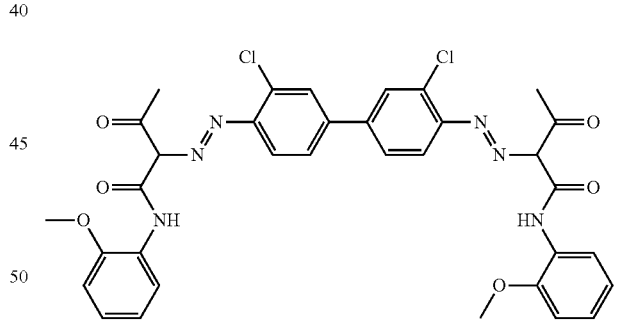

Pigment Yellow 24
Flavanthrone

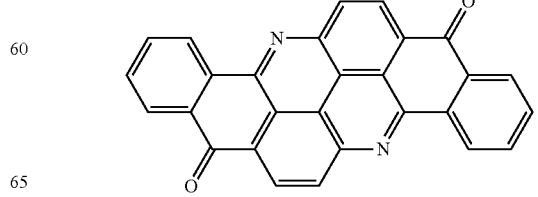

Pigment Yellow 55
Diazo, Pigment Yellow 2RN

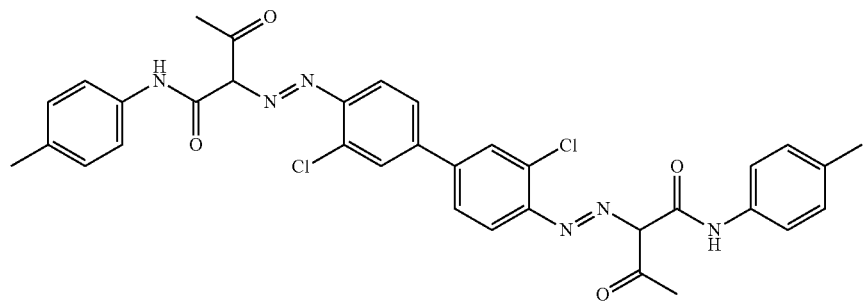

Pigment Yellow 60
4-[(2-Chlorophenyl)azo]-2,4-dihydro-5-methyl-2-phenyl-3H-pyrazol-3-one

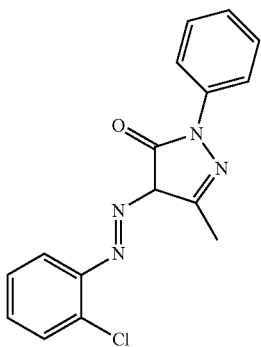 [SMILES: CC1=NN(c2ccccc2)C(=O)C1/N=N/c1ccccc1Cl]

Pigment Yellow 62
Bis[4-[[1-[[(2-methylphenyl)amino]carbonyl]-2-oxopropyl]azo]-3-nitrobenzenesulfonate]calcium

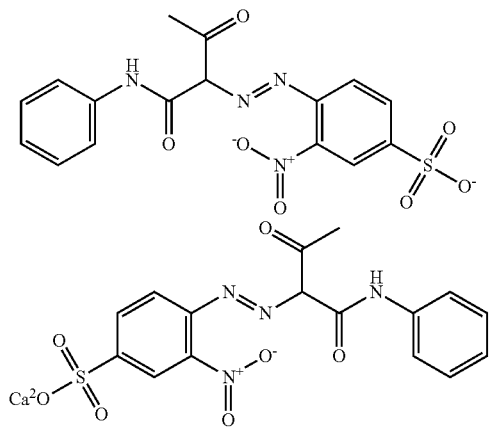

Pigment Yellow 63
4,4'-Bis[[1-(2-chlorophenylamino)-1,3-dioxobutan-2-yl]azo]-3,3'-dichloro-1,1'-biphenyl

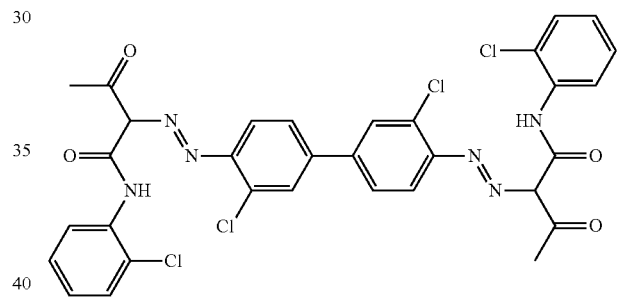

Pigment Yellow 64
Pigment Yellow 65
Monoazo
2-[(4-Methoxy-2-nitrophenyl)azo]-N-(2-methoxyphenyl)-3-oxobutanamide

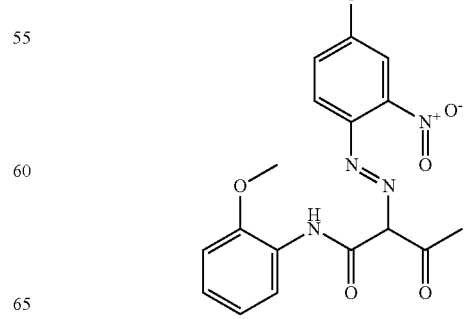

Pigment Yellow 73
Monoazo
2-[(4-Chloro-2-nitrophenyl)azo]-N-(2-methoxyphenyl)-3-oxobutanamide

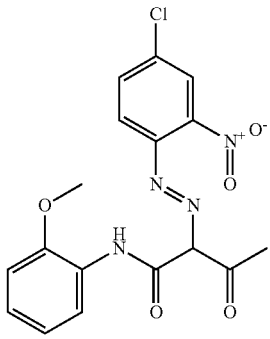

Pigment Yellow 74
Monoazo, Anisidine Yellow, Permanent Yellow GX
2-[(2-Methoxy-4-nitrophenyl)azo]-N-(2-methoxyphenyl)-3-oxobutanamide

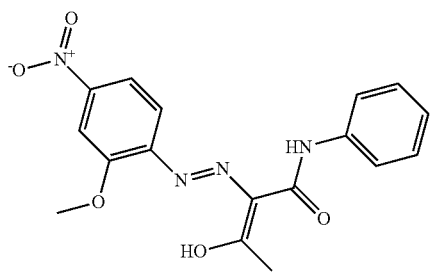

Pigment Yellow 75
N-(4-ethoxyphenyl)-2-[(4-chloro-2-nitrophenyl)azo]-3-oxobutanamide

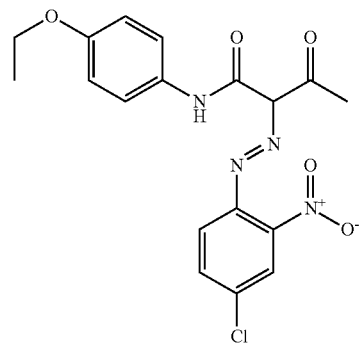 [SMILES: CCOc1ccc(NC(=O)C(/N=N/c2ccc(Cl)cc2[N+](=O)[O-])C(C)=O)cc1]

Pigment Yellow 81
Diazo
2,2'-[(2,2',5,5'-tetrachloro[1,1'-biphenyl]-4,4'-diyl)bis(azo)]bis[N-(2,4-dimethylphenyl)-3-oxobutanamide]

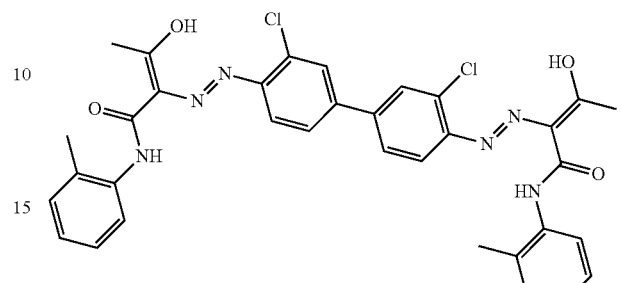

Pigment Yellow 83
Diazo, Benzidine Yellow
2,2'-[(3,3'-Dichloro-1,1'-biphenyl-4,4'-diyl)bis(azo)]bis[N-(4-chloro-2,5-dimethoxyphenyl)-3-oxobutanamide]

Pigment Yellow 93
3,3'-[(2-Chloro-5-methyl-1,4-phenylene)bis(imino)bis(1-acetyl-2-oxo-2,1-ethanediyl)bis(azo)]bis[4-chloro-N-(3-chloro-2-methylphenyl)benzamide]

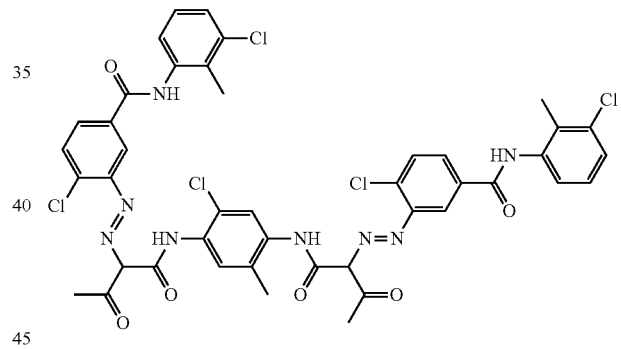

Pigment Yellow 94
3,3'-[(2,5-dichloro-1,4-phenylene)bis(imino)bis(1-acetyl-2-oxo-2,1-ethanediyl)bis(azo)]bis[4-chloro-N-(5-chloro-2-methylphenyl)benzamide]

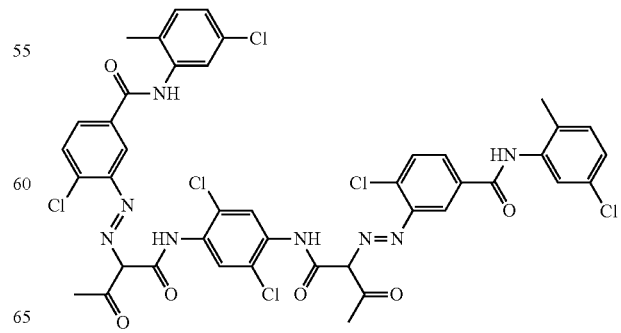

Pigment Yellow 95
Condensed diazo, Polyazo Yellow GR

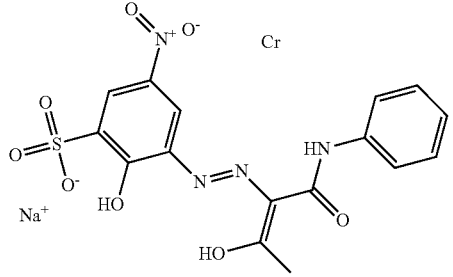

Pigment Yellow 97
Monoazo
N-(4-chloro-2,5-dimethoxyphenyl)-2-[[2,5-dimethoxy-4-[(phenylamino)sulfonyl]phenyl]azo]-3-oxobutanamide

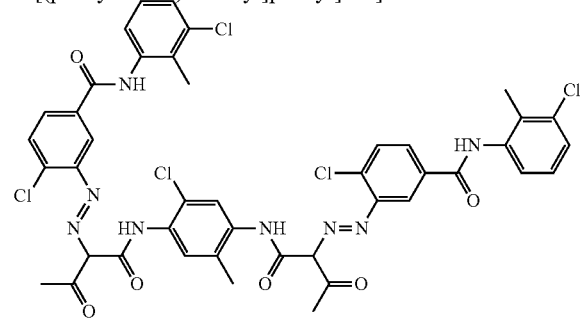 [SMILES: CC(=O)C(/N=N/c1cc(C(=O)Nc2cccc(Cl)c2C)ccc1Cl)C(=O)Nc1cc(Cl)c(NC(=O)C(/N=N/c2cc(C(=O)Nc3cccc(Cl)c3C)ccc2Cl)C(C)=O)cc1C]

Pigment Yellow 98
4'-Chloro-2'-methyl-a-(4-chloro-2-nitrophenylazo)acetanilide

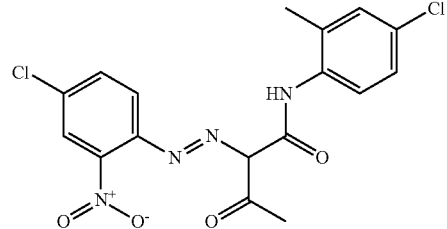 [SMILES: CC(=O)C(/N=N/c1ccc(Cl)cc1[N+](=O)[O-])C(=O)Nc1ccc(Cl)cc1C]

Pigment Yellow 99
Anthraquinone
Pigment Yellow 100
Tartrazine Yellow, Lake-type pyrazolone

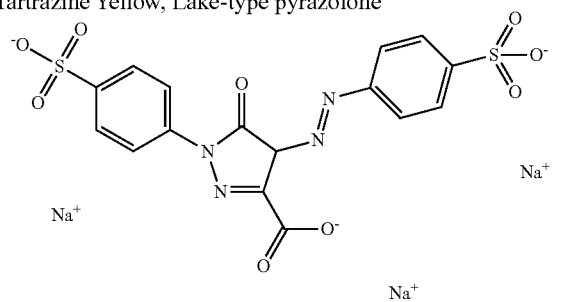

Pigment Yellow 101
1,2-Bis(2-hydroxynaphthalen-1-ylmethylene)hydrazine

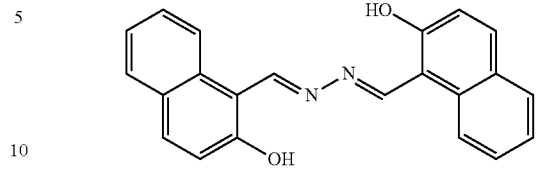

Pigment Yellow 104
5-[(4-Sulfophenyl)azo]-6-hydroxy-2-naphthalenesulfonic acid/aluminum (3:2)

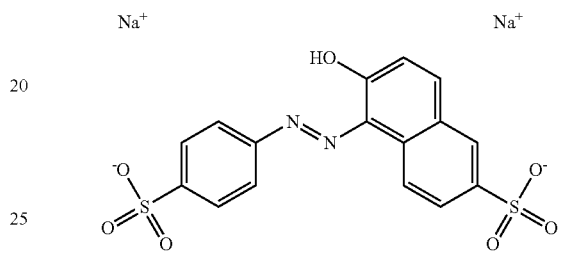

Pigment Yellow 108
Anthrapyrimidin
Pigment Yellow 109
Isoindolinone, Pigment Yellow 2GLT 3,3'-[(2-Methyl-1,3-phenylene)diimino]bis[4,5,6,7-tetrachloro-1H-isoindol-1-one]

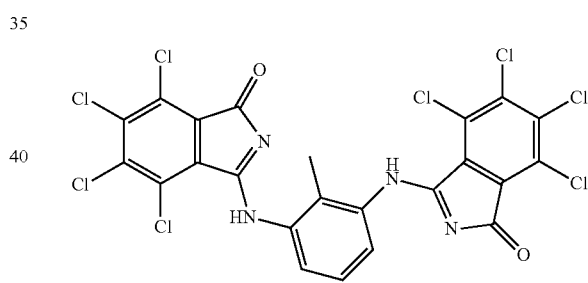

Pigment Yellow 110
Isoindolinone
4,5,6,7-Tetrachloro-3-[[4-[(1-oxo-4,5,6,7-tetrachloro-2H-isoindol-3-ylidene)amino]phenyl]imino]-2H-isoindol-1(3H)-one

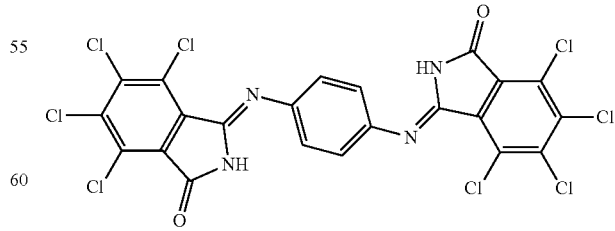

Pigment Yellow 111
Monoazo, Monoazo Yellow 7G
Pigment Yellow 117
Azomethine, Copper Azomethine Yellow, Greenish Yellow Pigment Yellow 120
Benzimidazolone-based monoazo Pigment Yellow 121
4,4'-Bis[[1-(2-chlorophenylamino)-1,3-dioxobutan-2-yl]azo]-3,3'-dichloro-1,1'-biphenyl

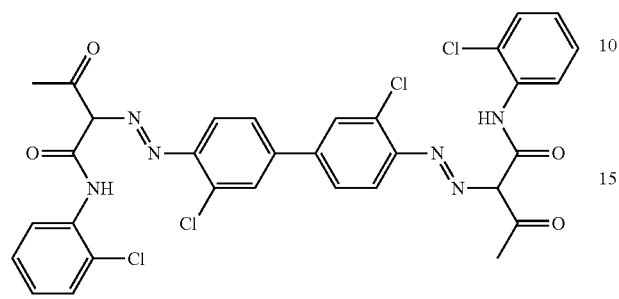

Pigment Yellow 122
4,4'-Bis[[1-(2,4-dimethylphenylamino)-1,3-dioxobutane-2-yl]azo]-3,3'-dichloro-1,1'-biphenyl Pigment Yellow 138
Quinophthalone

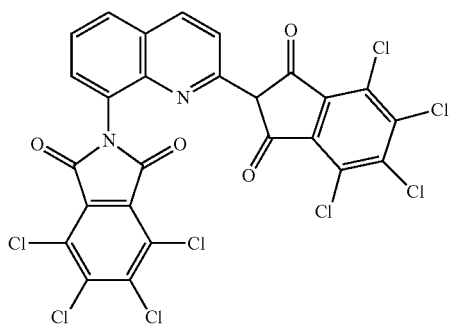 [SMILES: O=C1c2c(Cl)c(Cl)c(Cl)c(Cl)c2C(=O)C1c1ccc2cccc(N3C(=O)c4c(Cl)c(Cl)c(Cl)c(Cl)c4C3=O)c2n1]

Pigment Yellow 139
Isoindoline

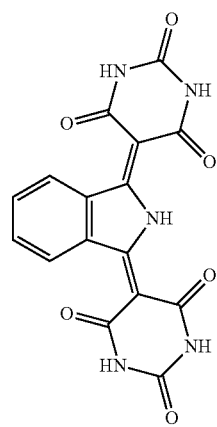 [SMILES: O=C1NC(=O)C(=c2[nH]c(=C3C(=O)NC(=O)NC3=O)c3ccccc23)C(=O)N1]

Pigment Yellow 142
$C_{17}H_{12}CaN_4O_6S$

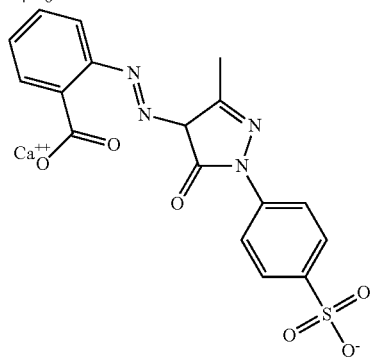

Pigment Yellow 147
$C_{37}H_{21}N_5O_4$

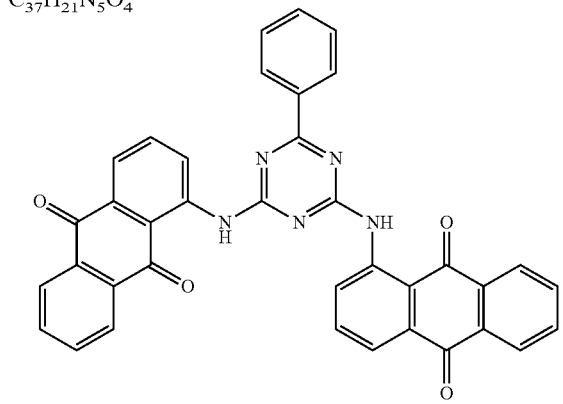

Pigment Yellow 148
$C_{39}H_{23}N_3O_2$

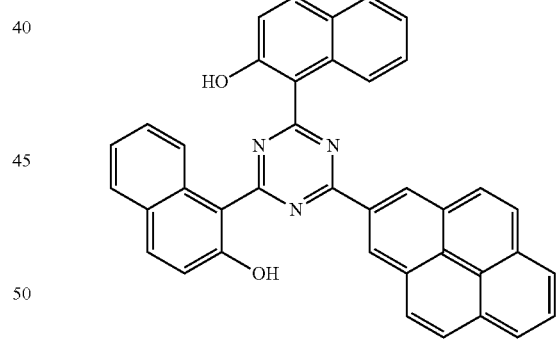

Pigment Yellow 150
Azomethine, Nickel complex salt-based azo

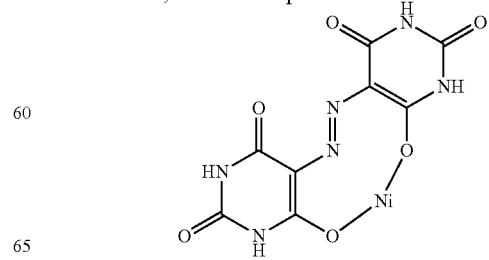

Pigment Yellow 151
Benzimidazolone-based monoazo
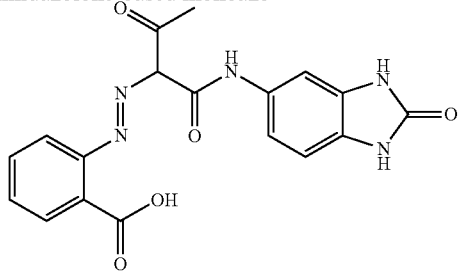 [SMILES: CC(=O)C(/N=N/c1ccccc1C(=O)O)C(=O)Nc1ccc2[nH]c(=O)[nH]c2c1]
Pigment Yellow 152
Diazo
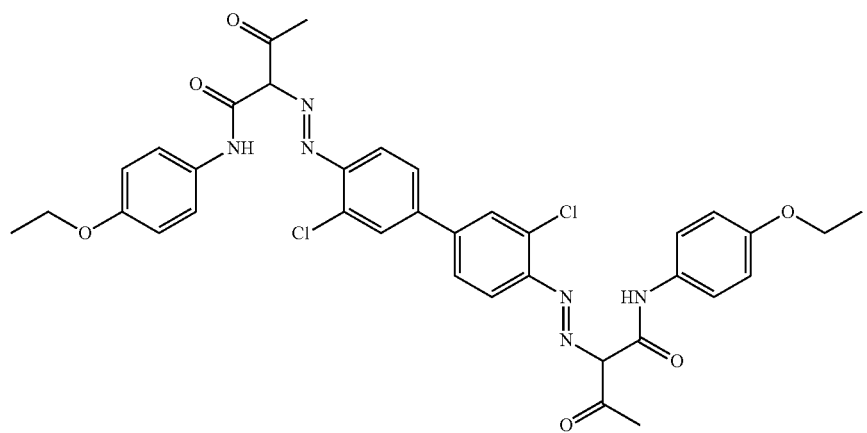 [SMILES: CCOc1ccc(NC(=O)C(/N=N/c2ccc(-c3ccc(/N=N/C(C(C)=O)C(=O)Nc4ccc(OCC)cc4)c(Cl)c3)cc2Cl)C(C)=O)cc1]
Pigment Yellow 154
Benzimidazolone-based monoazo
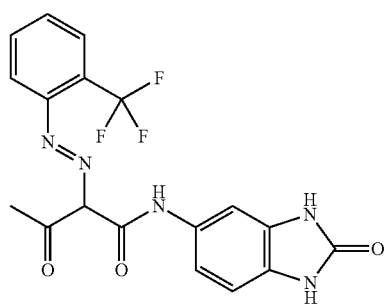 [SMILES: CC(=O)C(/N=N/c1ccccc1C(F)(F)F)C(=O)Nc1ccc2[nH]c(=O)[nH]c2c1]
Pigment Yellow 168
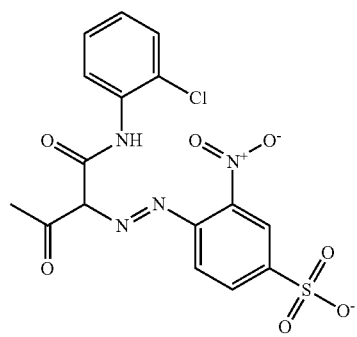
Pigment Yellow 155
Diazo
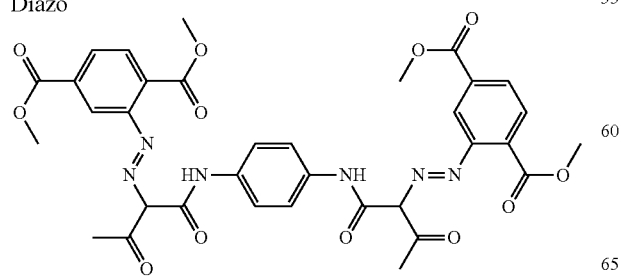
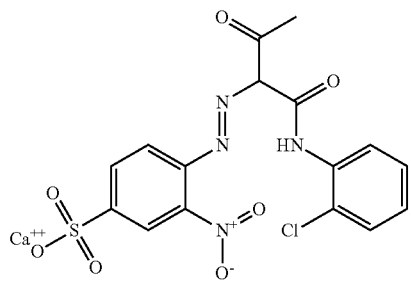

Pigment Yellow 170
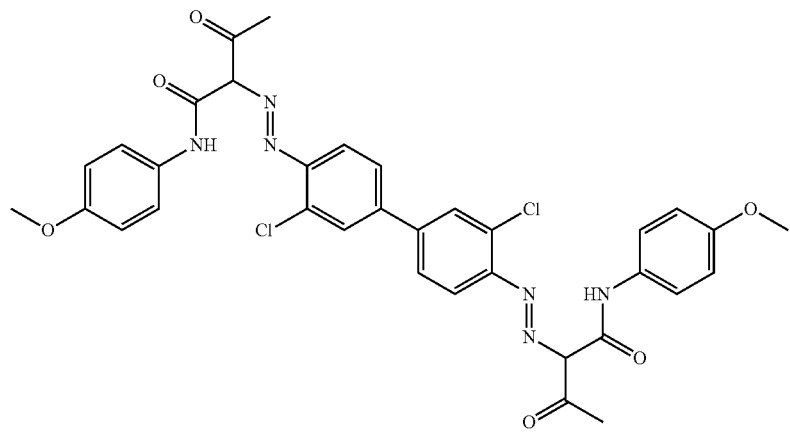
Pigment Yellow 174
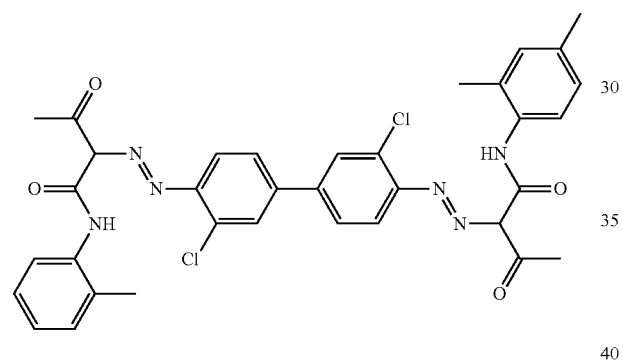
Pigment Yellow 175
Benzimidazolone-based monoazo
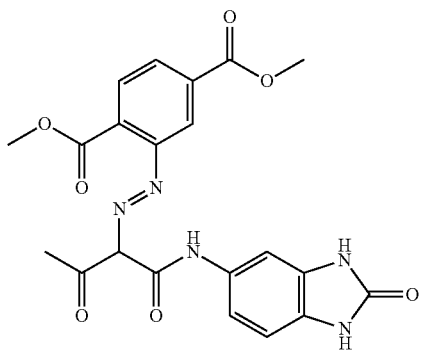 [SMILES: COC(=O)c1ccc(C(=O)OC)c(/N=N/C(C(C)=O)C(=O)Nc2ccc3[nH]c(=O)[nH]c3c2)c1]
Pigment Yellow 180
Benzimidazolone-based diazo
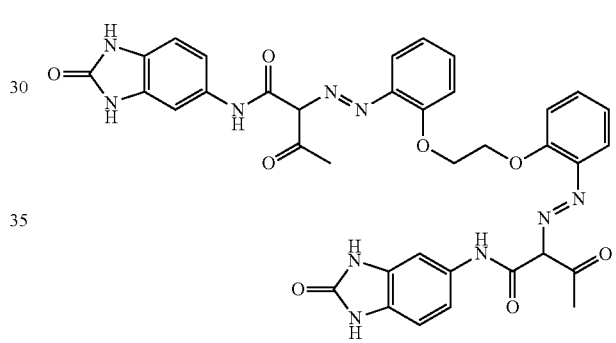
Pigment Yellow 181
Benzimidazolone-based monoazo
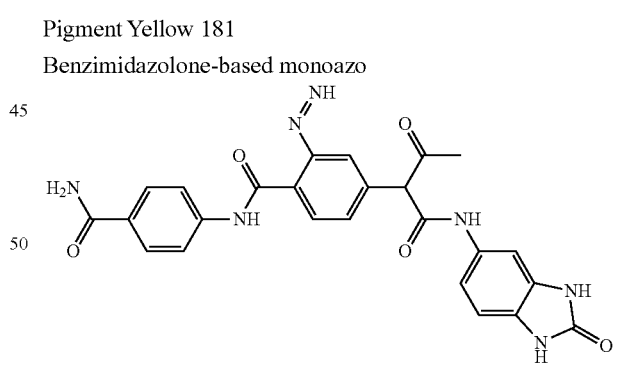
Pigment Yellow 183
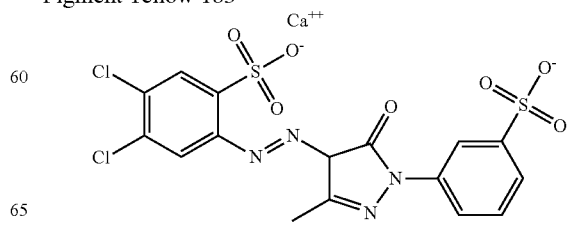

Pigment Yellow 184
Bismuth vanadate
Pigment Yellow 185

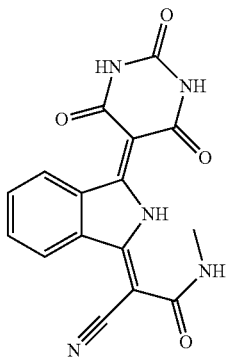 [SMILES: CNC(=O)/C(C#N)=c1\[nH]c(=C2C(=O)NC(=O)NC2=O)c2ccccc12]

Pigment Yellow 186
Pigment Yellow 187
Pigment Yellow 188

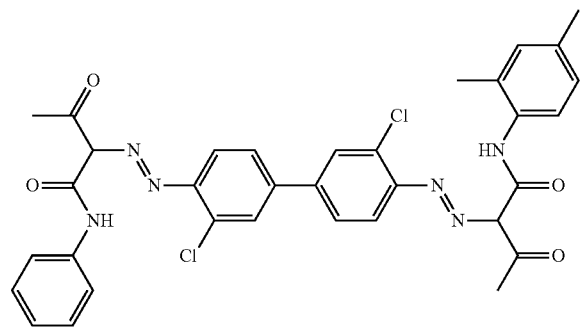 [SMILES: CC(=O)C(/N=N/c1ccc(-c2ccc(/N=N/C(C(C)=O)C(=O)Nc3ccc(C)cc3C)c(Cl)c2)cc1Cl)C(=O)Nc1ccccc1]

Pigment Yellow 193

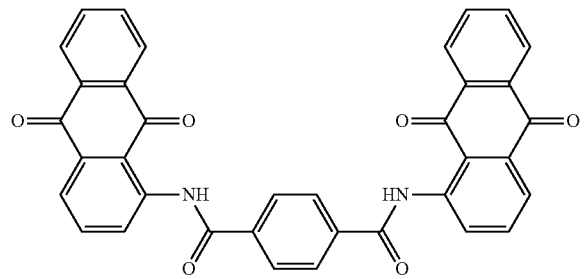 [SMILES: O=C(Nc1cccc2c1C(=O)c1ccccc1C2=O)c1ccc(C(=O)Nc2cccc3c2C(=O)c2ccccc2C3=O)cc1]

Pigment Yellow 194

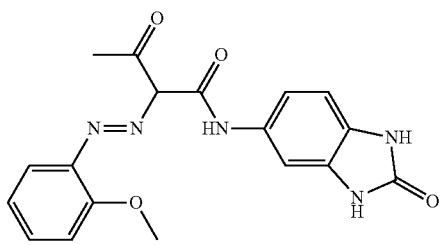 [SMILES: COc1ccccc1/N=N/C(C(C)=O)C(=O)Nc1ccc2[nH]c(=O)[nH]c2c1]

If necessary, an intermediate layer is provided between the first electrode 11 and the organic photoelectric conversion layer 13 and/or between the second electrode 12 and the organic photoelectric conversion layer 13. It is important that electrons and positive holes generated by photoelectric conversion be efficiently transported to the first electrode 11 or the second electrode 12, and therefore, a transport layer other than an injection layer may sometimes be formed in the intermediate layer. Further, a technique in which an electric barrier like a band diagram is formed in the intermediate layer other than a layer having a function to assist the movement of electrons and positive holes so as to prevent the leakage of current may sometimes be used. In the case of stopping positive holes, the barrier may sometimes be called "positive hole barrier", and in the case of stopping electrons, the barrier may sometimes be called "electron barrier".

[Method for Producing Polarization Organic Photoelectric Conversion Device]

A method for producing the polarization organic photoelectric conversion device according to this embodiment will be described.

First, as shown in FIG. 1A, on the first electrode 11, the organic photoelectric conversion layer 13 uniaxially oriented in a given direction is formed. The uniaxially oriented organic photoelectric conversion layer 13 may be one formed directly on the first electrode 11, or one obtained by forming an organic photoelectric conversion layer which is not uniaxially oriented on the first electrode 11 and thereafter uniaxially orienting the organic photoelectric conversion layer, or one obtained by forming a uniaxially oriented organic photoelectric conversion layer 13 on a substrate and thereafter transferring the organic photoelectric conversion layer 13 from the substrate onto the first electrode 11. As a method in which after forming an organic photoelectric conversion layer which is not uniaxially oriented, the organic photoelectric conversion layer is uniaxially oriented, a method in which a surface of the organic photoelectric conversion layer is subjected to a rubbing treatment using a rubbing cloth or a photo orientation treatment can be used. As described above, by subjecting the organic photoelectric conversion layer 13 to a uniaxial orientation treatment, or using the organic photoelectric conversion layer 13 which has been uniaxially oriented from the beginning, a high uniaxial orientation property is achieved. The uniaxially oriented organic photoelectric conversion layer 13 can also be formed by inorganic vapor deposition orientation. As a method for forming an organic photoelectric conversion layer which is not uniaxially oriented, for example, a known method such as a sputtering method, a vacuum vapor deposition method, a chemical vapor deposition (CVD) method, a coating method, or a printing method can be used, and the method is selected as needed. A specific method for forming the organic photoelectric conversion layer 13 using an organic dye is as follows. First, the surface of the first electrode 11 is cleaned. Subsequently, on the first electrode 11, organic dye molecules are sublimated from an evaporation source heated by resistance heating, lamp heating, electron beam heating, high-frequency induction heating, laser heating, or the like at a pressure of, for example, $1 \times 10^{-3}$ Pa or less, preferably $1 \times 10^{-4}$ Pa or less, more preferably $1 \times 10^{-5}$ Pa or less to deposit the molecules, whereby the organic photoelectric conversion layer 13 composed of the organic dye is formed. As the sublimation temperature, by selecting a high temperature within a range in which the organic dye molecules are thermally stable, a high film forming speed is achieved. Further, by controlling the sublimation temperature, the film forming speed can be controlled. When forming the above-described intermediate layer between the first electrode 11 or the second electrode 12 and the organic photoelectric conversion layer 13, in the formation of the intermediate layer, other than the above-described heating vapor deposition methods, a CVD method, a coating method, or the like may be used.

Subsequently, on the organic photoelectric conversion layer 13, a second electrode 12 is formed. As a method for forming the second electrode 12, for example, a known method such as a sputtering method, a vacuum vapor deposition method, a chemical vapor deposition (CVD) method, a coating method, or a printing method can be used, and the method is appropriately selected depending on the stability, heat resistance, or the like of the organic photoelectric conversion layer 13. The second electrode may be formed by transferring one formed on another substrate onto the organic photoelectric conversion layer 13.

As described above, a desired polarization organic photoelectric conversion device is produced.

[Operation of Polarization Organic Photoelectric Conversion Device]

For example, the first electrode 11 of the polarization organic photoelectric conversion device is used as a biasing electrode, and the second electrode 12 thereof is used as a ground electrode (potential=0), and a bias voltage is applied to the first electrode 11. For example, the second electrode 12 is formed to be transparent. When light is incident on the side of the second electrode 12 of the polarization organic photoelectric conversion device in such a state, the light transmits through the second electrode 12 and is incident on the organic photoelectric conversion layer 13. At this time, among the incident light, only a polarized light component in the direction parallel to the orientation axis of the organic photoelectric conversion layer 13 is photoelectrically converted by the organic photoelectric conversion layer 13. That is, due to the light incident on the organic photoelectric conversion layer 13, electrons and positive holes are generated, among which the electrons move toward the second electrode 12, and the positive holes move toward the first electrode 11, and the electrons and the positive holes are captured there, respectively. As a result, when an external circuit is connected between the first electrode 11 and the second electrode 12, a photocurrent flows through the external circuit. By measuring this photocurrent, a polarized light component in the direction parallel to the orientation axis of the organic photoelectric conversion layer 13 among the light incident on the polarization organic photoelectric conversion device can be detected. At this time, a photocurrent is obtained in accordance with the polarization state and wavelength of the light incident on the organic photoelectric conversion layer 13.

EXAMPLE 1

A first electrode 11 was formed by forming an ITO film having a thickness of 100 nm on a glass substrate by a sputtering method.

After a quinacridone film having a thickness of 100 nm was formed on the first electrode 11 by a vacuum vapor deposition method, a sample was taken out of a vacuum chamber of a vacuum vapor deposition device. Subsequently, the surface of the quinacridone film was subjected to a uniaxial orientation treatment by sliding the quinacridone film once using about 0.5 mm-long fiber tips of rayon to give a depth of about 0.2 mm, whereby an organic photoelectric conversion layer 13 composed of a uniaxially oriented quinacridone film was formed.

Subsequently, an Al film having a thickness of 100 nm was formed on the organic photoelectric conversion layer 13 by a vacuum vapor deposition method, whereby the second electrode 12 was formed.

As described above, a polarization organic photoelectric conversion device was produced.

Figure 2:
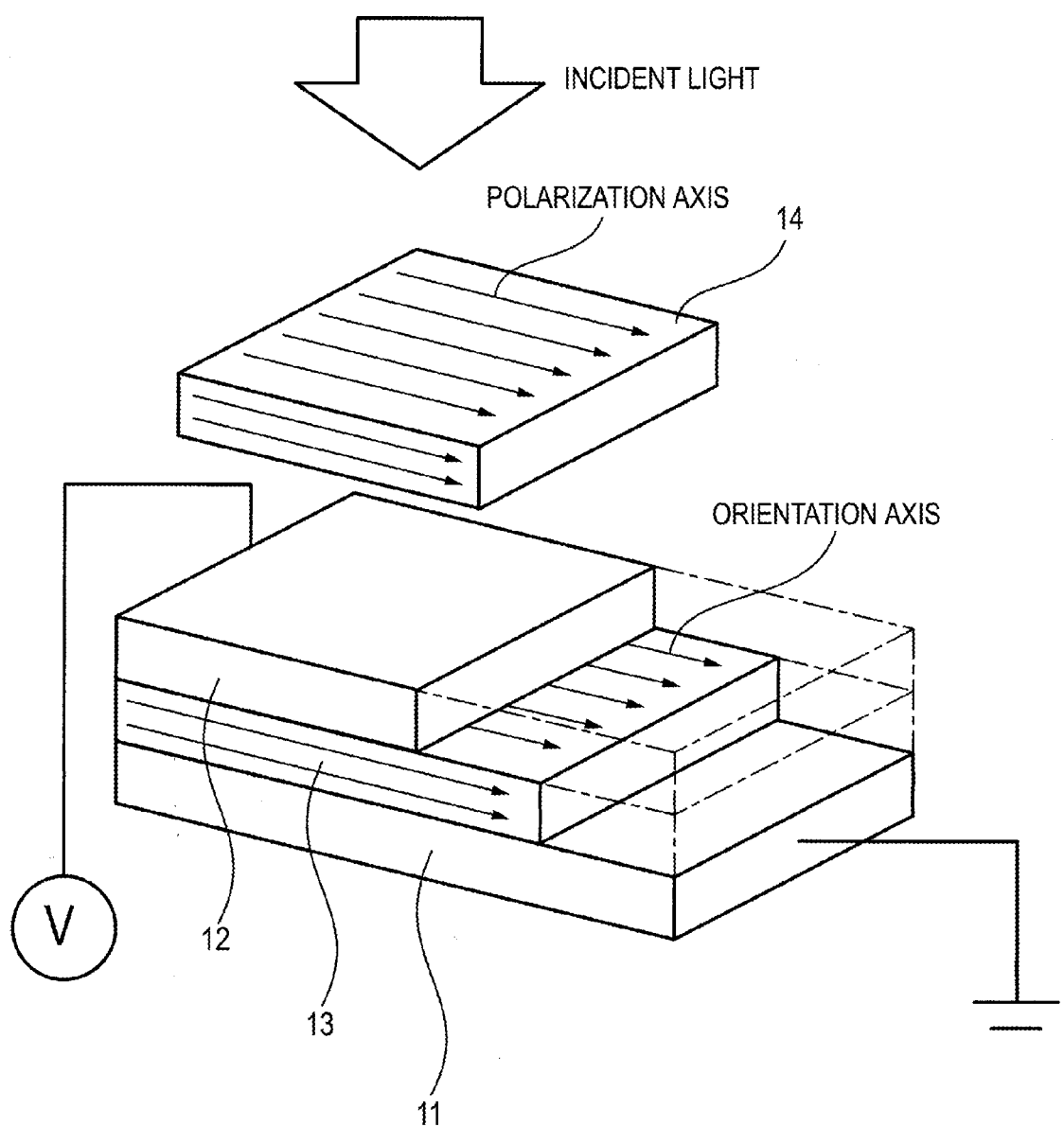
FIG. 2 is a schematic diagram showing a manner in which polarized light parallel to the orientation axis of the organic photoelectric conversion layer is incident on the polarization organic photoelectric conversion device according to the first embodiment.
Figure 3:
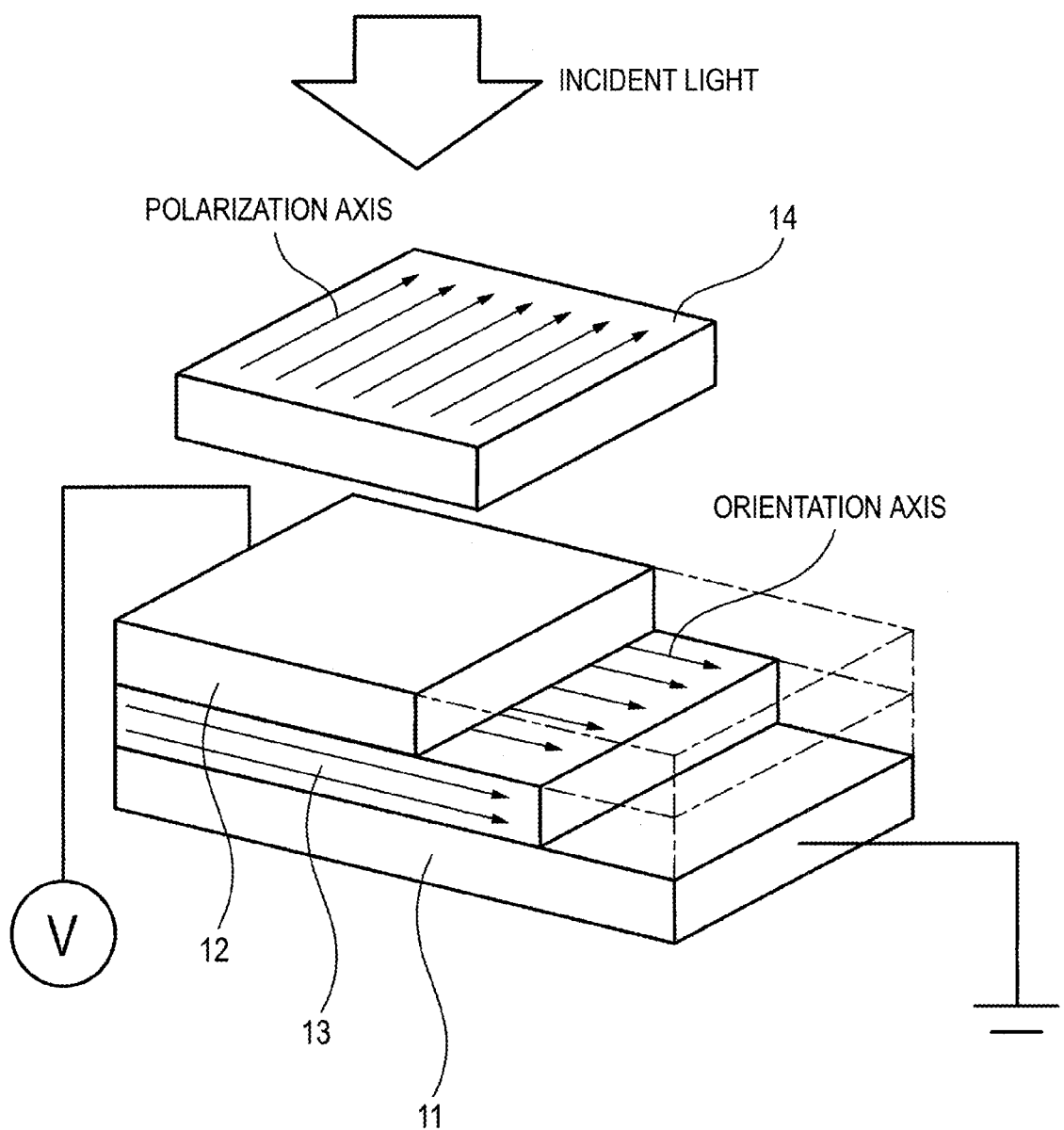
FIG. 3 is a schematic diagram showing a manner in which polarized light orthogonal to the orientation axis of the organic photoelectric conversion layer is incident on the polarization organic photoelectric conversion device according to the first embodiment.
Figure 4:
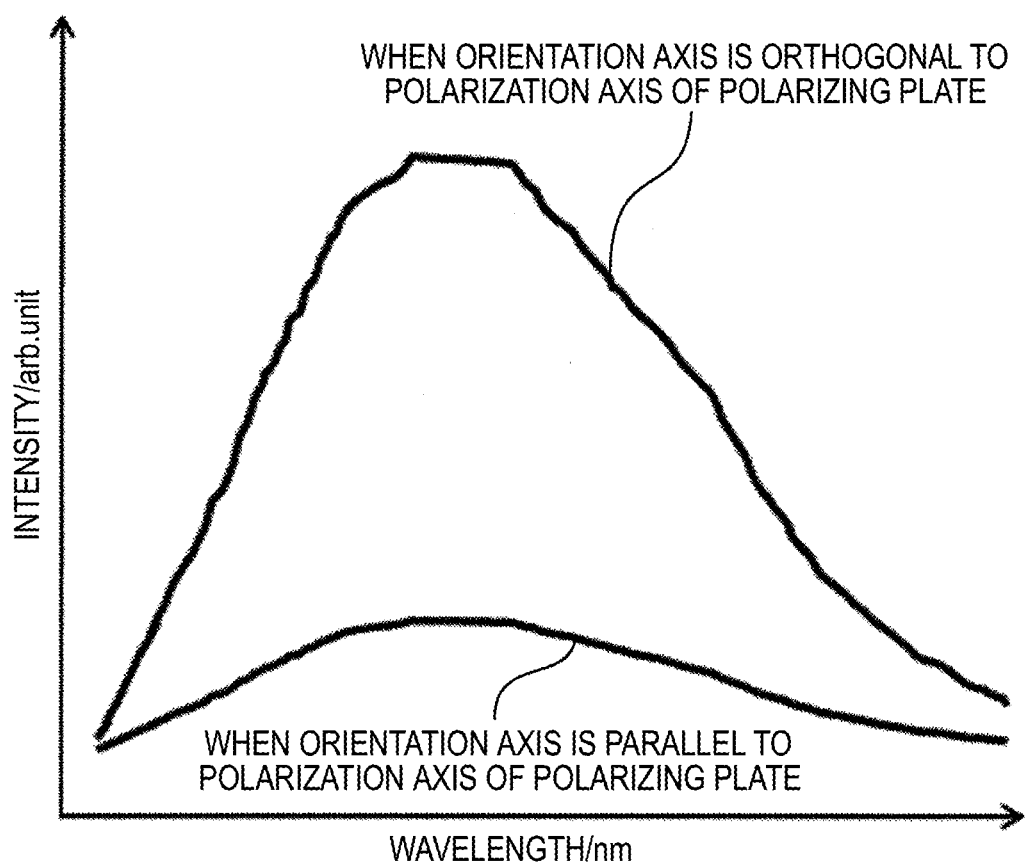
FIG. 4 is a graph showing the results of measuring photocurrents obtained when polarized light parallel and orthogonal to the orientation axis of the organic photoelectric conversion layer is incident on the polarization organic photoelectric conversion device according to the first embodiment.

Photoelectric conversion characteristics were measured for the case where the polarization direction of the light incident on the polarization organic photoelectric conversion device is parallel to the orientation axis (optical axis) of the organic photoelectric conversion layer 13 and for the case where it is orthogonal thereto. The measurement in the former case is performed as follows. As shown in FIG. 2, a polarizing plate 14 is disposed on the side of the second electrode 12 such that the polarization axis thereof is parallel to the orientation axis of the organic photoelectric conversion layer 13, and light is allowed to enter from above the polarizing plate 14, thereby obtaining polarized light parallel to the orientation axis of the organic photoelectric conversion layer 13, and the obtained polarized light is allowed to enter the organic photoelectric conversion layer 13. The measurement in the latter case is performed as follows. As shown in FIG. 3, a polarizing plate 14 is disposed on the side of the second electrode 12 such that the polarization axis thereof is orthogonal to the orientation axis of the organic photoelectric conversion layer 13, and light is allowed to enter from above the polarizing plate 14, thereby obtaining polarized light orthogonal to the orientation axis of the organic photoelectric conversion layer 13, and the obtained polarized light is allowed to enter the organic photoelectric conversion layer 13. A characteristic evaluation was performed by taking a photoelectric conversion current value for wavelength dispersion was taken as an intensity when the potential of the first electrode 11 was set to 0, and a voltage of +5 V was applied to the second electrode 12, and the intensity of incident light was set to 100 µW/cm$^2$. The measurement results are shown in FIG. 4. As shown in FIG. 4, a difference in photoelectric conversion current value was observed between the case where the polarization axis of the polarizing plate 14 is parallel to the orientation axis of the organic photoelectric conversion layer 13 and the case where it is orthogonal thereto, and it is found that a characteristic of uniaxially oriented light is obtained. It is shown that by using this characteristic, even if the polarizing plate 14 is not used, the direction of polarized light can be selected.

As described above, according to the first embodiment, the uniaxial orientation property of the organic photoelectric conversion layer 13 is high, and therefore, a high polarization property can be obtained. Due to this, a polarization organic photoelectric conversion device having high sensitivity to polarized light can be realized. The polarization organic photoelectric conversion device according to this embodiment does not have to use a polarizing plate, and therefore, the loss of the amount of incident light caused by a polarizing plate is avoided, and the amount of incident light can be fully used. Further, the polarization organic photoelectric conversion device is formed integrally, and therefore can be configured to be small and simple. The polarization organic photoelectric conversion device according to this embodiment is suitable for being applied to, for example, a polarization organic imaging device.

<2. Second Embodiment>

[Method for Producing Polarization Organic Photoelectric Conversion Device]

On a first electrode 11, an organic photoelectric conversion layer 13 is formed by a solution growth process as shown below. As the solution growth process, there are a solution temperature control type and a vapor pressure control type.

[Formation of Organic Photoelectric Conversion Layer 13 by Solution Temperature Control Type Solution Growth Process]

Figure 5:
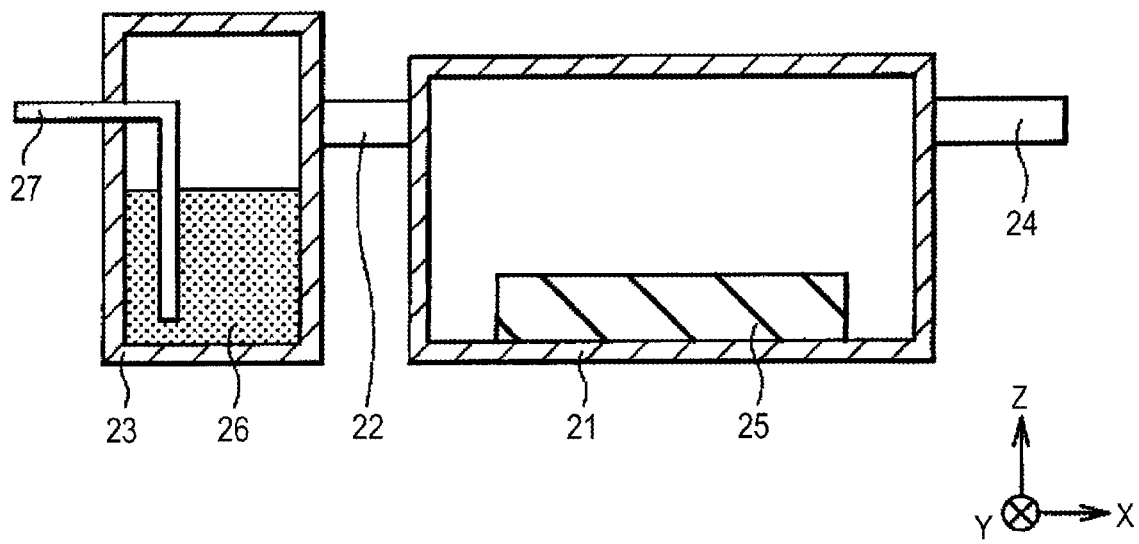
FIG. 5 is a schematic diagram showing a film forming device to be used in a method for producing a polarization organic photoelectric conversion device according to a second embodiment.

FIG. 5 shows a film forming device to be used for forming the organic photoelectric conversion layer 13. As shown in FIG. 5, the film forming device is provided with a chamber 21 and a solvent tank 23 connected to this chamber 21 through a connecting pipe 22. The chamber 21 can be airtightly sealed in a state of being connected to the solvent tank 23. The chamber 21 is provided with an exhaust pipe 24. In the chamber 21, a temperature controllable holder 25 is provided, and on the holder 25, the first electrode 11 is placed as a base body for forming a film.

In the solvent tank 23, an auxiliary solvent 26 of the same type as a solvent in an organic solution (a solution obtained by dissolving an organic photoelectric conversion material in a solvent) to be used for forming the organic photoelectric conversion layer 13 is reserved. The temperature of the auxiliary solvent 26 can be adjusted by a heating unit such as an oil bath (not shown). Into the auxiliary solvent 26, gas can be introduced through a gas inlet pipe 27 inserted from the outside of the solvent tank 23 into the inside. The solvent tank 23 is configured such that vapor including the vapor of the auxiliary solvent 26 can be supplied to the chamber 21 through the connecting pipe 22. According to this configuration, depending on the temperature of the auxiliary solvent 26, the surrounding environment of the organic solution, i.e., the pressure of the vapor (vapor pressure) P in the inside of the chamber 21 is controlled. The vapor supplied to the chamber 21 can be exhausted to the outside through the exhaust pipe 24 as needed.

Figure 6:
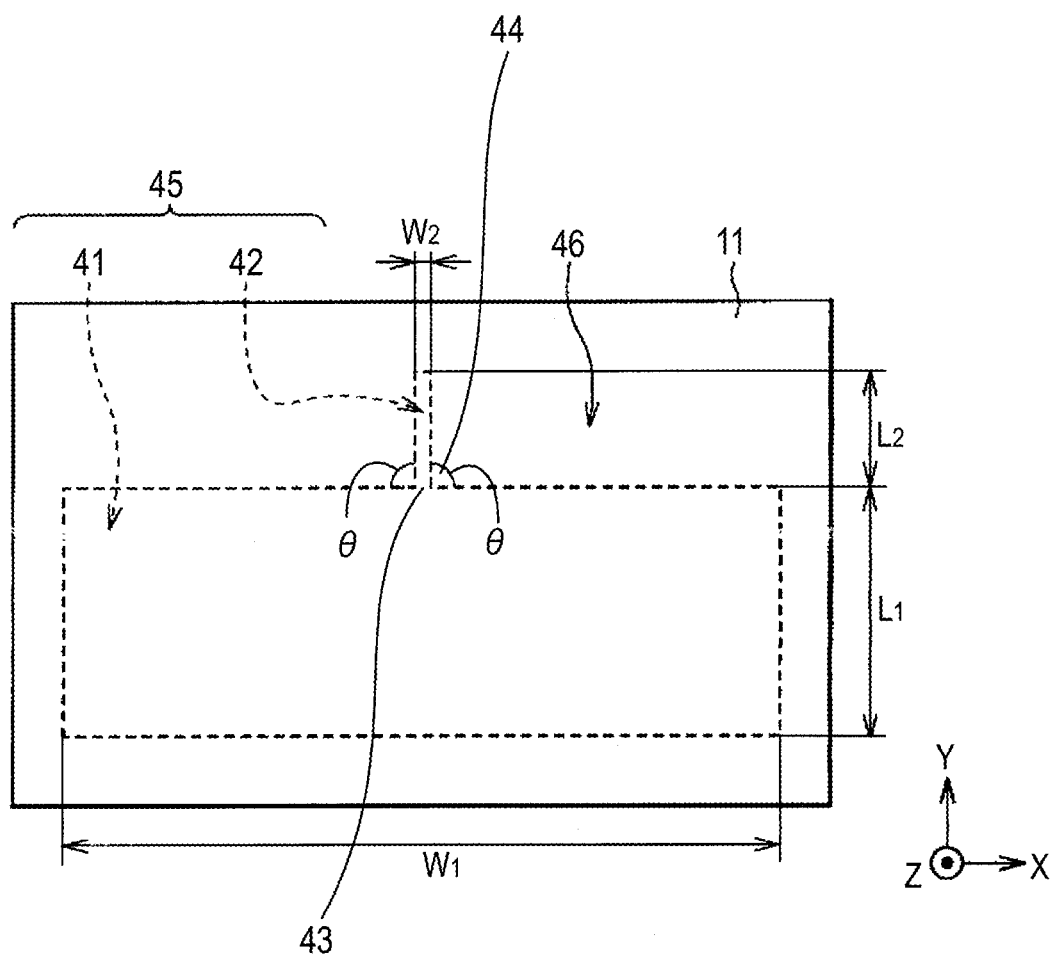
FIG. 6 is a schematic diagram for illustrating the method for producing a polarization organic photoelectric conversion device according to the second embodiment.

As shown in FIG. 6, on one principal surface of the first electrode 11 on which the organic photoelectric conversion layer 13 is to be formed, a solution reserving region 41 and a solution narrowing down region 42 connected to the solution reserving region 41 are formed.

The solution reserving region 41 is a region for reserving the organic solution for forming the organic photoelectric conversion layer 13, and the area thereof is defined by a width $W_1$ and a length $L_1$. The width $W_1$ and the length $L_1$ are appropriately selected depending on the shape and the size of the organic photoelectric conversion layer 13, however, in order to secure the amount of the organic solution, the width $W_1$ and the length $L_1$ are preferably selected to be large enough, and for example, the width $W_1$ is selected to be from 1000 to 10000 µm, and the length $L_1$ is selected to be from 100 to 800 µm.

The solution narrowing down region 42 is a region for narrowing down the area for the organic solution supplied to the solution reserving region 41, and the area thereof is defined by a width $W_2$ and a length $L_2$. The width $W_2$ of the solution narrowing down region 42 is smaller than the width $W_1$ of the solution reserving region 41, and at a connection position 43 at which the solution reserving region 41 and the solution narrowing down region 42 are connected to each other, a convex corner portion 44 is formed inward. In order to narrow down the area for the organic solution flowing into the solution narrowing down region 42 from the solution reserving region 41, the width $W_2$ is preferably selected to be small enough, and for example, the width $W_2$ is selected to be from 5 to 30 µm, and the length $L_2$ is selected to be from 5 to 200 µm. However, the width $W_2$ and the length $L_2$ can be arbitrarily changed as long as the width $W_2$ is smaller than the width $W_1$.

The reason why the solution reserving region 41 having a large width and the solution narrowing down region 42 having a small width are formed on one principal surface of the first electrode 11 is because a difference in the area of a liquid phase (organic solution) in contact with a gas phase (vapor) is produced. In the solution reserving region 41 having a large area (the width $W_1$ is larger than the width $W_2$) in contact with the gas phase, the solvent in the organic solution is easy to evaporate, however, in the solution narrowing down region 42 having a small area (the width $W_2$ is smaller than the width $W_1$) in contact with the gas phase, the solvent in the organic solution is difficult to evaporate. Accordingly, the evaporation speed of the solvent in the vicinity of the connection position 43 is locally increased, and the degree of supersaturation of the organic solution is locally increased there. Here, in order to form the organic photoelectric conversion layer by solution growth using the organic solution, by utilizing this local increase in the degree of supersaturation, the solute, i.e., the organic photoelectric conversion material in the organic solution is crystallized.

The shape of the tip of the corner portion 44 is not particularly limited, however, in order to reliably narrow down the area for the organic solution at the connection position 43, the shape thereof is preferably sharp. The angle θ of the corner portion 44 is not particularly limited, however, for the same reason as that for the shape of the tip of the corner portion 44, the angle is preferably right angle.

Preferably, the first electrode 11 is configured, for example, to have a lyophilic region 45 and a liquid-repellent region 46 on one principal surface thereof as shown in FIG. 6, and the solution reserving region 41 and the solution narrowing down region 42 are each preferably a lyophilic region 45. In this case, the solution reserving region 41 and the solution narrowing down region are lyophilic with respect to the organic solution (lyophilic region 45), and the other region is liquid-repellent with respect to the organic solution (liquid-repellent region 46). Here, the number of the lyophilic regions 45 (the number of sets of the solution reserving region 41 and the solution narrowing down region 42) is, for example, one (one set).

The lyophilic region 45 is a region which is easily wet with the organic solution and has a property to retain the organic solution onto a surface of the first electrode 11. On the other hand, the liquid-repellent region 46 is a region which is not easily wet with the organic solution and has a property to repel the organic solution in a surface of the first electrode 11. The first electrode 11 having the lyophilic region 45 and the liquid-repellent region 46 is formed by, for example, subjecting a lyophilic surface of the first electrode 11 to a liquid-repellent surface treatment or a liquid-repellent film forming treatment. In order to make the lyophilic surface of the first electrode 11 liquid-repellent, for example, an amorphous fluororesin film (Cytop manufactured by Asahi Glass Co., Ltd.) may be formed in a region desired to be made liquid-repellent.

The reason why the first electrode 11 has the lyophilic region 45 and the liquid-repellent region 46 on one principal surface thereof is because the organic solution is retained in a desired region (the lyophilic region 45) by utilizing a difference in the wetting property. Accordingly, the range of the organic solution retained on the surface of the first electrode 11 is accurately controlled. It suffices that the wetting properties (surface energy) of the lyophilic region 45 and the liquid-repellent region 46 are different to such an extent that the lyophilic region 45 and the liquid-repellent region 46 can be distinguished from each other.

[Solubility Curve and Supersaturation Curve]

Figure 7:
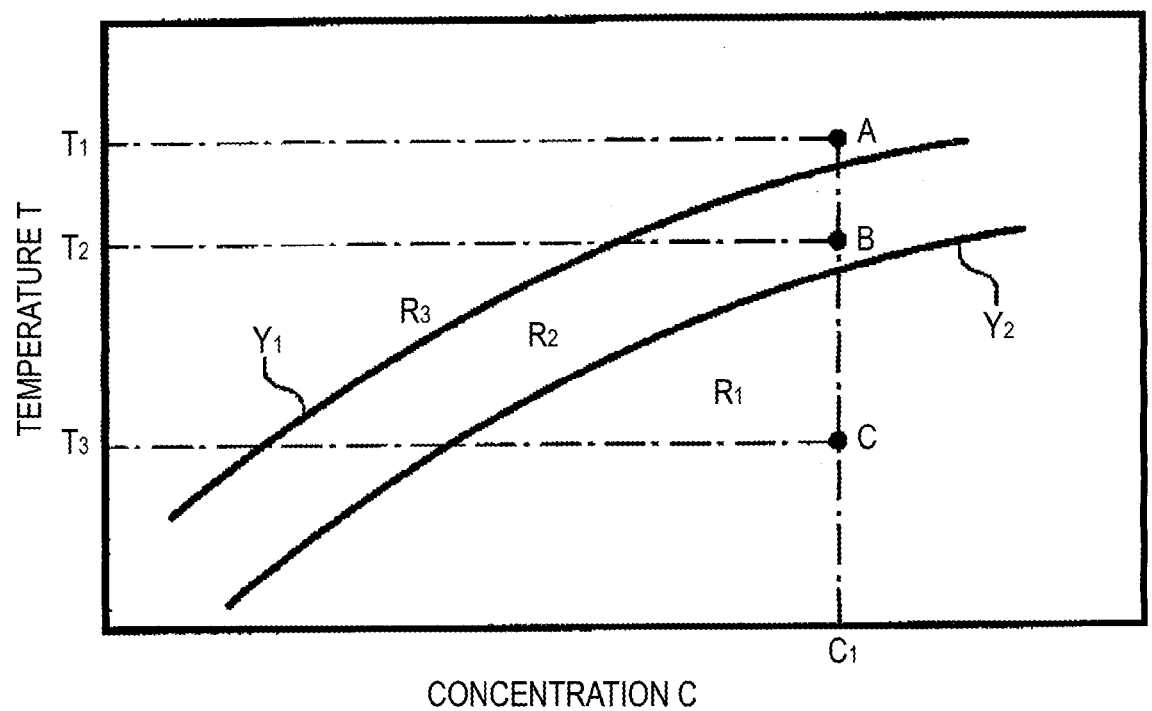
FIG. 7 is a graph showing a solubility curve and a supersaturation curve for an organic solution to be used in the method for producing a polarization organic photoelectric conversion device according to the second embodiment.

FIG. 7 shows a solubility curve $Y_1$ and a supersaturation curve $Y_2$ for the organic solution in which the organic photoelectric conversion material is dissolved in the solvent. These solubility curve $Y_1$ and supersaturation curve $Y_2$ show the dissolution characteristic of the organic photoelectric conversion material in the solvent. These solubility curve $Y_1$ and supersaturation curve $Y_2$ are preferably prepared (determined) in advance for the organic photoelectric conversion material to be used for forming the organic photoelectric conversion layer 13 and the solvent to be used for dissolving the material before the organic photoelectric conversion layer 13 is formed.

The regions $R_1$ to $R_3$ in FIG. 7 show states of the organic solution. The region $R_3$ on a higher temperature side than the solubility curve $Y_1$ shows a state in which crystals are dissolved (a solution state). The region $R_2$ between the solubility curve $Y_1$ and the supersaturation curve $Y_2$ shows a state in which a crystal grows with a crystal nucleus as a starting point (a crystal growing state). The region $R_1$ on a lower temperature side than the supersaturation curve $Y_2$ shows a state in which a crystal nucleus is formed (a crystal nucleus forming state). The points A to C represent examples of temperature condition when the organic photoelectric conversion layer 13 is formed.

In order to form the organic photoelectric conversion layer 13, first, an organic solution (an arbitrary concentration $C_1$ in FIG. 7), a solubility curve $Y_1$ and a supersaturation curve $Y_2$ (FIG. 7) for the organic solution, and a first electrode 11 having a solution reserving region 41 and a solution narrowing down region 42 with a narrow width on one principal surface thereof are prepared.

The type of the solvent to be used for preparing the organic solution is not particularly limited as long as the solvent can dissolve the organic photoelectric conversion material which is a solute, however, an organic solvent which is capable of stably and easily dissolving a wide variety of organic photoelectric conversion materials and is highly volatile is preferred. Further, the type of the organic photoelectric conversion material is appropriately selected depending on the organic photoelectric conversion layer 13 to be formed.

Figure 8:
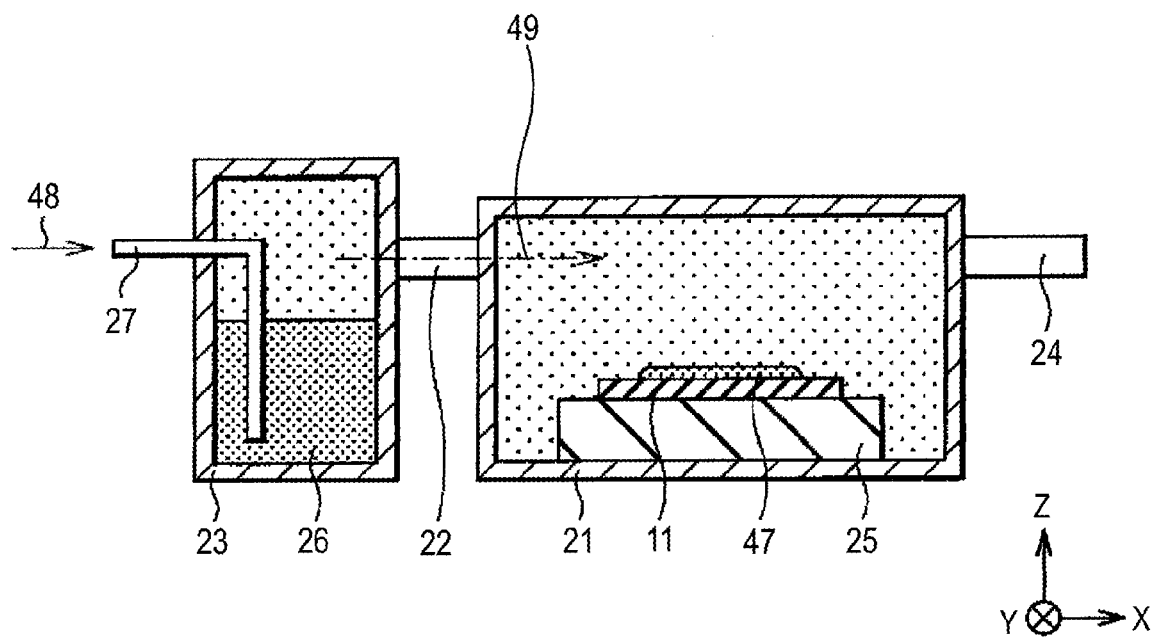
FIG. 8 is a schematic diagram showing a film forming device to be used in the method for producing a polarization organic photoelectric conversion device according to the second embodiment.
Figure 9:
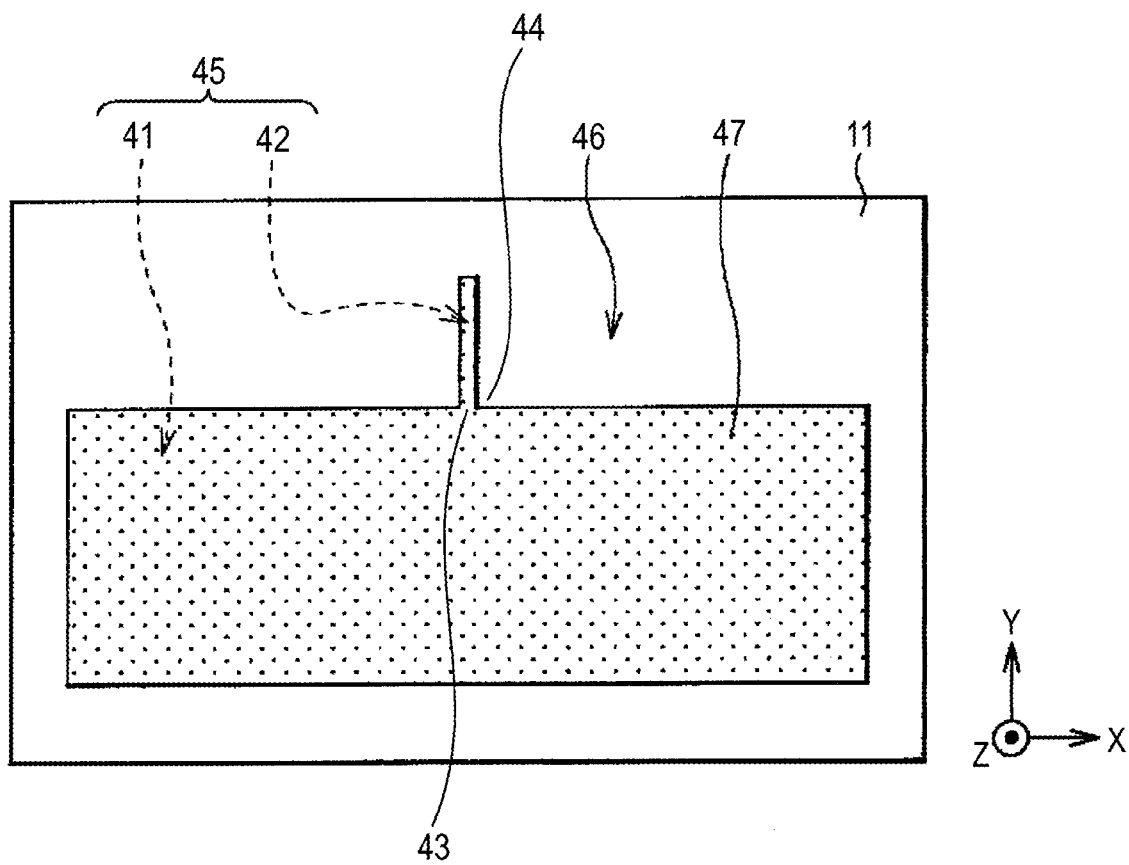
FIG. 9 is a schematic diagram for illustrating the method for producing a polarization organic photoelectric conversion device according to the second embodiment.

Subsequently, as shown in FIG. 8, the organic solution 47 is supplied to one principal surface (the solution reserving region 41 and the solution narrowing down region 42, which are lyophilic regions 45) of the first electrode 11. In this case, for example, the organic solution 47 is supplied to the solution reserving region 41, and then, from the solution reserving region 41, the organic solution 47 is allowed to flow into the solution narrowing down region 42. Since the solution reserving region 41 and the solution narrowing down region 42 are lyophilic with respect to the organic solution 47 (lyophilic regions 45), the organic solution 47 is retained there so as to fill the solution reserving region 41 and the solution narrowing down region 42. The supply amount of the organic solution 47 is arbitrary and may be an amount capable of filling at least the solution reserving region 41 and the solution narrowing down region 42.

Subsequently, the exhaust pipe 24 is closed to airtightly seal the chamber 21 and the solvent tank 23. Thereafter, for example, gas such as nitrogen ($N_2$) is introduced into the solvent tank 23 from the gas inlet pipe 27. By doing this, vapor including the auxiliary solvent 26 is supplied to the chamber 21 through the connecting pipe 22 from the solvent tank 23, and therefore, the internal environment of the chamber 21 is filled with the vapor.

In this case, the temperature of the first electrode 11 is set to $T_1$ using the holder 25. Further, also the temperature of the auxiliary solvent 26 is preferably set to $T_1$ using an oil bath or the like. By doing this, a vapor pressure P in the chamber 21 becomes a saturated vapor pressure at a temperature of $T_1$, and therefore, the liquid phase (organic solution 47) and the gas phase (vapor) reach a state of equilibrium. In the same manner, the liquid phase (auxiliary solvent 26) in the solvent tank 23 and the gas phase (vapor) reach a state of equilibrium.

The temperature $T_1$ set here is, as shown in FIG. 7, a temperature located on a higher temperature side than the solubility curve $Y_1$ (region $R_3$), more specifically, for example, a temperature corresponding to the point A. By doing this, also the temperature of the organic solution becomes $T_1$, and therefore, the state of the organic solution 47 becomes a solution state. Hereinafter, the temperature or the like of the organic solution 47 is appropriately set using the holder 25 or the like.

Subsequently, the temperature of the organic solution 47 is decreased from $T_1$ to $T_2$. In this case, it is preferred that the temperature of the auxiliary solvent 26 is also decreased from $T_1$ to $T_2$. The reason why not only the temperature of the organic solution 47, but also the temperature of the auxiliary solvent 26 is decreased is because the vapor pressure P is prevented from affecting the vapor of the solvent by maintaining the state of equilibrium between the liquid phase and the gas phase, and hereinafter the same shall apply.

The temperature $T_2$ set here is, as shown in FIG. 7, a temperature located between the solubility curve $Y_1$ and the supersaturation curve $Y_2$ (region $R_2$), more specifically, for example, a temperature corresponding to the point B. By doing this, the state of the organic solution 47 becomes a crystal growing state.

Figure 10:
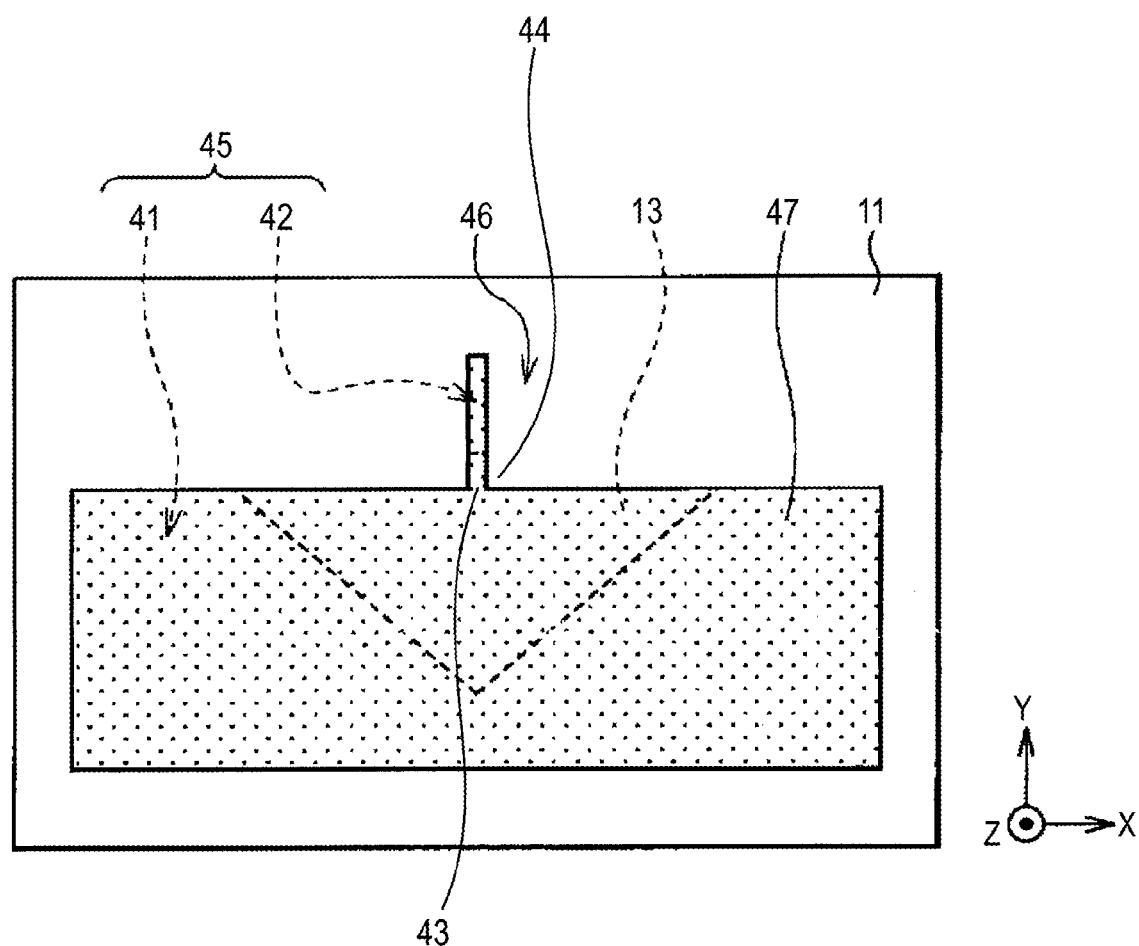
FIG. 10 is a schematic diagram for illustrating the method for producing a polarization organic photoelectric conversion device according to the second embodiment.

Here, a crystal nucleus is not yet formed in the organic solution 47, and therefore, it is supposed that, even when the state of the organic solution 47 becomes a crystal growing state, a crystal nucleus is not formed or a crystal does not grow essentially. However, when also the temperature of the organic solution 47 is decreased to $T_2$, as shown in FIGS. 10 and 11, a crystal nucleus is formed in the organic solution 47 and also a crystal grows with the crystal nucleus as a starting point for the following reason.

The organic solution 47 is present in the solution reserving region 41 having a wide width and the solution narrowing down region 42 having a narrow width, and therefore, the area for the organic solution 47 is narrowed down in the solution narrowing down region 42 as compared with in the solution reserving region 41. According to this configuration, as described above, a difference in the area in contact with a gas phase (vapor) is produced between the organic solution 47 in the solution reserving region 41 and the organic solution 47 in the solution narrowing down region 42. Due to this, in the solution reserving region 41 having a large area in contact with the gas phase, the solvent in the organic solution 47 is easy to evaporate, however, in the solution narrowing down region 42 having a small area in contact with the gas phase, the solvent in the organic solution 47 is difficult to evaporate. According to this difference in the area in contact with the gas phase, a difference in the evaporation speed is produced and the evaporation speed of the solvent in the organic solution 47 in the vicinity of the connection position 43 is locally increased, and the degree of supersaturation of the organic solution 47 is locally increased. As a result, in the region where the degree of supersaturation is locally increased, the state of the organic solution 47 becomes similar to a crystal nucleus forming state on a lower temperature side than the supersaturation curve $Y_2$ (region $R_1$), and therefore, the solute in the organic solution 47 is crystallized. Consequently, a crystal nucleus is formed in the organic solution 47 in a narrow range (in the vicinity of the connection position 43). Further, due to a phenomenon of diffusion of the solute in the organic solution 47, a crystal grows with the crystal nucleus as a starting point while supplying the solute from the organic solution 47. In this manner, a single crystal organic photoelectric conversion layer 13 is formed. In this case, when the width $W_2$ of the solution narrowing down region 42 is small enough, a substantially single crystal nucleus is formed.

Thereafter, if necessary, the temperature of the organic solution 47 may be decreased from $T_2$ to a temperature lower than $T_2$. In this case, it is preferred that the temperature of the auxiliary solvent 26 is also decreased in the same manner. The target temperature in this case is not particularly limited as long as the temperature is lower than $T_2$, however, for example, as shown in FIG. 7, the target temperature is a temperature located on a lower temperature side than the supersaturation curve $Y_2$ (region $R_1$), more specifically, for example, $T_3$ corresponding to the point C. By decreasing the temperature of the organic solution 47 to a temperature lower than $T_2$, a strong driving force for allowing a crystal to grow is generated, and therefore, the organic photoelectric conversion layer 13 grow large.

Figure 11:
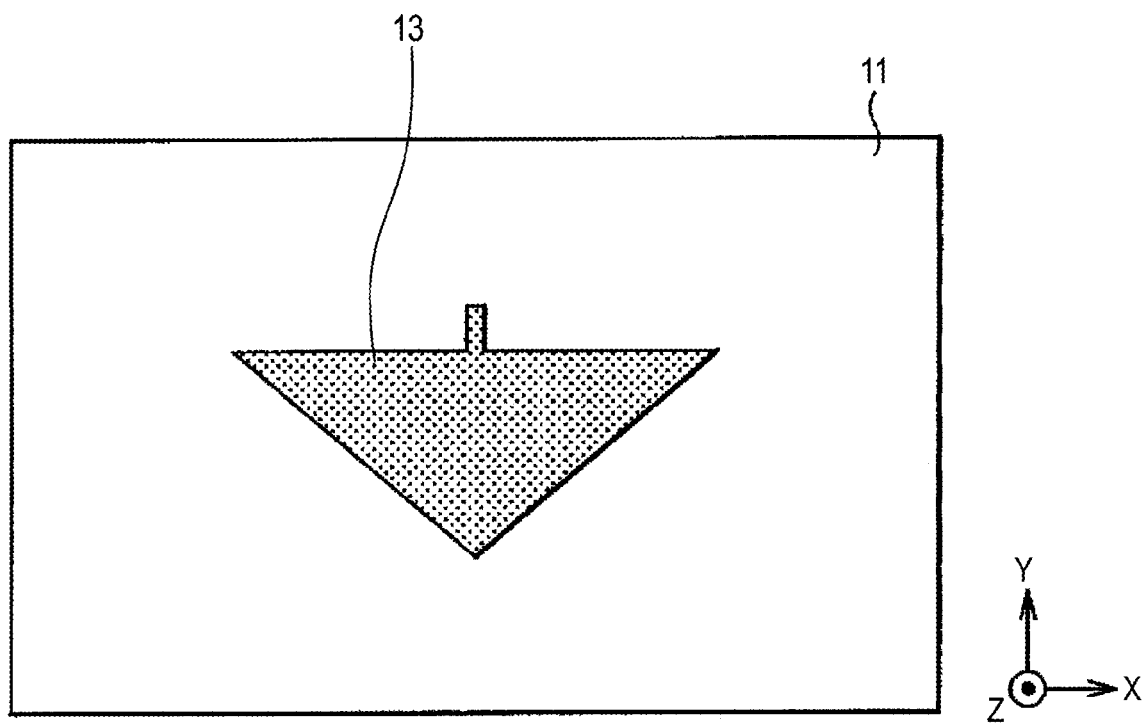
FIG. 11 is a schematic diagram for illustrating the method for producing a polarization organic photoelectric conversion device according to the second embodiment.

Finally, the organic solution 47 is removed from the one principal surface of the first electrode 11 by suction or the like as needed, whereby an organic photoelectric conversion layer 13 is obtained as shown in FIG. 11.

Here, for example, as shown in FIG. 11, an organic photoelectric conversion layer 13 having a substantially triangular planar shape is formed. However, depending on the condition such as the retention property (the presence or absence of flow and the degree thereof) of the organic solution 47, an organic photoelectric conversion layer 13 having another planar shape such as a rectangular shape may be formed. In this case, if necessary, the organic photoelectric conversion layer 13 may be patterned to have a desired planar shape using an etching method or the like.

Incidentally, the structure of the solution reserving region 41 and the solution narrowing down region and the structure of the organic photoelectric conversion layer 13 have the following relationships.

First, the connection position 43 at which the solution reserving region 41 and the solution narrowing down region 42 are connected to each other determines a position where the degree of supersaturation of the organic solution 47 is locally increased, and therefore determines a position where a crystal nucleus is formed. Accordingly, depending on the connection position 43, a position where a crystal starts to grow and a position where the organic photoelectric conversion layer 13 is formed can be controlled.

Secondary, the length $L_1$ of the solution reserving region 41 determines the amount of the organic solution 47 capable of continuing to supply the solute for allowing a crystal to continuously grow when a crystal grows with a crystal nucleus as a starting point. Therefore, depending on the length $L_1$, the size (i.e. the size of the planar surface) of the organic photoelectric conversion layer 13 can be controlled.

Thirdly, the width $W_2$ of the solution narrowing down region 42 affects the formation range of crystal nuclei and the number thereof. When the width $W_2$ is small enough, the formation range of crystal nuclei is narrowed down to a very narrow range, and therefore, a single crystal nucleus is easily formed. Incidentally, when the width $W_2$ is large, a crystal nucleus is formed in each corner portion 44, and therefore, it is considered that a crystal grows with each crystal nucleus as a starting point. Accordingly, it is presumed that even if the width $W_2$ is large, a single crystal organic photoelectric conversion layer 13 can be formed in each corner portion 44 in the same manner as the case where the width $W_2$ is small enough. However, when a crystal nucleus is formed in each corner portion 44, if the width $W_2$ is too small, the organic photoelectric conversion layers 13 may collide with each other during the growth of crystals. Accordingly, in order to avoid such collision, it is preferred to set the width $W_2$ to rather large enough.

In the method for forming the organic photoelectric conversion layer 13 (by the solution temperature control type process), the organic solution 47 is supplied to the solution reserving region 41 having a wide width and the solution narrowing down region 42 having a narrow width by setting the temperature of the organic solution 47 to $T_1$ and also setting the vapor pressure P to a saturated vapor pressure at $T_1$, and thereafter the temperature of the organic solution 47 is decreased from $T_1$ to $T_2$. The temperature $T_1$ is a temperature located on a higher temperature side than the solubility curve $Y_1$ (region $R_3$), and the temperature $T_2$ is a temperature located between the solubility curve $Y_1$ and the supersaturation curve $Y_2$ (region $R_2$).

In this case, as previously described with reference to FIGS. 5 to 11, due to a decrease in the temperature of the organic solution 47, the degree of supersaturation of the organic solution 47 in the vicinity of the connection position 43 at which the solution reserving region 41 and the solution narrowing down region 42 are connected to each other is locally increased. As a result, a crystal nucleus is formed in the organic solution 47 in a narrow range and also a crystal grows with the crystal nucleus as a starting point, and therefore, a single crystal organic photoelectric conversion layer 13 in which organic molecules are regularly arranged is formed. Accordingly, a single crystal organic photoelectric conversion layer 13 can be formed by controlling a position at which a crystal nucleus is formed and a direction in which a crystal grows.

In particular, in order to form a single crystal organic photoelectric conversion layer 13, it suffices that after the organic solution 47 is supplied to the solution reserving region 41 and the solution narrowing down region 42 in an environment in which the vapor pressure P is a saturated vapor pressure, the temperature of the organic solution 47 is changed. Since there is no need for a special environment such as a reduced pressure environment and also there is no need for a special apparatus or the like, a single crystal organic photoelectric conversion layer 13 can be easily formed.

In addition, by further decreasing the temperature of the organic solution 47 to a temperature lower than $T_2$, a strong driving force for allowing a crystal to grow is generated, and therefore, the size of the planar surface of the organic photoelectric conversion layer 13 can be increased.

Further, if the solution reserving region 41 and the solution narrowing down region 42 are lyophilic with respect to the organic solution 47 (lyophilic regions 45), and also the other region is liquid-repellent with respect to the organic solution 47 (liquid-repellent region 46), by utilizing a difference in the wetting property, the organic solution 47 is easily retained in a desired range (lyophilic regions 45). As a result, an increase in the degree of supersaturation of the organic solution 47 described above is reliably caused, and therefore, a position where the organic photoelectric conversion layer 13 is formed can be accurately controlled.

[Formation of Organic Photoelectric Conversion Layer 13 by Vapor Pressure Control Type Solution Growth Process]

In the same manner as the method for forming an organic photoelectric conversion layer 13 by the solution temperature control type solution growth process described above, an organic solution 47, a solubility curve $Y_1$ and a supersaturation curve $Y_2$ (FIG. 7), and a first electrode 11 (FIG. 6) as a base body for forming a film are prepared. Then, as shown in FIGS. 5 and 8, in an environment in which vapor V is filled in the inside of the chamber 21, the organic solution 47 (an arbitrary concentration $C_1$ in FIG. 7) is supplied to one principal surface of the first electrode 11 (a solution reserving region 41 and a solution narrowing down region 42).

In this case, the temperature of the first electrode 11 and the temperature of the auxiliary solvent 26 are set to $T_2$, and also the vapor pressure P is set to a saturated vapor pressure at $T_2$, whereby the liquid phase and the gas phase are allowed to reach a state of equilibrium.

The temperature $T_2$ set here is, as shown in FIG. 7, a temperature located between the solubility curve $Y_1$ and the supersaturation curve $Y_2$ (region $R_2$), more specifically, for example, a temperature corresponding to the point B. By doing this, the state of the organic solution 47 becomes a crystal growing state.

Subsequently, while maintaining the temperature of the organic solution 47 at $T_2$, the vapor pressure P is decreased. In this case, for example, the vapor in the chamber 21 may be discharged to the outside by slightly opening the exhaust pipe 24. The discharge amount of the vapor (target vapor pressure) in this case is arbitrary. However, in order to prevent the random formation of a crystal nucleus in the organic solution 47, it is preferred that the vapor pressure P is not decreased too rapidly.

Here, a crystal nucleus is not yet formed in the organic solution 47, and therefore, it is supposed that, even when the vapor pressure P is decreased, a crystal nucleus is not formed or a crystal does not grow essentially. However, when the vapor pressure P is decreased, as shown in FIGS. 10 and 11, a crystal nucleus is formed in the organic solution 47 and also a crystal grows with the crystal nucleus as a starting point for the following reason.

When the vapor pressure P is decreased, the state of equilibrium between the liquid phase and the gas phase is disrupted, and therefore, the solvent in the organic solution 47 easily evaporates. In this case, the organic solution 47 is present in the solution reserving region 41 having a wide width and the solution narrowing down region having a narrow width, and therefore, in the same manner as the solution temperature control type solution growth process described above, the degree of supersaturation of the organic solution 47 in the vicinity of the connection position 43 is locally increased. As a result, a crystal nucleus is formed in the organic solution 47 in a narrow range, and also a crystal grows with the crystal nucleus as a starting point, whereby a single crystal organic photoelectric conversion layer 13 is formed.

Finally, in the same manner as the solution temperature control type solution growth process, the organic solution 47 is removed from the one principal surface of the first electrode 11 as needed, whereby an organic photoelectric conversion layer 13 is obtained as shown in FIG. 11.

In the method for forming an organic photoelectric conversion layer 13 by the vapor pressure control type solution growth process, the organic solution 47 is supplied to the solution reserving region 41 having a wide width and the solution narrowing down region 42 having a narrow width by setting the temperature of the organic solution 47 to $T_2$ and also setting the vapor pressure P to a saturated vapor pressure at $T_2$, and thereafter the vapor pressure P is decreased. The temperature $T_2$ is a temperature located between the solubility curve $Y_1$ and the supersaturation curve $Y_2$ (region $R_2$).

In this case, as previously described with reference to FIGS. 5 to 11, due to a decrease in the vapor pressure P, the degree of supersaturation of the organic solution 47 in the vicinity of the connection position 43 at which the solution reserving region 41 and the solution narrowing down region 42 are connected to each other is locally increased in the same manner as the solution temperature control type solution growth process. As a result, a crystal nucleus is formed in the organic solution 47 in a narrow range and also a crystal grows with the crystal nucleus as a starting point, and therefore, a single crystal organic photoelectric conversion layer 13 is formed. Accordingly, a single crystal organic photoelectric conversion layer 13 can be formed by controlling a position at which a crystal nucleus is formed and a direction in which a crystal grows.

In particular, in the case of using the vapor pressure control type solution growth process, a single crystal organic photoelectric conversion layer 13 can be formed in a shorter time than in the case of using the solution temperature control type solution growth process. It is because when the vapor pressure P is decreased, the evaporation of the solvent is significantly enhanced as compared with the case where the temperature of the organic solution 47 is decreased, and therefore, the degree of supersaturation of the organic solution 47 is easily increased in a short time.

The second embodiment is the same as the first embodiment except that the organic photoelectric conversion layer 13 is formed by the solution temperature control type solution growth process or the vapor pressure control type solution growth process.

According to the second embodiment, the same advantages as those in the first embodiment can be obtained.

<3. Third Embodiment>
[Method for Producing Polarization Organic Photoelectric Conversion Device]

In a method for producing a polarization organic photoelectric conversion device according to this embodiment, an organic photoelectric conversion layer 13 uniaxially oriented in advance is prepared, and the organic photoelectric conversion layer 13 is disposed on a first electrode 11 or a second electrode 12. At this time, the orientation axis of the organic photoelectric conversion layer 13 is aligned with a given direction with respect to the first electrode 11 or the second electrode 12. Thereafter, the second electrode 12 or the first electrode 11 is formed on the organic photoelectric conversion layer 13, whereby a polarization organic photoelectric conversion device is produced. In this case, when the organic photoelectric conversion layer 13 has low chemical stability, the organic photoelectric conversion layer 13 is disposed on one which can be formed under a severer condition among the first electrode 11 and the second electrode 12, and thereafter, the other one which can be formed under a milder condition among the first electrode 11 and the second electrode 12 is formed by a method using a milder condition, for example, a vacuum vapor deposition method with which little radiant heat is emitted, a coating method, or the like. Further, when the organic photoelectric conversion layer 13 has high chemical stability and is resistant to damage, the organic photoelectric conversion layer 13 is disposed on one of the first electrode 11 and the second electrode 12, and thereafter, the other one of the first electrode 11 and the second electrode 12 can be formed by, for example, a sputtering method or the like.

The third embodiment is the same as the first embodiment except for the above-described points.

According to the third embodiment, the same advantages as those in the first embodiment can be obtained.

<4. Fourth Embodiment>
[Polarization Organic Photoelectric Conversion Device]

Figure 12:
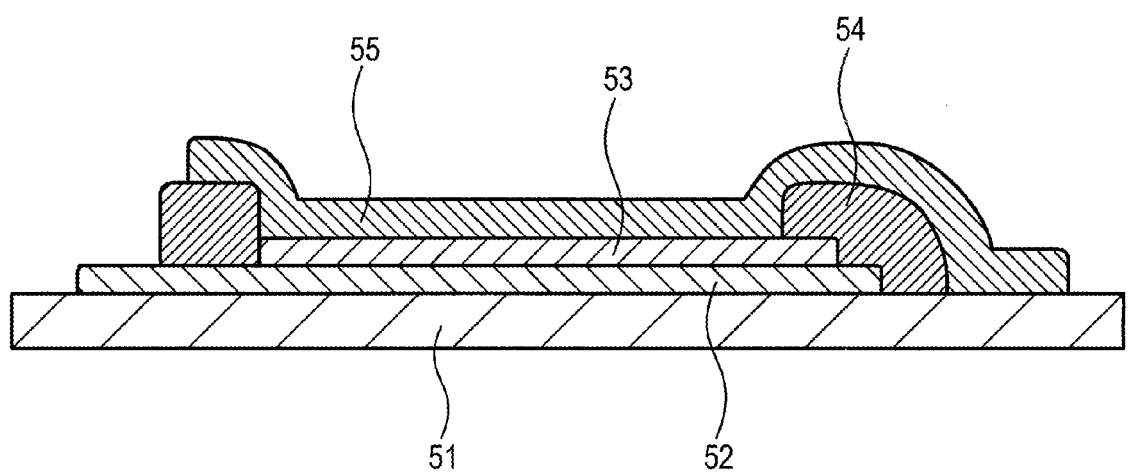
FIG. 12 is a cross-sectional view showing a polarization organic photoelectric conversion device according to a fourth embodiment.

A polarization organic photoelectric conversion device according to a fourth embodiment is shown in FIG. 12.

As shown in FIG. 12, in the polarization organic photoelectric conversion device according to this embodiment, a first electrode 52 is provided on a substrate 51. On the first electrode 52, an organic photoelectric conversion layer 53 uniaxially oriented in one direction parallel to the substrate 51 is provided. An insulating layer 54 is provided so as to surround the organic photoelectric conversion layer 53. Further, on the organic photoelectric conversion layer 53, a second electrode 55 is provided extending on the insulating layer 54. In this manner, a structure in which the organic photoelectric conversion layer 53 is interposed between the first electrode 52 and the second electrode 55 is formed.

Figure 13:
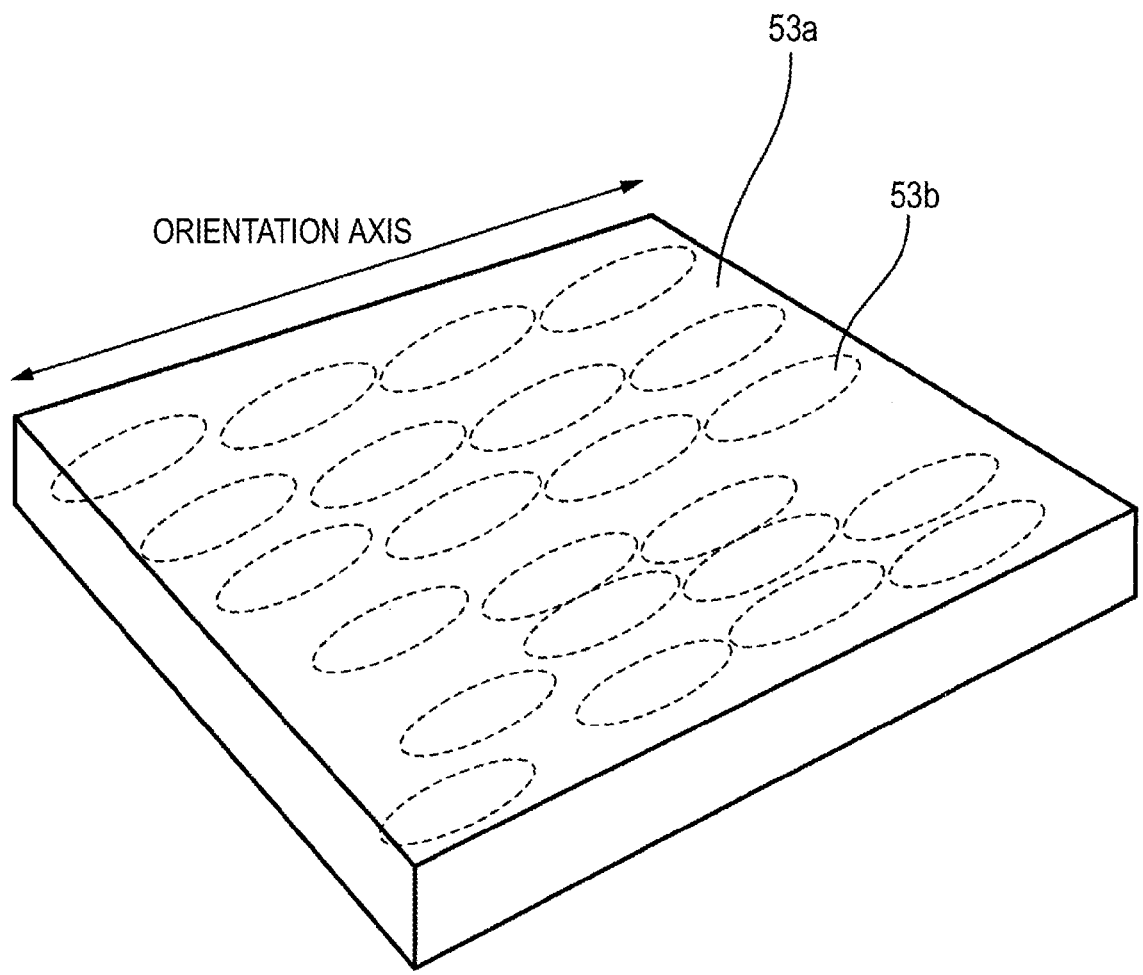
FIG. 13 is a perspective view for illustrating a method for producing a polarization organic photoelectric conversion device according to the fourth embodiment.

A detailed structure of the organic photoelectric conversion layer 53 is shown in FIG. 13. As shown in FIG. 13, the organic photoelectric conversion layer 53 is composed of a binder 53a and a dye 53b capable of photoelectrically converting light, and the dye 53b is aligned with the orientation axis. As the binder 53a, a known binder can be used and is selected as needed. Specific examples of the binder 53a include fluororesins such as polyvinylidene difluoride (PVDF), polytetrafluoroethylene (PTFE), tetrafluoroethylene-hexafluoropropylene copolymers (FEP), tetrafluoroethylene-perfluoroalkylvinyl ether copolymers (PFA), ethylene-tetrafluoroethylene copolymers (ETFE), polychlorotrifluoroethylene (PCTFE), ethylene-chlorotrifluoroethylene copolymers (ECTFE), and polyvinyl fluoride (PVF); vinylidene fluoride-based fluororubbers such as vinylidene fluoride-hexafluoropropylene-based fluororubbers (VDF-HFP-based fluororubbers), vinylidene fluoride-hexafluoropropylene-tetrafluoroethylene-based fluororubbers (VDF-HFP-TFE-based fluororubbers), vinylidene fluoride-pentafluoropropylene-based fluororubbers (VDF-PFP-based fluororubbers), vinylidene fluoride-pentafluoropropylene-tetrafluoroethylene-based fluororubbers (VDF-PFP-TFE-based fluororubbers), vinylidene fluoride-perfluoromethylvinyl ether-tetrafluoroethylene-based fluororubbers (VDF-PFMVE-TFE-based fluororubbers), and vinylidene fluoride-chlorotrifluoroethylene-based fluororubbers (VDF-CTFE-based fluororubbers); tetrafluoroethylene-propylene-based fluororubbers (TFE-P-based fluororubbers), tetrafluoroethylene-perfluoroalkylvinyl ether-based fluororubbers, thermoplastic fluororubbers (such as DAI-EL Thermoplastic manufactured by Daikin Industries, Ltd.), polyethylene glycol (PEG), ethylene propylene diene monomers (EPDM), and celluloses such as carboxymethyl cellulose (CMC). As the dye 53b, any of the above-described various dyes can be used.

[Method for Producing Polarization Organic Photoelectric Conversion Device]

A method for producing the polarization organic photoelectric conversion device according to this embodiment will be described.

Figure 14:
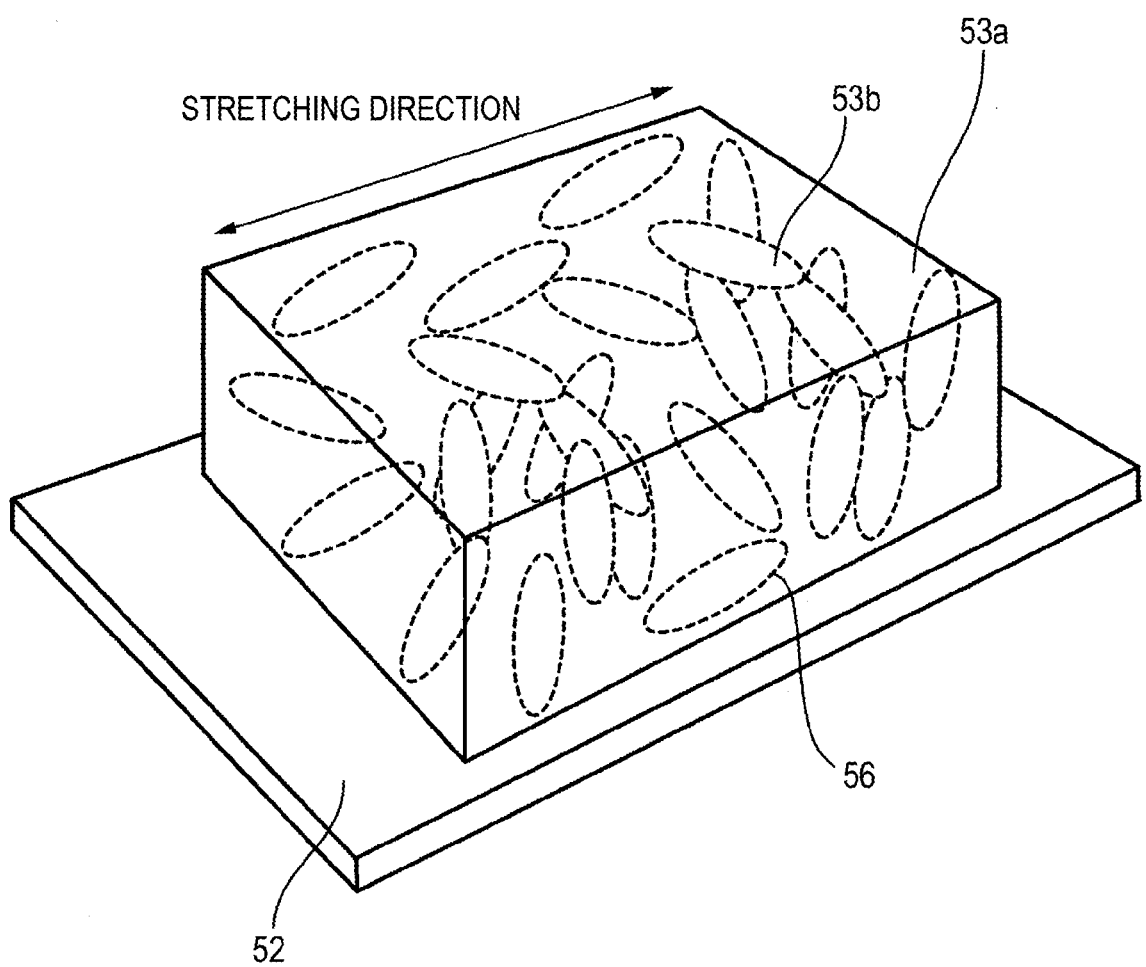
FIG. 14 is a perspective view for illustrating the method for producing a polarization organic photoelectric conversion device according to the fourth embodiment.

First, as shown in FIG. 14, after the first electrode 52 is formed on the substrate 51, an organic photoelectric conversion layer forming film 56 composed of a mixture of the binder 53a which is stretchable and the dye 53b which is capable of photoelectrically converting light is applied onto the first electrode 52, followed by solidification. In the organic photoelectric conversion layer forming film 56, the individual molecules of the dye 53b are directed to various directions.

Figure 15:
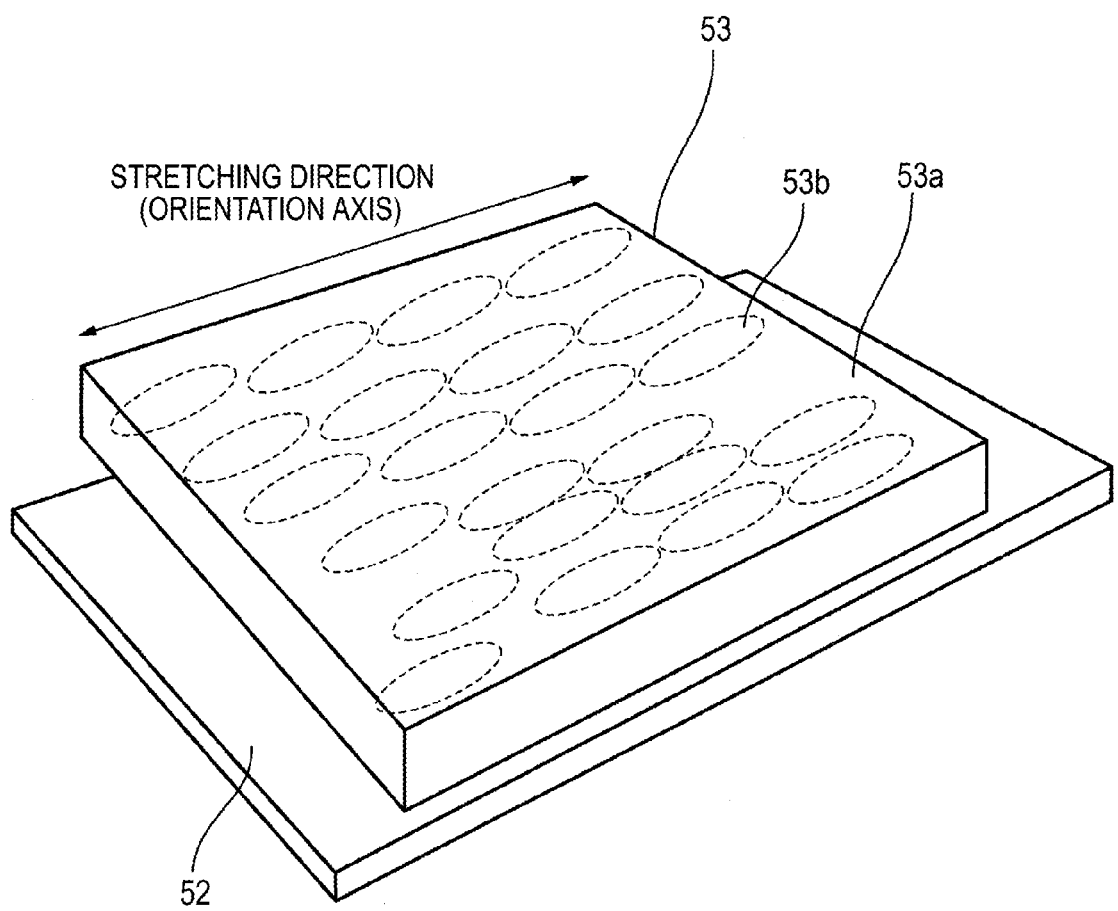
FIG. 15 is a perspective view for illustrating the method for producing a polarization organic photoelectric conversion device according to the fourth embodiment.

Subsequently, the organic photoelectric conversion layer forming film 56 is fixed on the first electrode 52 while stretching the organic photoelectric conversion layer forming film 56 in one direction parallel to the first electrode 52. By this stretching, as shown in FIG. 15, the directions of the molecules of the dye 53b are aligned with the stretching direction, whereby a uniaxially oriented organic photoelectric conversion layer 53 is formed.

Subsequently, after the insulating film 54 is formed so as to surround the thus formed organic photoelectric conversion layer 53, the second electrode 52 is formed on the organic photoelectric conversion layer 53 extending on the insulating layer 54.

As described above, a desired polarization organic photoelectric conversion device is produced.

The fourth embodiment is the same as the first embodiment except for the above-described points.

According to the fourth embodiment, the same advantages as those in the first embodiment can be obtained.

<5. Fifth Embodiment>
[Polarization Optical Device]

Figure 16:
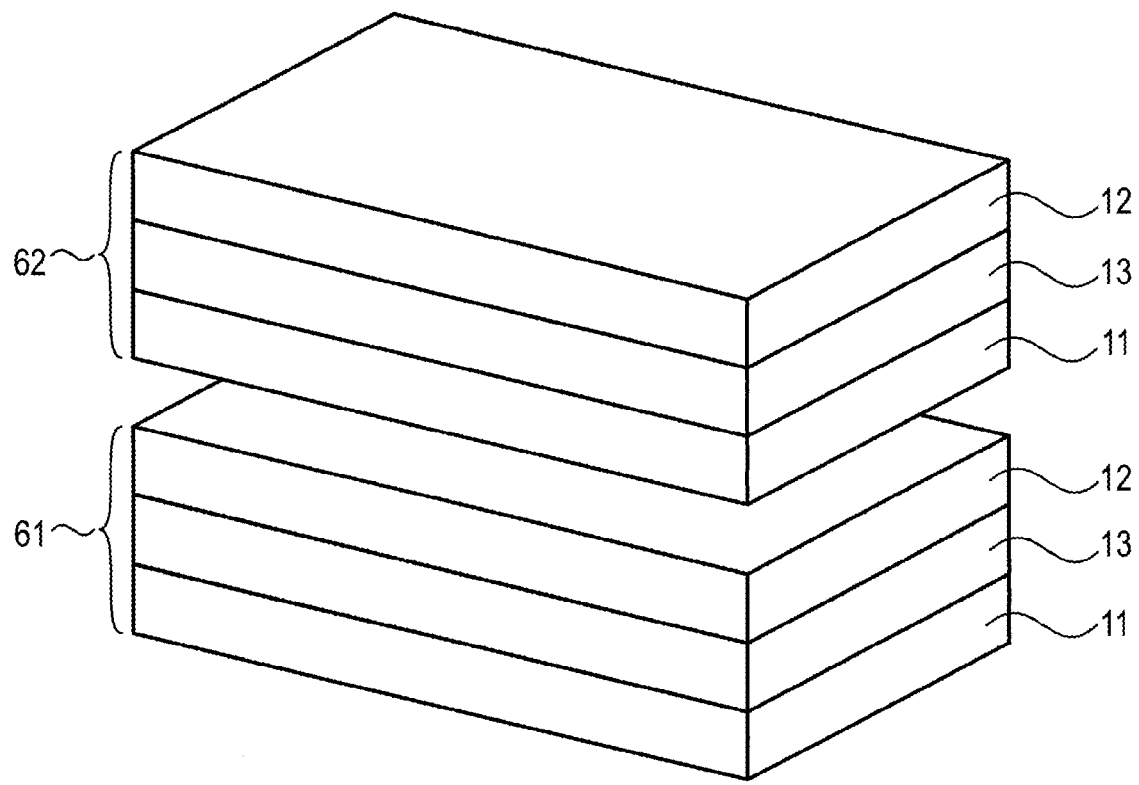
FIG. 16 is a perspective view showing a polarization optical device according to a fifth embodiment.

A polarization optical device according to a fifth embodiment is shown in FIG. 16.

Figure 17A:
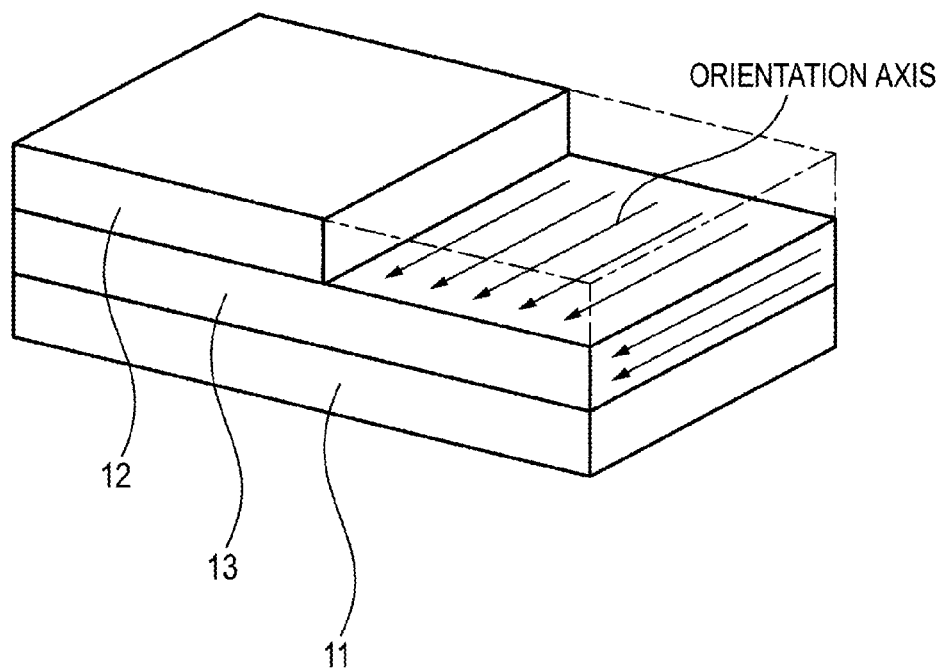
FIGS. 17A and 17B are perspective views showing two polarization organic photoelectric conversion devices constituting the polarization optical device according to the fifth embodiment.
Figure 17B:
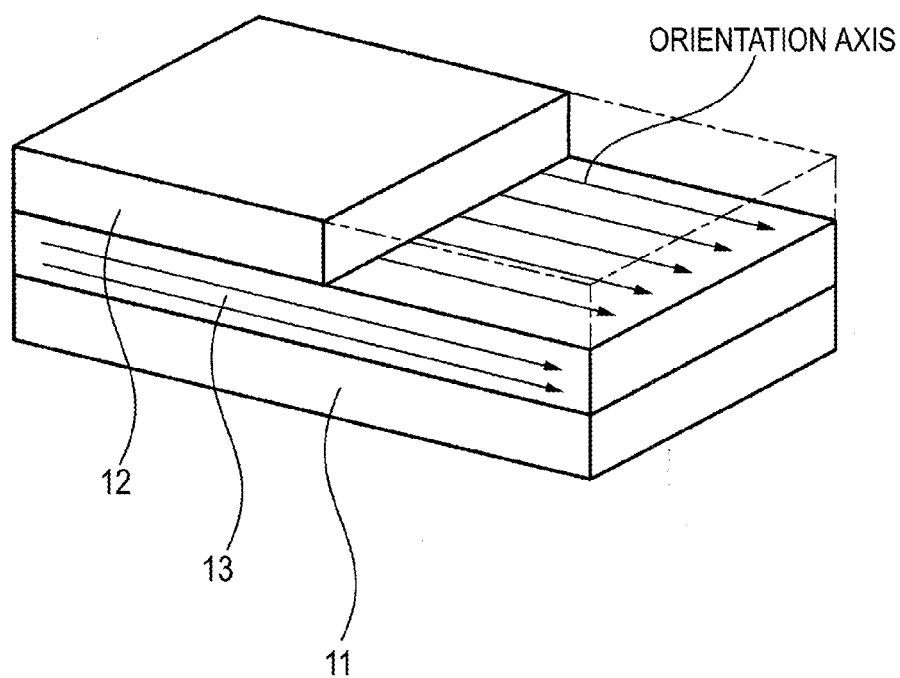

As shown in FIG. 16, in the polarization optical device according to this embodiment, two polarization organic photoelectric conversion devices 61 and 62 each having the same structure as the polarization organic photoelectric conversion device according to the first embodiment are disposed one above the other. In this case, a gap is provided between these polarization organic photoelectric conversion devices 61 and 62. The details of the polarization organic photoelectric conversion device 62 on the upper side are shown in FIG. 17A, and the details of the polarization organic photoelectric conversion device 61 on the lower side are shown in FIG. 17B. As shown in FIGS. 17A and 17B, the orientation axes of the organic photoelectric conversion layers 13 of these polarization organic photoelectric conversion devices 61 and 62, i.e., the polarization axes thereof are orthogonal to each other.

Figure 18:
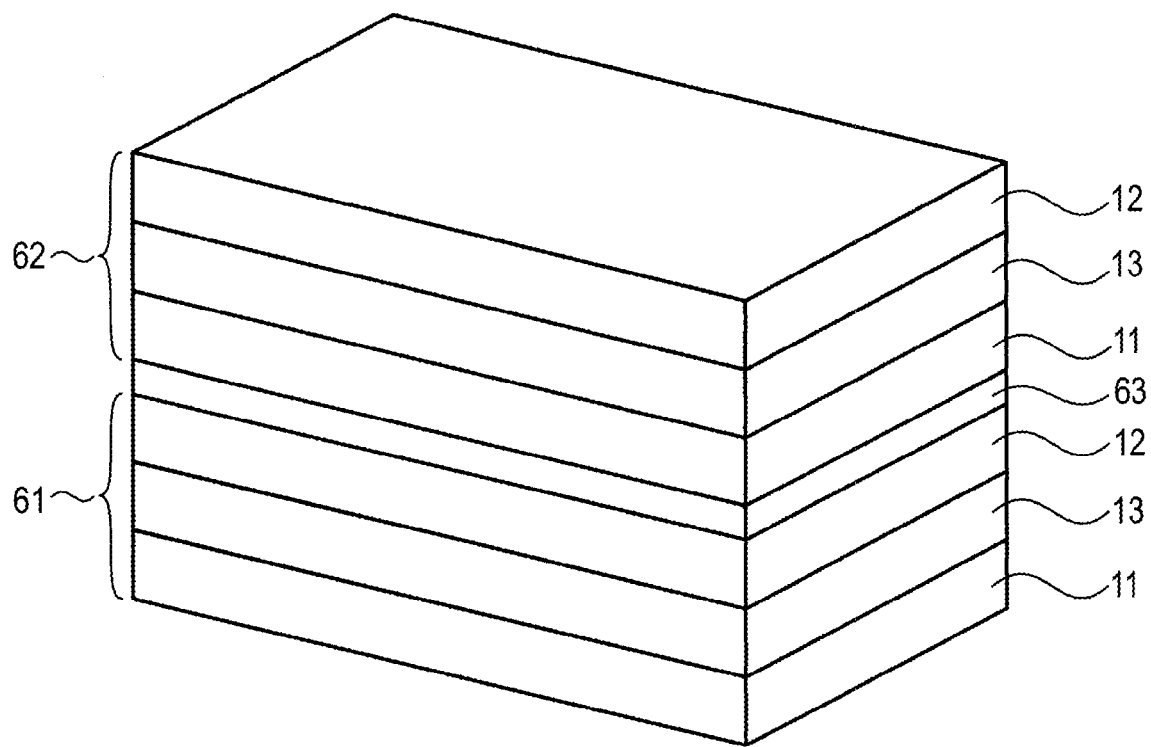
FIG. 18 is a perspective view showing another polarization optical device according to the fifth embodiment.

In FIG. 16, a gap is provided between the polarization organic photoelectric conversion devices 61 and 62, however, as shown in FIG. 18, the polarization optical device may be configured such that the polarization organic photoelectric conversion devices 61 and 62 are laminated through an insulating layer 63. As the insulating layer 63, a known layer can be used, and the insulating layer may be an organic film or an inorganic film and is selected as needed. For example, a silicon dioxide ($SiO_2$) film, a tetraethyl orthosilicate (TEOS) film, or the like is used. The thickness of the insulating layer 63 is selected as needed, however, for example, a thickness of about several micrometers suffices.

[Method for Producing Polarization Optical Device]

The polarization optical device according to this embodiment can be produced as follows.

First, the polarization organic photoelectric conversion devices 61 and 62 are formed, respectively, in the same manner as in any of the first to fourth embodiments. Subsequently, these polarization organic photoelectric conversion devices 61 and 62 are disposed one above the other so as to form a gap therebetween and are fixed to each other. In this manner, a polarization optical device shown in FIG. 16 is produced. Alternatively, for example, the insulating layer 63 is formed on the second electrode 12 of the polarization organic photoelectric conversion device 61 by, for example, a CVD method. Then, on the insulating layer 63, the polarization organic photoelectric conversion device 62 is laminated such that the first electrode 11 of the polarization organic photoelectric conversion device 62 is located on the lower side and bonded thereto. In this manner, a polarization optical device shown in FIG. 18 is produced.

The polarization optical device according to this embodiment may be produced as follows.

First, on the substrate, the first electrode 11, the organic photoelectric conversion layer 13, and the second electrode 12 are sequentially formed, whereby the polarization organic photoelectric conversion device 61 is formed. Subsequently, the insulating layer 63 is formed on the second electrode 12 of the thus formed polarization organic photoelectric conversion device 61, and thereafter on the insulating layer 63, the first electrode 11, the organic photoelectric conversion layer 13, and the second electrode 12 are sequentially formed, whereby the polarization organic photoelectric conversion device 62 is formed. In this manner, a polarization optical device shown in FIG. 18 is produced.

[Operation of Polarization Optical Device]

For example, the first electrode 11 of each of the polarization organic photoelectric conversion devices 61 and 62 of the polarization optical device is used as a biasing electrode, and the second electrode 12 thereof is used as a ground electrode (potential=0), and a bias voltage is applied to the first electrode 11. At least the first electrode 11 and the second electrode 12 of the polarization organic photoelectric conversion device 62 on the upper side and the second electrode 12 of the polarization organic photoelectric conversion device 61 on the lower side are formed to be transparent. When light is incident on the side of the second electrode 12 of the polarization organic photoelectric conversion device 62 on the upper side in such a state, the light transmits through the second electrode 12 and is incident on the organic photoelectric conversion layer 13. At this time, as shown in FIG. 17A, among the incident light, only a polarized light component in the direction parallel to the orientation axis of the organic photoelectric conversion layer 13 is photoelectrically converted by the organic photoelectric conversion layer 13. Subsequently, when the light transmitting through the polarization organic photoelectric conversion device 62 on the upper side is incident on the second electrode 12 of the polarization organic photoelectric conversion device 61 on the lower side, the light transmits the second electrode 12 and is incident on the organic photoelectric conversion layer 13. At this time, as shown in FIG. 17B, among the incident light, only a polarized light component in the direction parallel to the orientation axis of the organic photoelectric conversion layer 13 is photoelectrically converted by the organic photoelectric conversion layer 13. By measuring a photocurrent flowing between the first electrode 11 and the second electrode 12 of each of the polarization organic photoelectric conversion devices 61 and 62, among the light incident on the polarization optical device, a polarized light component in the direction parallel to the orientation axis of the organic photoelectric conversion layer 13 of the polarization organic photoelectric conversion device 62 and a polarized light component in the direction parallel to the orientation axis of the organic photoelectric conversion layer 13 of the polarization organic photoelectric conversion device 61 can be detected, and polarized light components in two directions can be separated.

According to the fifth embodiment, the alignment axes of the organic photoelectric conversion layers 13 of the polarization organic photoelectric conversion devices 61 and 62, i.e., the polarization axes thereof are orthogonal to each other, and therefore, a novel polarization optical device which can separate polarized light components in two directions and can photoelectrically convert light can be realized.

Hereinabove, embodiments and examples are specifically described, however, the present disclosure is not limited to the above-described embodiments and examples.

For example, the numerical values, structures, configurations, shapes, materials, and the like described in the embodiments and examples above are merely examples, and numerical values, structures, configurations, shapes, materials, and the like which are different from those described above may also be used.

The present disclosure contains subject matter related to that disclosed in Japanese Priority Patent Application JP 2011-075179 filed in the Japan Patent Office on Mar. 30, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A polarization organic photoelectric conversion device comprising:
   an organic photoelectric conversion layer interposed between a first electrode and a second electrode, at least one of which is transparent,
   wherein the organic photoelectric conversion layer is uniaxially oriented at at least a portion thereof in a plane, and,
   wherein a surface of one of the first electrode or the second electrode comprises a solution reserving region and a solution narrowing down region having a width different than a width of the solution reserving region.

2. The polarization organic photoelectric conversion device according to claim 1, wherein the organic photoelectric conversion layer is one obtained by being subjected to uniaxial orientation by at least one method selected from the group consisting of rubbing, friction transfer, photo orientation, inorganic vapor deposition orientation, uniaxial tensile stretching, uniaxial frictional stretching, and shearing.

3. The polarization organic photoelectric conversion device according to claim 1, wherein the organic photoelectric conversion layer contains a liquid-crystalline dye and/or a dichroic dye.

4. The polarization organic photoelectric conversion device according to claim 1, wherein the first electrode and the second electrode are transparent.

5. The polarization organic photoelectric conversion device according to claim 1, wherein at least one of the first electrode and the second electrode is made of graphene.

6. The polarization organic photoelectric conversion device according to claim 1, wherein the organic photoelectric conversion layer is formed by supplying an organic solution obtained by dissolving an organic photoelectric conversion material in a solvent to the solution reserving region and the solution narrowing down region of the first electrode or the second electrode, each of which has, on one principal surface thereof, the solution reserving region and the solution narrowing down region which has a width smaller than the solution reserving region and is connected to the solution reserving region, under the condition that the temperature of the organic solution is set to a first temperature located on a higher temperature side than a solubility curve for the organic solution and the vapor pressure of a surrounding environment of the organic solution is set to a saturated vapor pressure at the first temperature, and then, decreasing the temperature of the organic solution from the first temperature to a second temperature located between the solubility curve and a supersaturation curve for the organic solution.

7. The polarization organic photoelectric conversion device according to claim 1, wherein the organic photoelectric conversion layer is formed by supplying an organic solution obtained by dissolving an organic photoelectric conversion material in a solvent to the solution reserving region and the solution narrowing down region of the first electrode or the second electrode, each of which has, on one principal surface thereof, the solution reserving region and the solution narrowing down region which has a width smaller than the solution reserving region and is connected to the solution reserving region, under the condition that the temperature of the organic solution is set to a third temperature located between a solubility curve for the organic solution and a supersaturation curve for the organic solution and a vapor pressure of a surrounding environment of the organic solution is set to a saturated vapor pressure at the third temperature, and then, decreasing the vapor pressure.

8. The polarization organic photoelectric conversion device according to claim 1, wherein the organic photoelectric conversion layer comprises an organic photoelectric conversion layer forming film composed of a mixture of a photoelectric conversion material and a binder, and wherein the organic photoelectric conversion layer forming film is uniaxially oriented by at least one method selected from a group consisting of uniaxial tensile stretching, uniaxial frictional stretching, and shearing.

9. The polarization organic photoelectric conversion device according to claim 1, wherein the polarization organic photoelectric conversion device is a polarization organic imaging device.

10. The polarization organic photoelectric conversion device according to claim 1, wherein the organic photoelectric conversion layer is composed of a plurality of types of organic photoelectric conversion materials.

11. The polarization organic photoelectric conversion device according to claim 1, wherein a thickness of the organic photoelectric conversion layer is selected based on an intensity of an applied electric field.

12. A polarization optical device comprising:
at least two polarization organic photoelectric conversion devices which are disposed such that the orientation axes of the at least two polarization organic photoelectric conversion devices intersect with each other,
wherein each of the polarization organic photoelectric conversion devices has a structure in which an organic photoelectric conversion layer is interposed between a first electrode and a second electrode, both of which are transparent, and the organic photoelectric conversion layer is uniaxially oriented at at least a portion thereof in a plane, and
wherein a surface of one of the first electrode or the second electrode comprises a solution reserving region and a solution narrowing down region having a width different than a width of the solution reserving region.

13. The polarization optical device according to claim 12, wherein the two polarization organic photoelectric conversion devices are disposed such that the orientation axes thereof are orthogonal to each other.

14. An imaging device comprising:
a polarization organic photoelectric conversion device, wherein the polarization organic photoelectric conversion device has a structure in which an organic photoelectric conversion layer is interposed between a first electrode and a second electrode, at least one of which is transparent, and
the organic photoelectric conversion layer is uniaxially oriented at at least a portion thereof in a plane, and
wherein a surface of one of the first electrode or the second electrode comprises a solution reserving region and a solution narrowing down region having a width different than a width of the solution reserving region.

15. An imaging device comprising: a polarization optical device including:
at least two polarization organic photoelectric conversion devices which are disposed such that the orientation axes of the at least two polarization organic photoelectric conversion devices intersect with each other,
wherein each of the polarization organic photoelectric conversion devices has a structure in which an organic photoelectric conversion layer is interposed between a first electrode and a second electrode, both of which are transparent, and the organic photoelectric conversion layer is uniaxially oriented at at least a portion thereof in a plane, and
wherein a surface of one of the first electrode or the second electrode comprises a solution reserving region and a solution narrowing down region having a width different than a width of the solution reserving region.

16. An electronic apparatus comprising:
a polarization organic photoelectric conversion device, wherein the polarization organic photoelectric conversion device has a structure in which an organic photoelectric conversion layer is interposed between a first electrode and a second electrode, at least one of which is transparent, and
the organic photoelectric conversion layer is uniaxially oriented at at least a portion thereof in a plane,
wherein a surface of one of the first electrode or the second electrode comprises a solution reserving region and a solution narrowing down region having a width different than a width of the solution reserving region.

17. An electronic apparatus comprising:
a polarization optical device including at least two polarization organic photoelectric conversion devices which are disposed such that the orientation axes of the at least two polarization organic photoelectric conversion devices intersect with each other,
wherein each of the polarization organic photoelectric conversion devices has a structure in which an organic photoelectric conversion layer is interposed between a first electrode and a second electrode, both of which are transparent, and the organic photoelectric conversion layer is uniaxially oriented at at least a portion thereof in a plane, and
wherein a surface of one of the first electrode or the second electrode comprises a solution reserving region and a solution narrowing down region having a width different than a width of the solution reserving region.

* * * * *